(12) United States Patent
Kodama et al.

(10) Patent No.: US 8,012,665 B2
(45) Date of Patent: Sep. 6, 2011

(54) POSITIVE PHOTOSENSITIVE COMPOSITION AND PATTERN FORMING METHOD USING THE SAME

(75) Inventors: Kunihiko Kodama, Shizuoka (JP); Fumiyuki Nishiyama, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/475,128

(22) Filed: Jun. 27, 2006

(65) Prior Publication Data

US 2006/0292490 A1    Dec. 28, 2006

(30) Foreign Application Priority Data

Jun. 28, 2005  (JP) ................................ P2005-188215

(51) Int. Cl.
G03C 1/00 (2006.01)
G03F 1/00 (2006.01)
(52) U.S. Cl. ..................................... 430/270.1; 430/322
(58) Field of Classification Search ............... 430/270.1, 430/322
See application file for complete search history.

(56) References Cited

U.S. PATENT DOCUMENTS

| | | | |
|---|---|---|---|
| 5,556,734 A | 9/1996 | Yamachika et al. | |
| 6,280,898 B1 | 8/2001 | Hasegawa et al. | |
| 6,329,125 B2 | 12/2001 | Takechi et al. | |
| 6,388,101 B1 * | 5/2002 | Hada et al. ..................... | 549/318 |
| 6,489,080 B2 * | 12/2002 | Uenishi et al. ............ | 430/281.1 |
| 6,627,391 B1 * | 9/2003 | Ito et al. ......................... | 430/322 |
| 6,830,867 B2 * | 12/2004 | Kodama ..................... | 430/270.1 |
| 7,202,318 B2 * | 4/2007 | Kinsho et al. ................. | 526/242 |
| 7,312,288 B2 * | 12/2007 | Kinsho et al. ................. | 526/245 |
| 2001/0026901 A1 | 10/2001 | Maeda et al. | |
| 2001/0038967 A1 | 11/2001 | Mizutani et al. | |
| 2002/0058206 A1 * | 5/2002 | Uenishi ......................... | 430/296 |
| 2003/0114589 A1 | 6/2003 | Suetsugu et al. | |
| 2003/0171490 A1 | 9/2003 | Breyta et al. | |
| 2003/0194644 A1 | 10/2003 | Hatakeyama et al. | |
| 2003/0224285 A1 * | 12/2003 | Nakao et al. ............... | 430/270.1 |
| 2003/0235779 A1 * | 12/2003 | Hatakeyama et al. ..... | 430/270.1 |
| 2004/0175645 A1 * | 9/2004 | Sasaki et al. ............... | 430/270.1 |
| 2004/0191676 A1 * | 9/2004 | Nakao et al. ............... | 430/270.1 |
| 2005/0048400 A1 * | 3/2005 | Okino et al. ............... | 430/270.1 |
| 2005/0074693 A1 * | 4/2005 | Kishimura et al. ........ | 430/270.1 |
| 2005/0095532 A1 | 5/2005 | Kodama et al. | |
| 2005/0106499 A1 | 5/2005 | Harada et al. | |
| 2005/0227173 A1 | 10/2005 | Hatakeyama et al. | |
| 2006/0008736 A1 | 1/2006 | Kanda et al. | |
| 2006/0094817 A1 | 5/2006 | Harada et al. | |
| 2006/0154170 A1 | 7/2006 | Endo et al. | |
| 2006/0234153 A1 * | 10/2006 | Nishimura et al. ........ | 430/270.1 |
| 2006/0246373 A1 | 11/2006 | Wang | |
| 2009/0123869 A1 | 5/2009 | Wang | |
| 2009/0130592 A1 | 5/2009 | Wang | |
| 2009/0181323 A1 | 7/2009 | Kanda et al. | |

FOREIGN PATENT DOCUMENTS

| | | |
|---|---|---|
| JP | 7-230169 A | 8/1995 |
| JP | 07-295221 A | 11/1995 |
| JP | 08-050356 A | 2/1996 |
| JP | 9-073173 A | 3/1997 |
| JP | 10-207069 A | 8/1998 |
| JP | 10-307396 | 11/1998 |
| JP | 2000-026446 A | 1/2000 |
| JP | 2000-159758 A | 6/2000 |
| JP | 2001-051418 A | 2/2001 |
| JP | 2001-109154 A | 4/2001 |
| JP | 2001-109156 A | 4/2001 |
| JP | 2001-114822 A | 4/2001 |
| JP | 2001-174998 A | 6/2001 |
| JP | 2003-156849 A | 5/2003 |
| JP | 2003-292716 A | 10/2003 |
| JP | 2004-004697 A | 1/2004 |
| JP | 2004-271844 A | 9/2004 |
| JP | 2004-294688 A | 10/2004 |
| JP | 2004-294870 A | 10/2004 |
| JP | 2004-318045 A | 11/2004 |
| JP | 2005-077738 A | 3/2005 |
| JP | 2005-099646 A | 4/2005 |
| JP | 2005-122134 A | 5/2005 |
| JP | 2005-146252 A | 6/2005 |
| JP | 2005-148291 A | 6/2005 |
| JP | 2005-320516 A | 11/2005 |
| JP | 2006-48029 A | 2/2006 |
| JP | 2006-085081 A | 3/2006 |
| JP | 2006-124314 A | 5/2006 |
| JP | 2006-309245 A | 11/2006 |

OTHER PUBLICATIONS

Varanasi et al., "Fluoroalcohol-Methacrylate Resists for 193nm Lithography.", Journal of Photopolymer Science and Technology, vol. 18, No. (3), Jun. 6, 2005, pp. 381-387.*
Notification of Reasons for Refusal dated Apr. 27, 2010, issued in counterpart Japanese Application No. 2005-188215.
Office Action issued Nov. 9, 2010, from the Japan Patent Office in counterpart Japanese Application No. 2005-188215.
Office Action issued Nov. 9, 2010, from the Japan Patent Office in counterpart Japanese Application No. 2010-146788.
Office Action issued Feb. 8, 2011, from the Japan Patent Office in counterpart Japanese Application No. 2005-188215.
Office Action issued Feb. 8, 2011, from the Japan Patent Office in counterpart Japanese Application No. 2010-146788.

(Continued)

*Primary Examiner* — Cynthia H Kelly
*Assistant Examiner* — Connie P Johnson
(74) *Attorney, Agent, or Firm* — Sughrue Mion, PLLC

(57) ABSTRACT

A positive photosensitive composition comprising: (A) a compound capable of generating an acid upon irradiation with actinic rays or radiation; (B1) a resin of which solubility in an alkali developer increases under an action of an acid; and (B2) a resin that has at least one group selected from (a) an alkali-soluble group and (b) a group capable of decomposing under an action of an alkali to produce an alkali-soluble group, and the resin (B2) does not have a group capable of decomposing under an action of an acid; and a pattern forming method using the same.

24 Claims, 1 Drawing Sheet

OTHER PUBLICATIONS

Office Action dated May 24, 2011 in Japanese Application No. 2005-188215.

First Semiconductor Lithographic Technology, Kogyo Chosakai Publishing Co., Jun. 30, 2003, 1st Ed., p. 250 Partial Translation.

Semiconductor Process Text Book, Semi Japan, Oct. 10, 2003, 3rd Ed., p. 159 Translation.

* cited by examiner

US 8,012,665 B2

POSITIVE PHOTOSENSITIVE COMPOSITION AND PATTERN FORMING METHOD USING THE SAME

BACKGROUND OF THE INVENTION

1. Field of the Invention

The present invention relates to a positive photosensitive composition for use in the process of producing a semiconductor such as IC, in the production of a circuit board for liquid crystal, thermal head and the like, or in other photofabrication processes, and a pattern forming method using the same. More specifically, the present invention relates to a positive photosensitive composition suitable for the processing where an exposure light source of emitting a far ultraviolet ray or the like of 250 nm or less, preferably 220 nm or less, or an irradiation source utilizing an electron beam or the like is used, and a pattern forming method using the same.

2. Description of the Related Art

The chemical amplification-type photosensitive composition is a pattern forming material capable of forming a pattern on a substrate by producing an acid in the exposed area upon irradiation with actinic rays or radiation and through a reaction using this acid as the catalyst, changing the solubility in a developer between the area irradiated with actinic rays or radiation and the non-irradiated area.

In the case of using a KrF excimer laser as the exposure light source, a resin having small absorption in the region of 248 nm and having a basic skeleton of poly(hydroxystyrene) is predominantly used as the main component, and this is an excellent system capable of forming a good pattern with high sensitivity and high resolution as compared with the conventional naphthoquinonediazide/novolak resin system.

In the case of using a light source of emitting light at a shorter wavelength, for example, in using an ArF excimer laser (193 nm) as the light source, a satisfactory pattern cannot be formed even by the above-described chemical amplification system because the compound having an aromatic group substantially has large absorption in the region of 193 nm.

In order to solve this problem, a resist containing a resin having an alicyclic hydrocarbon structure has been developed as the resist for use with an ArF excimer laser.

Furthermore, it has been found that the performance is enhanced by containing a repeating unit having a lactone structure in the resin having an alicyclic hydrocarbon structure. For example, JP-A-9-73173 (the term "JP-A" as used herein means an "unexamined published Japanese patent application")), U.S. Pat. No. 6,388,101B, JP-A-2000-159758, JP-A-2001-109154 and U.S. Patent Publication 2001-26901A describe a resist composition containing an acid-decomposable resin having a lactone structure.

Also, U.S. Pat. No. 6,627,391B describes a composition containing an acid-decomposable resin and a low molecular additive having a lactone group.

However, it is actually very difficult to find out an appropriate combination of a resin, an acid generator, additives, a solvent and the like from the aspect of overall performance as the resist. Furthermore, in forming a fine pattern having a line width of 100 nm or less, the formed line pattern falls despite excellent resolution performance and improvements are demanded not only in the problem of pattern falling giving rise to a defect at the production of a device but also in the line edge roughness performance of a line pattern.

Here, the line edge roughness means that the edge of the interface between the resist line pattern and the substrate irregularly fluctuates in the direction perpendicular to the line direction due to characteristics of the resist and when the pattern is observed from right above, the edge gives an uneven appearance (evenness of approximately from ±several nm to several tens of nm). Since this unevenness is transferred onto the substrate by an etching step, if the unevenness is large, an electric characteristic failure and in turn reduction in the yield are caused.

SUMMARY OF THE INVENTION

Accordingly, an object of the present invention is to provide a positive photosensitive composition ensuring that even in the formation of a fine pattern of 100 nm or less, the resolving power is excellent and the line edge roughness and pattern falling are improved, and a pattern forming method using the composition.

(1) A positive photosensitive composition comprising:
(A) a compound capable of generating an acid upon irradiation with actinic rays or radiation;
(B1) a resin of which solubility in an alkali developer increases under an action of an acid; and
(B2) a resin that has at least one group selected from (a) an alkali-soluble group and (b) a group capable of decomposing under an action of an alkali to produce an alkali-soluble group, and the resin (B2) does not have a group capable of decomposing under an action of an acid.

(2). The positive photosensitive composition as described in (1) above,
wherein the resin as the component (B1) has a monocyclic or polycyclic hydrocarbon structure.

(3) The positive photosensitive composition as described in (1) above,
wherein the resin as the component (B1) has a hydroxystyrene structural unit.

(4) The positive photosensitive composition as described in any of (1) to (3) above,
wherein in the resin as the component (B2), the at least one group selected from (a) an alkali-soluble group and (b) a group capable of decomposing under an action of an alkali to produce an alkali-soluble group is at least one group selected from a carboxyl group, a lactone group and an acid anhydride group.

(5) The positive photosensitive composition as described in any of (1) to (4) above,
wherein the resin as the component (B1) has a repeating unit having a polycyclic hydrocarbon group substituted by a hydroxyl group or a cyano group.

(6) The positive photosensitive composition as described in any of (1) to (5) above,
wherein the compound as the component (A) is a compound capable of generating an acid selected from an acid having a fluoroalkylsulfonic acid structure with a carbon number of 2 to 4, a bis(fluoroalkylsulfonyl)imide acid and a fluorine atom-containing benzenesulfonic acid upon irradiation with actinic rays or radiation.

(7) The positive photosensitive composition as described in any of (1) to (6) above,
wherein the resin as the component (B1) contains a repeating unit having a lactone group.

(8) The positive photosensitive composition as described in any of (1) to (7) above,
wherein the resin as the component (B2) is a resin consisting of a repeating unit having a lactone group or a copolymer resin containing 50 mol % or more of a repeating unit having a lactone group.

(9) The positive photosensitive composition as described in any of (1) to (8) above, wherein an amount added of the resin as the component (B2) is from 1 to 20 mass % based on that of the resin as the component (B1).

(10) A pattern forming method comprising:
forming a photosensitive film from a positive photosensitive composition as described in any of (1) to (9) above; and
exposing and developing the photosensitive film.

DETAILED DESCRIPTION OF THE INVENTION

Figure 1:
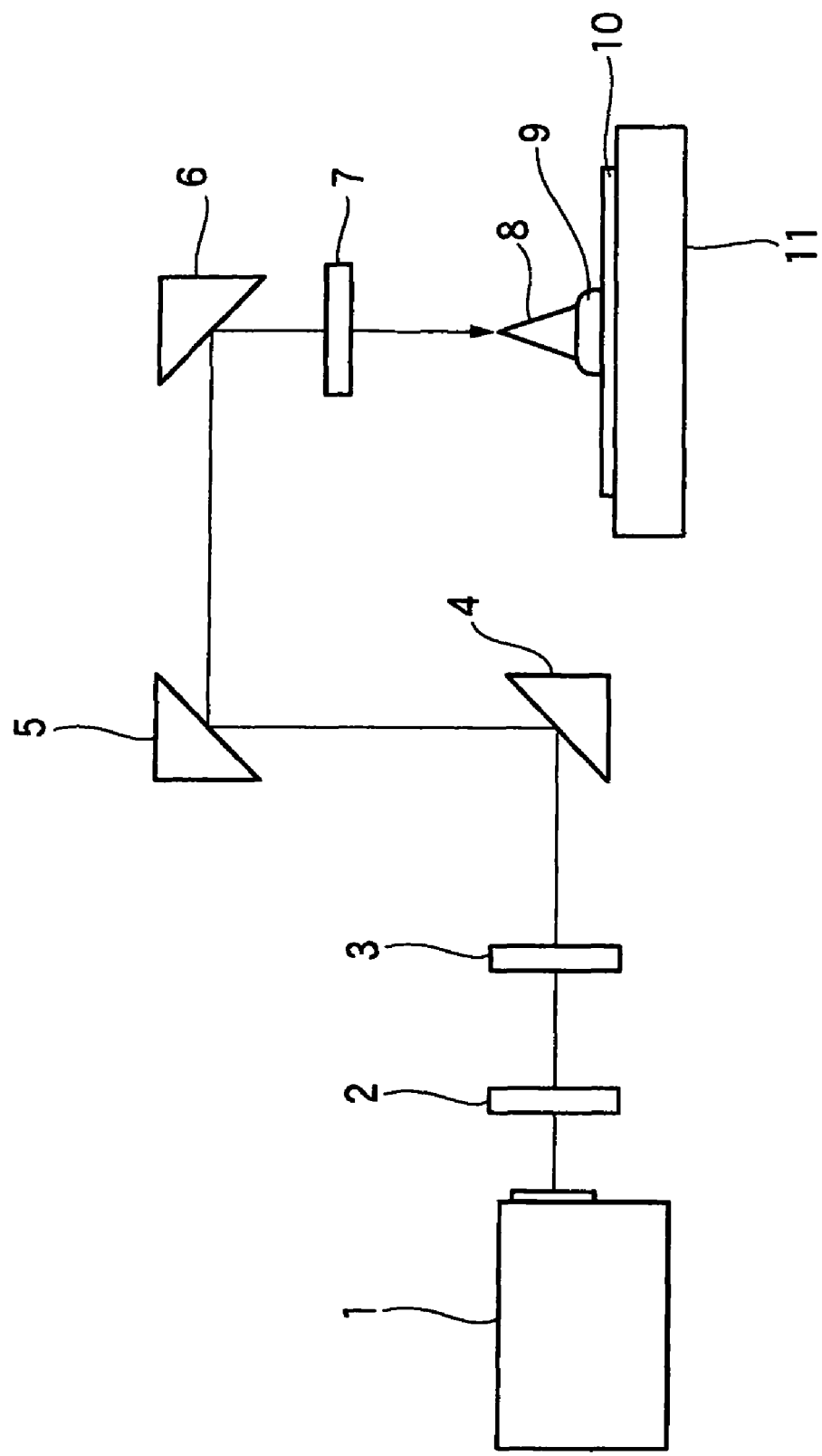
FIG. 1 is a schematic view of a two-beam interference exposure testing apparatus.

[1] Compound Capable of Generating an Acid upon Irradiation with Actinic Rays or Radiation (Component A)

The positive photosensitive composition of the present invention comprises a compound capable of generating an acid upon irradiation with actinic rays or radiation (hereinafter sometimes referred to as an "acid generator").

As for this acid generator, a photoinitiator for photocationic polymerization, a photoinitiator for photoradical polymerization, a photo-decoloring agent for coloring matters, a photo-discoloring agent, a known compound capable of generating an acid upon irradiation with actinic rays or radiation, which is used for microresist and the like, or a mixture thereof may be appropriately selected and used.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where the above-described group or compound capable of generating an acid upon irradiation with actinic rays or radiation is introduced into the polymer main or side chain, such as compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, a compound capable of generating an acid by the effect of light described, for example, in U.S. Pat. No. 3,779,778 and European Patent 126,712 may also be used.

Preferred examples of the compound capable of generating an acid upon irradiation with actinic rays or radiation include the compounds represented by the following formulae (ZI), (ZII) and (ZIII):

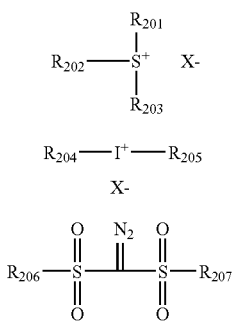

In formula (ZI), $R_{201}$, $R_{202}$ and $R_{203}$ each independently represents an organic group.

$X^-$ represents a non-nucleophilic anion, and preferred examples thereof include sulfonate anion, carboxylate anion, bis(alkylsulfonyl)imide anion, tris(alkylsulfonyl)methide anion, $BF_4^-$, $PF_6^-$ and $SbF_6^-$. $X^-$ is preferably an organic anion having a carbon atom.

Preferred examples of the organic anion include organic anions represented by the following formulae.

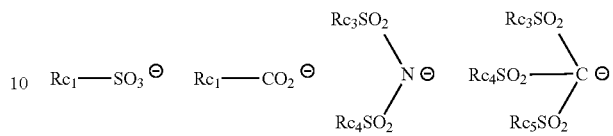

In the formulae above, $Rc_1$ represents an organic group.

The organic group in $Rc_1$ includes an organic group having a carbon number of 1 to 30, and preferred examples thereof include an alkyl or aryl group which may be substituted, and a group where a plurality of these alkyl or aryl groups are connected through a linking group such as single bond, —O—, —CO$_2$—, —S—, —SO$_3$— and —SO$_2$N(Rd$_1$)—.
$Rd_1$ represents a hydrogen atom or an alkyl group.

$Rc_3$, $Rc_4$ and $Rc_5$ each independently represents an organic group.

Preferred examples of the organic group of $Rc_3$, $Rc_4$ and $Rc_5$ are the same as preferred organic groups in $Rb_1$, and the organic group is more preferably a perfluoroalkyl group having a carbon number of 1 to 4.

$Rc_3$ and $Rc_4$ may combine to form a ring.

Examples of the group formed by combining $Rc_3$ and $Rc_4$ include an alkylene group and an arylene group, and this group is preferably a perfluoroalkylene group having a carbon number of 2 to 4.

In particular, the organic group of $Rc_1$ and $Rc_3$ to $Rc_5$ is preferably an alkyl group with the 1-position being substituted by a fluorine atom or a fluoroalkyl group, or a phenyl group substituted by a fluorine atom or a fluoroalkyl group. By virtue of having a fluorine atom or a fluoroalkyl group, the acidity of the acid generated upon irradiation with actinic rays or radiation is increased and the sensitivity is enhanced. Also, when $Rc_3$ and $Rc_4$ combine to form a ring, this is preferred because the acidity of the acid generated upon irradiation with actinic rays or radiation is increased and the sensitivity is enhanced.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (Z1) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15 such as methyl group, ethyl group, propyl group, n-butyl group, sec-butyl group and tert-butyl group.

The cycloalkyl group which is present, if desired, in the arylsulfonium compound is preferably a cycloalkyl group having a carbon number of 3 to 15 such as cyclopropyl group, cyclobutyl group and cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, and most preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ each is an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each independently is preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be linear or branched, and preferred examples thereof include a linear or branched alkyl group having a carbon number of 1 to 10 (e.g., methyl, ethyl, propyl, butyl, pentyl). The alkyl group as $R_{201}$ to $R_{203}$ is preferably a linear or branched 2-oxoalkyl group or an alkoxycarbonylmethyl group.

Preferred examples of the cycloalkyl group as $R_{201}$ to $R_{203}$ include a cycloalkyl group having a carbon number of 3 to 10 (e.g., cyclopentyl, cyclohexyl, norbornyl). The cycloalkyl group as $R_{201}$ to $R_{203}$ is preferably a cyclic 2-oxoalkyl group.

Examples of the linear or branched 2-oxoalkyl group as $R_{201}$ to $R_{203}$ include a group having $>C=O$ at the 2-position of the above-described alkyl group.

Examples of the cyclic 2-oxoalkyl group as $R_{201}$ to $R_{203}$ include a group having $>C=O$ at the 2-position of the above-described cycloalkyl group.

Examples of the alkoxy group in the alkoxycarbonylmethyl group as $R_{201}$ to $R_{203}$ include an alkoxy group having a carbon number of 1 to 5 (e.g., methoxy, ethoxy, propoxy, butoxy, pentyloxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

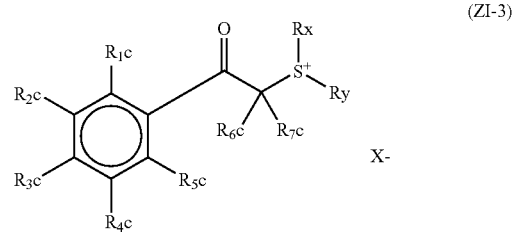

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{5c}$ or the pair of $R_x$ and $R_y$ may combine with each other to form a ring structure, and the ring structure may contain an oxygen atom, a sulfur atom, an ester bond or an amide bond. Examples of the group formed by combining any two or more members out of $R_{1c}$ to $R_{5c}$ or combining $R_x$ and $R_y$ include a butylene group and a pentylene group.

The alkyl group as $R_{1c}$ to $R_{7c}$ may be linear or branched, and examples thereof include a linear or branched alkyl group having a carbon number of 1 to 20, preferably from 1 to 12 (e.g., methyl, ethyl, linear or branched propyl, linear or branched butyl, linear or branched pentyl).

Preferred examples of the cycloalkyl group as $R_{1c}$ to $R_{7c}$ include a cycloalkyl group having a carbon number of 3 to 8 (e.g., cyclopentyl, cyclohexyl).

The alkoxy group as $R_{1c}$ to $R_{5c}$ may be linear, branched or cyclic and includes, for example, an alkoxy group having a carbon number of 1 to 10. Preferred examples thereof include a linear or branched alkoxy group having a carbon number of 1 to 5 (e.g., methoxy, ethoxy, linear or branched propoxy, linear or branched butoxy, linear or branched pentoxy) and a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. In this case, the solubility in a solvent is more enhanced and the generation of particles during storage is suppressed.

Examples of the alkyl group as $R_x$ and $R_y$ are the same as those of the alkyl group as $R_{1c}$ to $R_{7c}$. The alkyl group as $R_x$ and $R_y$ is preferably a 2-oxoalkyl group or an alkoxymethyl group. Examples of the 2-oxoalkyl group include a group having >C=O at the 2-position of the alkyl group as $R_{1c}$ to $R_{7c}$. Examples of the alkoxy group in the alkoxycarbonylmethyl group are the same as those of the alkoxy group as $R_{1c}$ to $R_{5c}$.

Examples of the cycloalkyl group as $R_x$ and $R_y$ are the same as those of the cycloalkyl group as $R_{1c}$ to $R_{7c}$.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group as $R_{204}$ to $R_{207}$ is preferably a phenyl group or a naphthyl group, more preferably a phenyl group.

The alkyl group as $R_{204}$ to $R_{207}$ may be linear or branched, and preferred examples thereof include a linear or branched alkyl group having a carbon number of 1 to 10 (e.g., methyl, ethyl, propyl, butyl, pentyl).

Preferred examples of the cycloalkyl group as $R_{204}$ to $R_{207}$ include a cycloalkyl group having a carbon number of 3 to 10 (e.g., cyclopentyl, cyclohexyl, norbornyl).

$R_{204}$ to $R_{207}$ each may have a substituent. Examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion, and examples thereof are the same as those of the non-nucleophilic anion of $X^-$ in formula (I).

Other preferred examples of the compound capable of generating an acid upon irradiation with actinic rays or radiation include the compounds represented by the following formulae (ZIV), (ZV) and (ZVI):

$$Ar_3\text{—}SO_2\text{—}SO_2\text{—}Ar_4 \quad \text{ZIV}$$

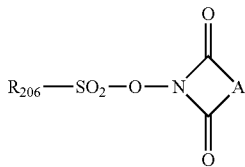

ZV

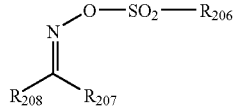

ZVI

In formulae (ZIV) to (ZVI), $Ar_3$ and $Ar_4$ each independently represents an aryl group.

$R_{206}$ represents an alkyl group, a cycloalkyl group or an aryl group.

$R_{207}$ and $R_{208}$ each independently represents an alkyl group, a cycloalkyl group, an aryl group or an electron withdrawing group. $R_{207}$ is preferably an aryl group, and $R_{208}$ is preferably an electron withdrawing group, more preferably a cyano group or a fluoroalkyl group.

A represents an alkylene group, an alkenylene group or an arylene group.

$Ar_3$, $Ar_4$, $R_{206}$, $R_{207}$, $R_{208}$ and A each may have a substituent.

Among the compounds capable of generating an acid upon irradiation with actinic rays or radiation, preferred are the compounds represented by formulae (ZI) to (ZIII).

Among the compounds capable of generating an acid upon irradiation with actinic rays or radiation, more preferred are a compound capable of generating an acid selected from an acid having a fluoroalkylsulfonic acid structure with a carbon number of 2 to 4, a bis(fluoroalkylsulfonyl)imide acid and a fluorine atom-containing benzenesulfonic acid, upon irradiation with actinic rays or radiation.

Out of the compounds capable of generating an acid upon irradiation with actinic rays or radiation, particularly preferred examples are forth below.

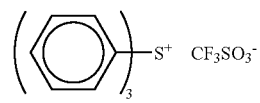

(z1)

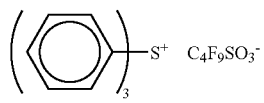

(z2)

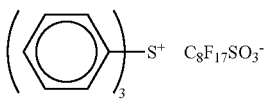

(z3)

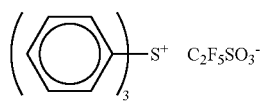

(z4)

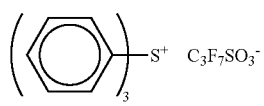

(z5)

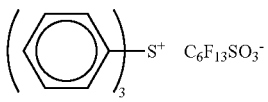

(z6)

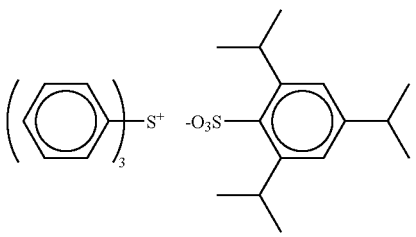

(z7)

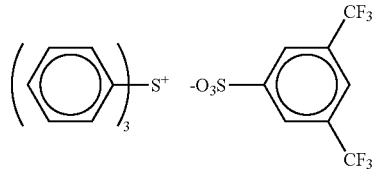

(z8)

(z9) 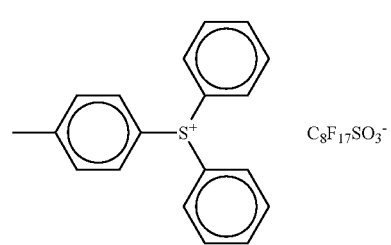
(z10) 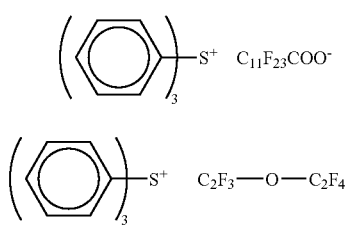
(z11) 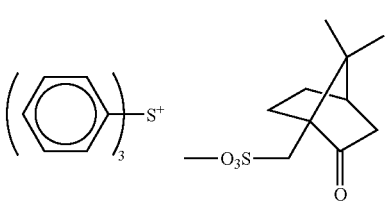
(z12) 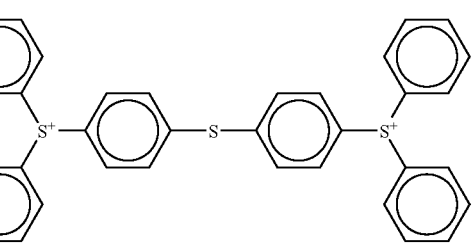
(z13) 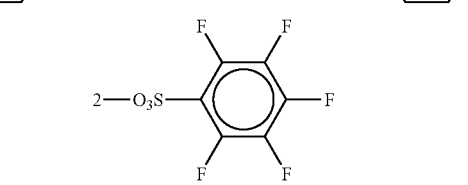
(z14) 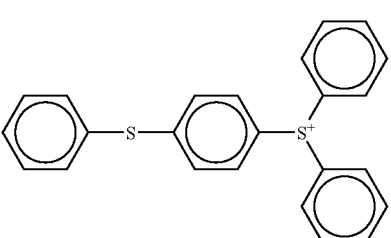
(z15) 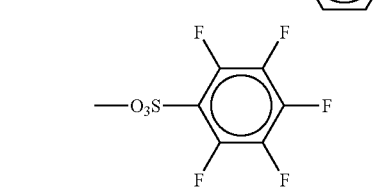
(z16) 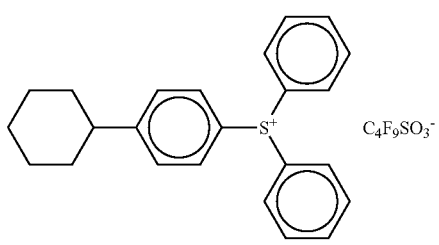
(z17) 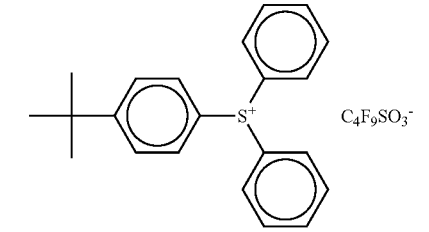
(z18) 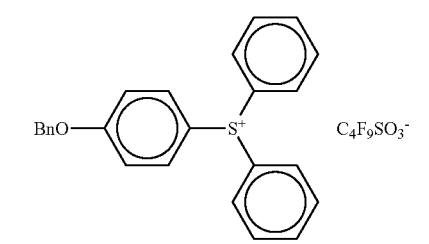
(z19) 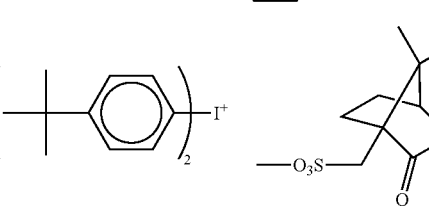
(z20) 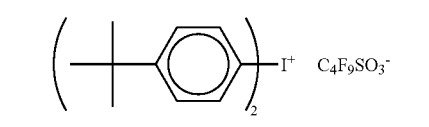
(z21) 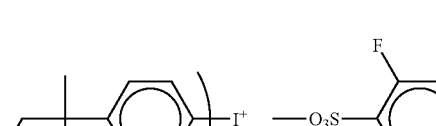
(z22) 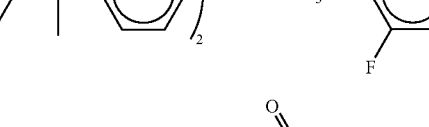
(z23) 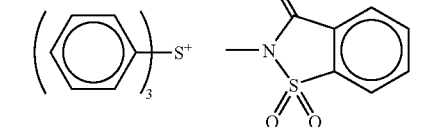

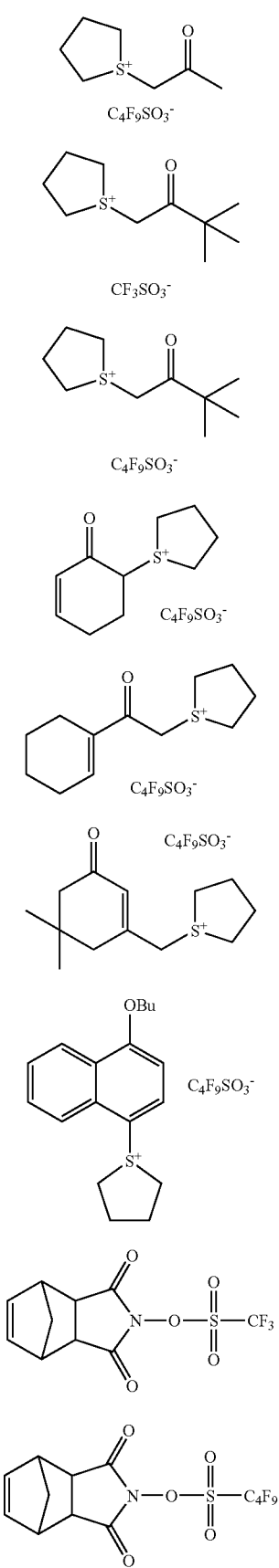
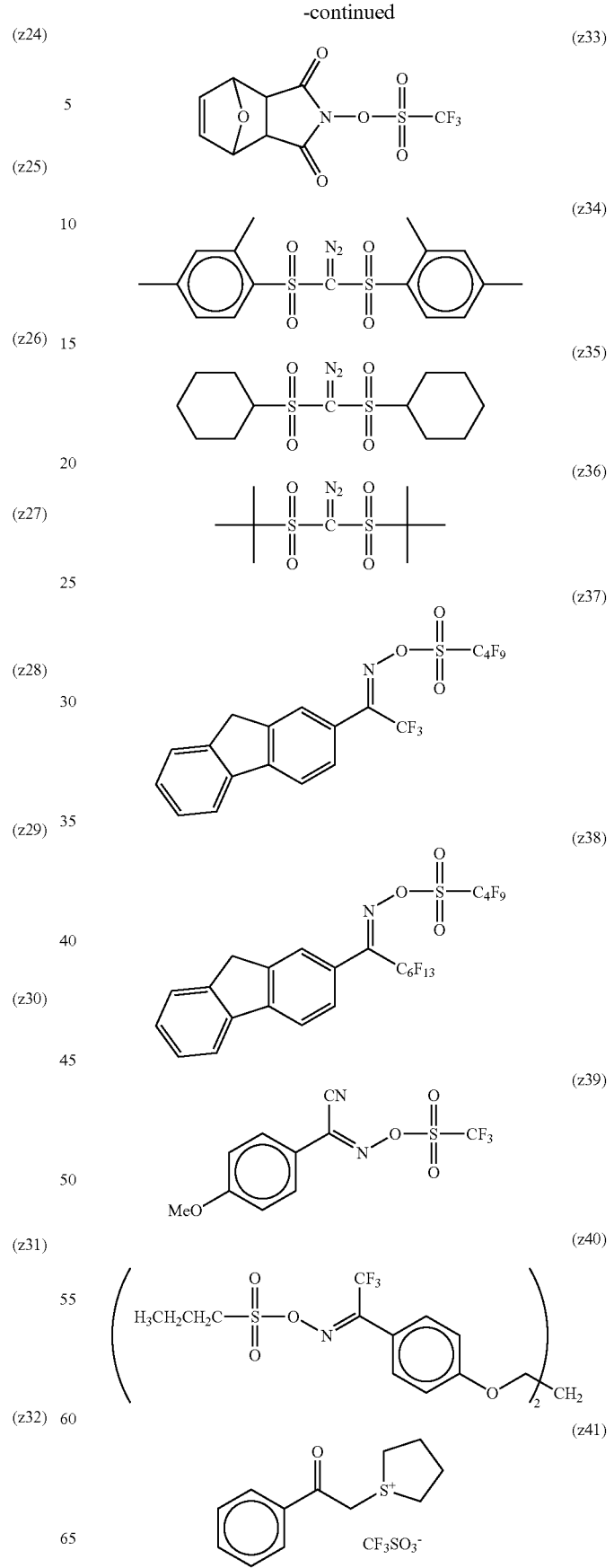

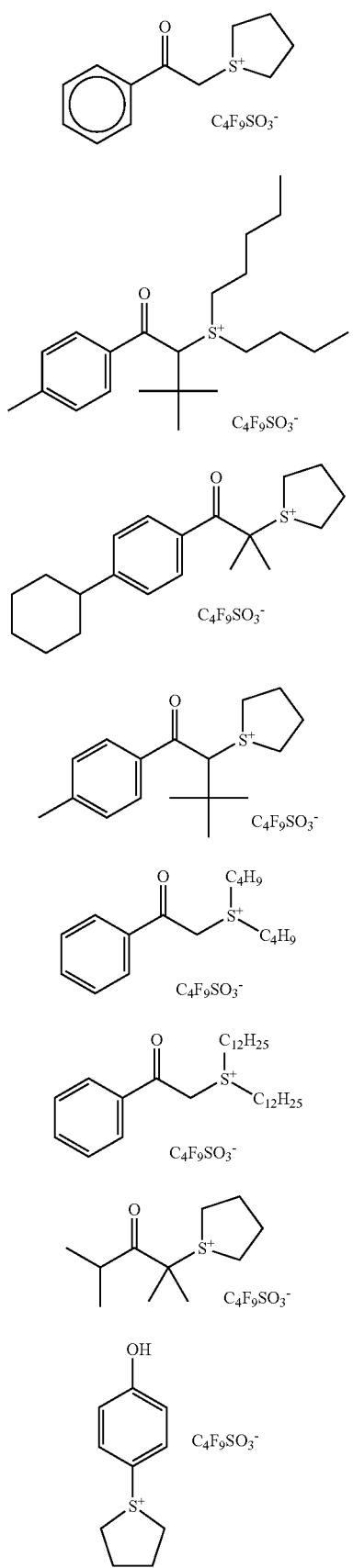
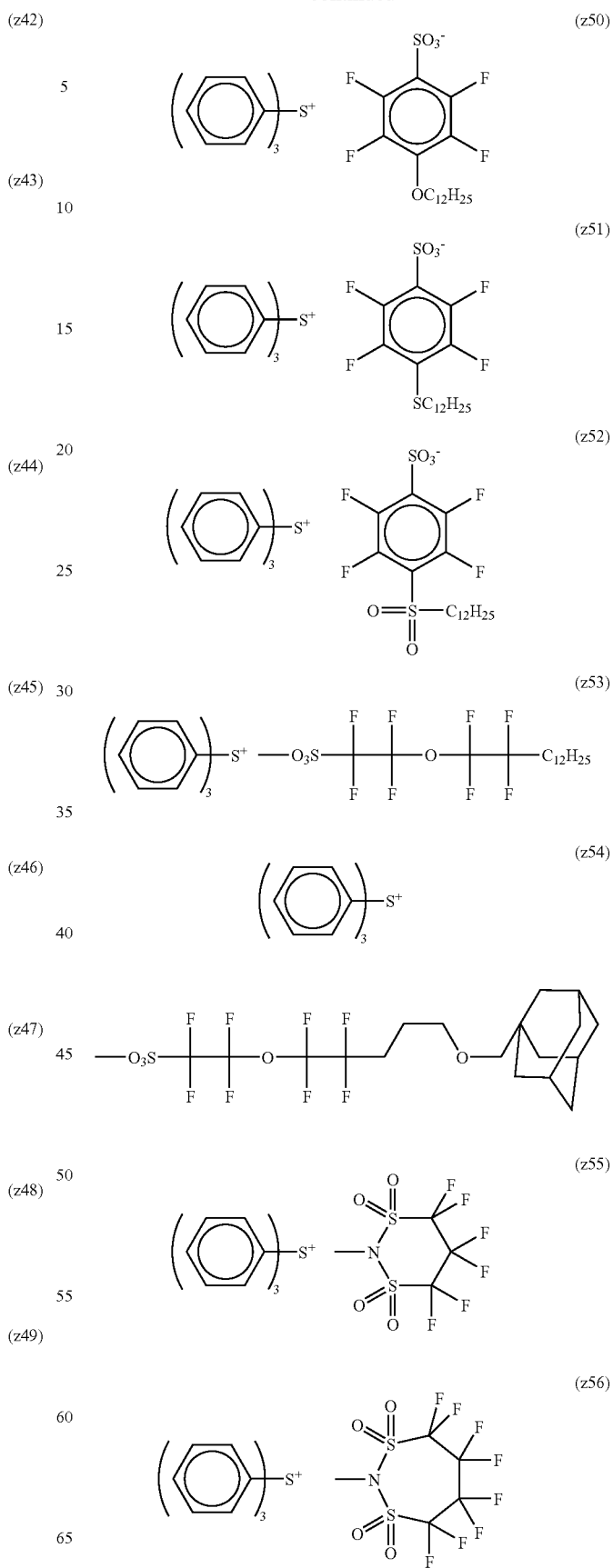

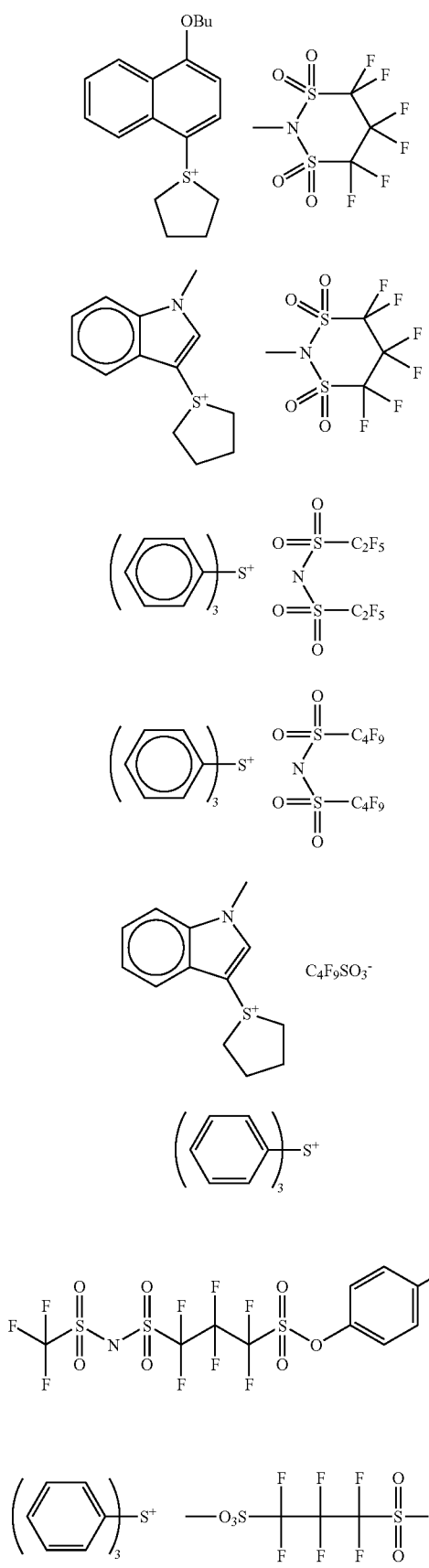
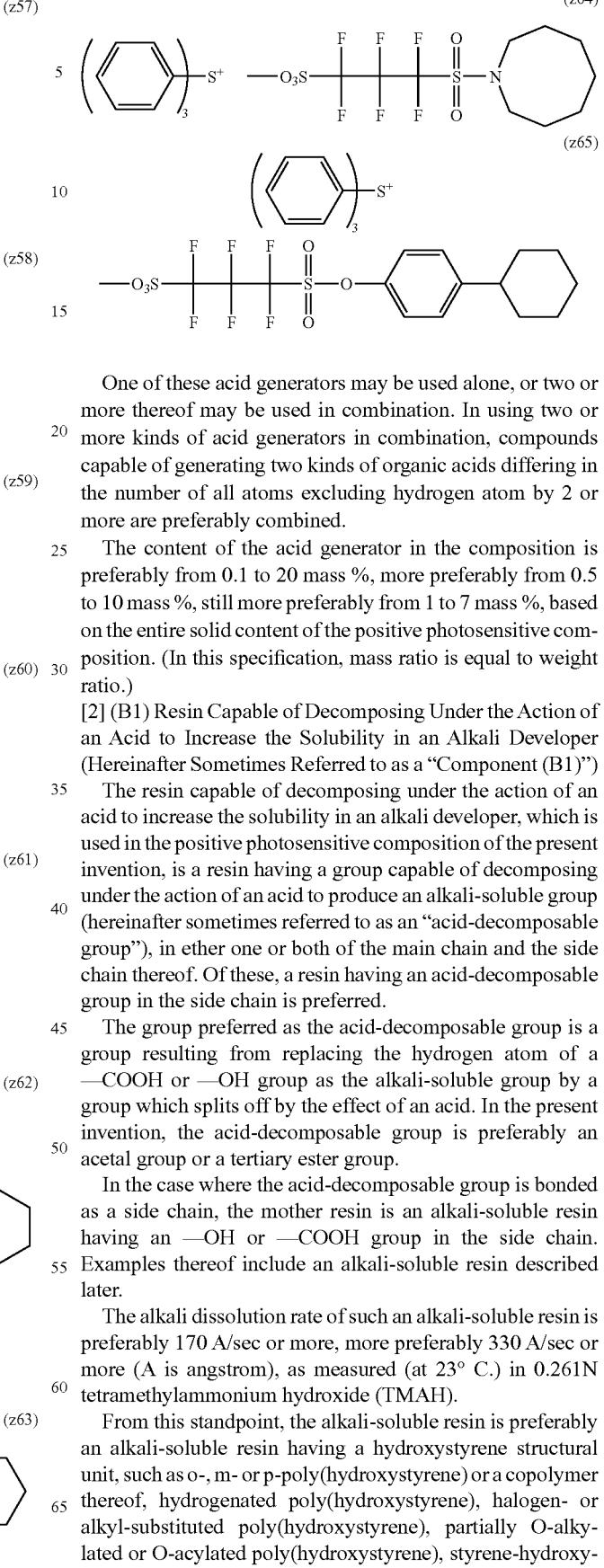

One of these acid generators may be used alone, or two or more thereof may be used in combination. In using two or more kinds of acid generators in combination, compounds capable of generating two kinds of organic acids differing in the number of all atoms excluding hydrogen atom by 2 or more are preferably combined.

The content of the acid generator in the composition is preferably from 0.1 to 20 mass %, more preferably from 0.5 to 10 mass %, still more preferably from 1 to 7 mass %, based on the entire solid content of the positive photosensitive composition. (In this specification, mass ratio is equal to weight ratio.)

[2] (B1) Resin Capable of Decomposing Under the Action of an Acid to Increase the Solubility in an Alkali Developer (Hereinafter Sometimes Referred to as a "Component (B1)")

The resin capable of decomposing under the action of an acid to increase the solubility in an alkali developer, which is used in the positive photosensitive composition of the present invention, is a resin having a group capable of decomposing under the action of an acid to produce an alkali-soluble group (hereinafter sometimes referred to as an "acid-decomposable group"), in ether one or both of the main chain and the side chain thereof. Of these, a resin having an acid-decomposable group in the side chain is preferred.

The group preferred as the acid-decomposable group is a group resulting from replacing the hydrogen atom of a —COOH or —OH group as the alkali-soluble group by a group which splits off by the effect of an acid. In the present invention, the acid-decomposable group is preferably an acetal group or a tertiary ester group.

In the case where the acid-decomposable group is bonded as a side chain, the mother resin is an alkali-soluble resin having an —OH or —COOH group in the side chain. Examples thereof include an alkali-soluble resin described later.

The alkali dissolution rate of such an alkali-soluble resin is preferably 170 A/sec or more, more preferably 330 A/sec or more (A is angstrom), as measured (at 23° C.) in 0.261N tetramethylammonium hydroxide (TMAH).

From this standpoint, the alkali-soluble resin is preferably an alkali-soluble resin having a hydroxystyrene structural unit, such as o-, m- or p-poly(hydroxystyrene) or a copolymer thereof, hydrogenated poly(hydroxystyrene), halogen- or alkyl-substituted poly(hydroxystyrene), partially O-alkylated or O-acylated poly(hydroxystyrene), styrene-hydroxystyrene copolymer, α-methylstyrene-hydroxystyrene copolymer, and hydrogenated novolak resin; or an alkali-soluble resin containing a repeating unit having a carboxyl group, such as (meth)acrylic acid and norbornene carboxylic acid.

Preferred examples of the repeating unit having an acid-decomposable group for use in the present invention include tert-butoxycarbonyloxystyrene, 1-alkoxyethoxystyrene and tertiary alkyl (meth)acrylate. Among these, 2-alkyl-2-adamantyl (meth)acrylate and dialkyl(1-adamantyl)methyl (meth)acrylate are more preferred.

The resin as the component (B1) for use in the present invention can be obtained by reacting a precursor of a group capable of decomposing by the effect of an acid with an alkali-soluble resin or copolymerizing an alkali-soluble resin monomer having bonded thereto a group capable of decomposing by the effect of an acid with various monomers, and this is disclosed in European Patent 254853, JP-A-2-25850, JP-A-3-223860 and JP-A-4-251259.

In the case of irradiating the positive photosensitive composition of the present invention with KrF excimer laser light, electron beam, X-ray or high-energy light at a wavelength of 50 nm or less (e.g., EUV), the resin as the component (B1) preferably has a hydroxystyrene repeating unit, and the resin is more preferably a copolymer of hydroxystyrene/hydroxystyrene protected by an acid-decomposable group, or hydroxystyrene/tertiary alkyl (meth)acrylate.

Specific examples of the resin as the component (B1) for use in the present invention are set forth below, but the present invention is not limited thereto.

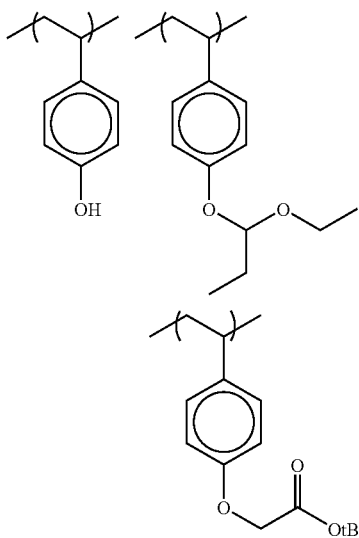

(R-1)

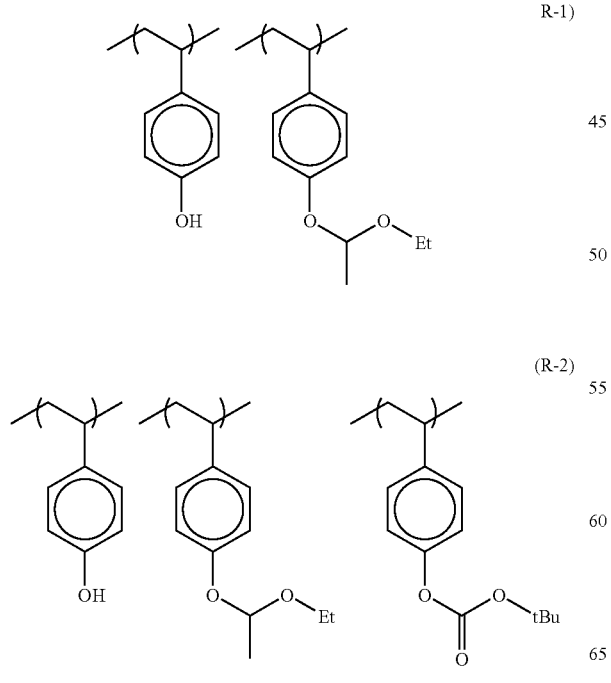

(R-2)

-continued (R-3)

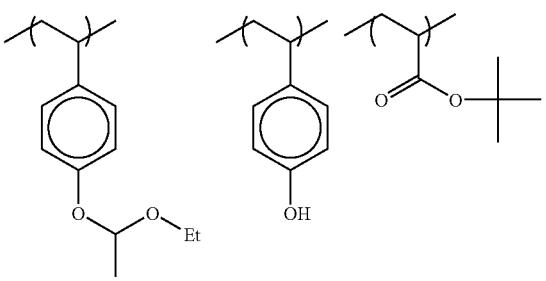

(R-4)

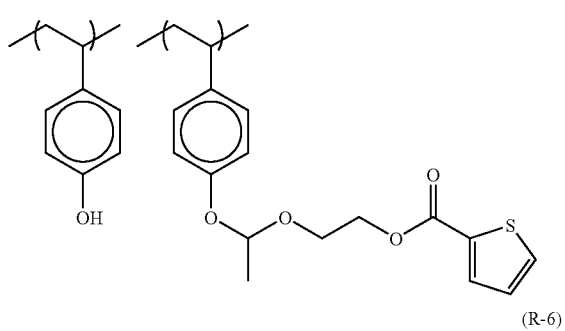

(R-5)

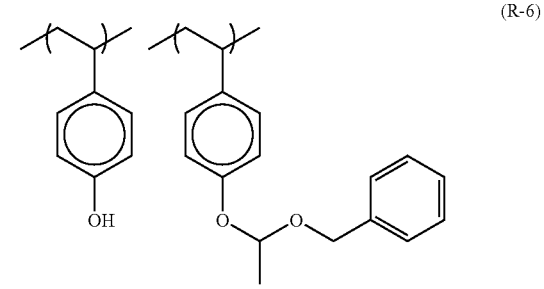

(R-6)

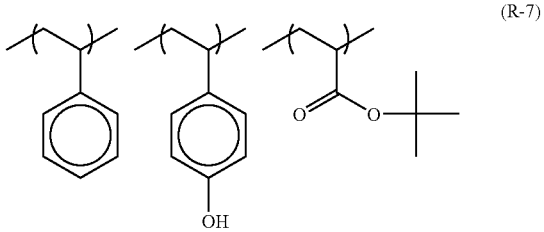

(R-7)

(R-8)
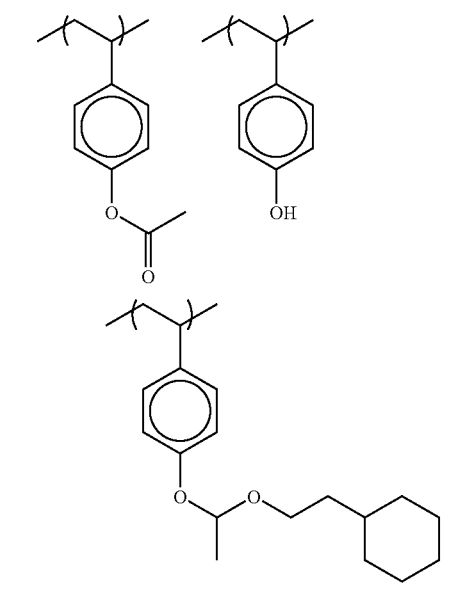
(R-9)
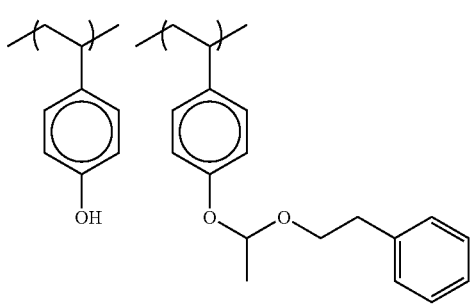
(R-10)
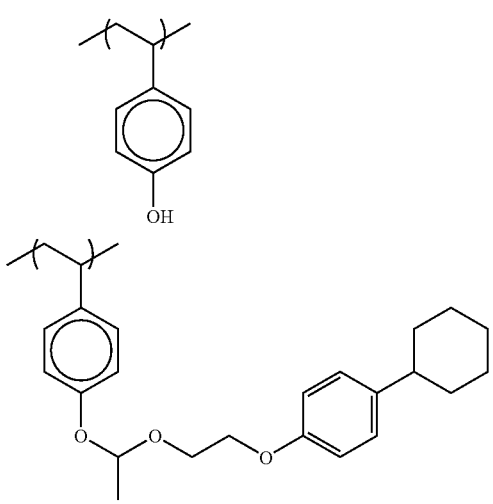
(R-11)
(R-12)
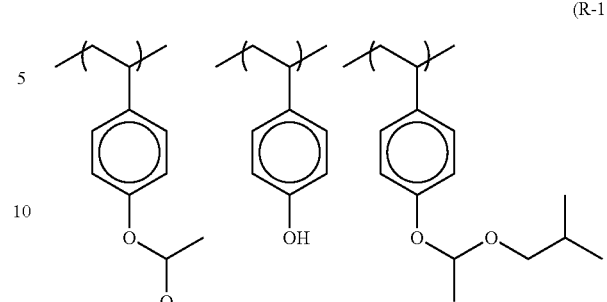
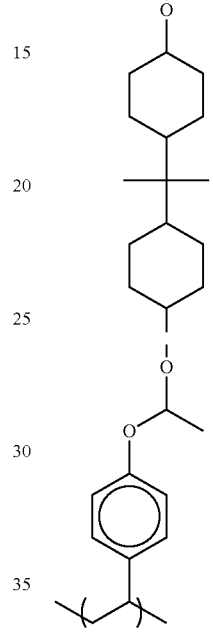
(R-13)
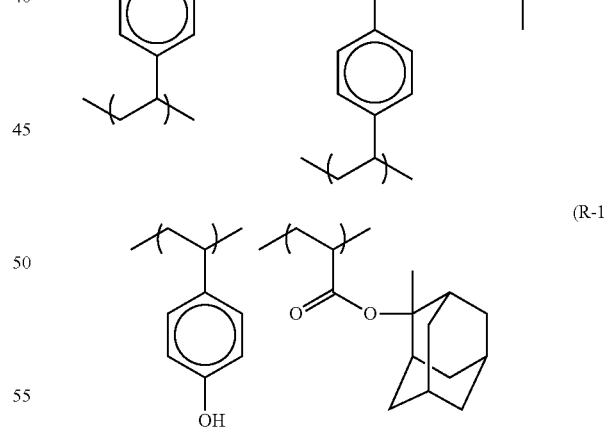
(R-14)
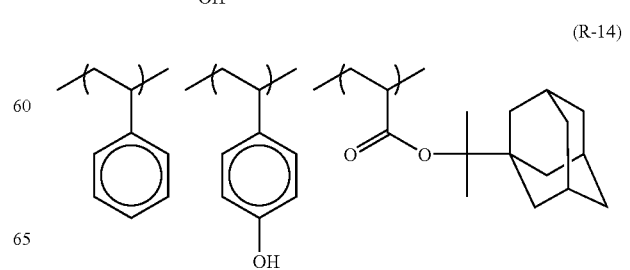

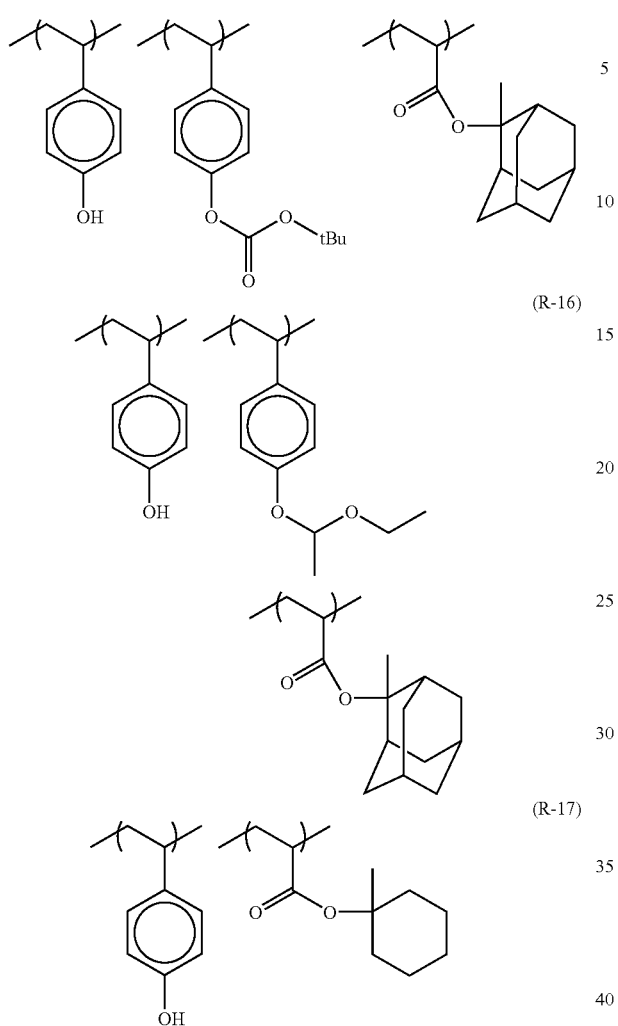

(R-15)

(R-16)

(R-17)

In these specific examples, "tBu" indicates a tert-butyl group.

The content of the acid-decomposable group is expressed by B/(B+S) using the number (B) of acid-decomposable groups in the resin and the number (S) of alkali-soluble groups not protected by a group which splits off by the effect of an acid. The content is preferably from 0.01 to 0.7, more preferably from 0.05 to 0.50, still more preferably from 0.05 to 0.40.

In the case of irradiating the positive photosensitive composition of the present invention with ArF excimer laser light, the resin as the component (B1) is preferably a resin having a monocyclic or polycyclic alicyclic hydrocarbon structure and having a group capable of decomposing under the action of an acid to increase the solubility in an alkali developer.

The resin having a monocyclic or polycyclic alicyclic hydrocarbon structure and undergoing decomposition under the action of an acid to increase the solubility in an alkali developer (hereinafter sometimes referred to as an "alicyclic hydrocarbon-based acid-decomposable resin") is preferably a resin containing at least one repeating unit selected from the group consisting of a repeating unit having an alicyclic hydrocarbon-containing partial structure represented by any one of the following formulae (pI) to (pV), and a repeating unit represented by the following formula (II-AB):

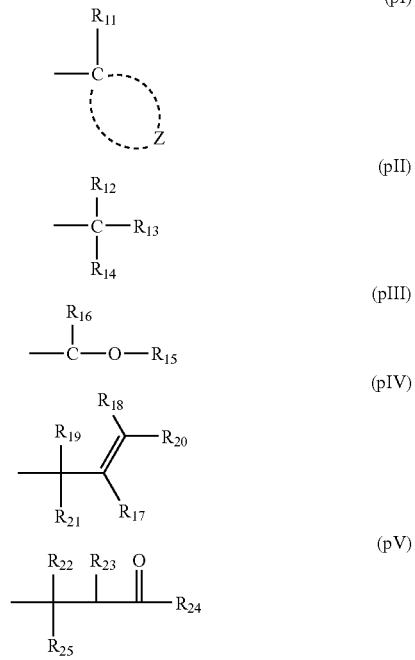

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming a cycloalkyl group together with the carbon atom.

$R_{12}$ to $R_{16}$ each independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group.

$R_{17}$ to $R_{21}$ each independently represents a hydrogen atom, a linear or branched alkyl group having a carbon number of 1 to 4, or a cycloalkyl group, provided that at least one of $R_{17}$ to $R_{2}$, represents a cycloalkyl group and that either one of $R_{19}$ and $R_{21}$ represents a linear or branched alkyl group having a carbon number of 1 to 4 or a cycloalkyl group.

$R_{22}$ to $R_{25}$ each independently represents a hydrogen atom, a linear or branched alkyl group having a carbon number of 1 to 4, or a cycloalkyl group, provided that at least one of $R_{22}$ to $R_{25}$ represents a cycloalkyl group. $R_{23}$ and $R_{24}$ may combine with each other to form a ring.

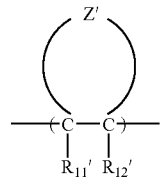

(II-AB)

In formula (II-AB), $R_{11}'$ and $R_{12}'$ each independently represents a hydrogen atom, a cyano group, a halogen atom or an alkyl group.

Z' represents an atomic group for forming an alicyclic structure, containing two bonded carbon atoms (C—C).

Formula (II-AB) is preferably the following formula (II-AB1) or (II-AB2).

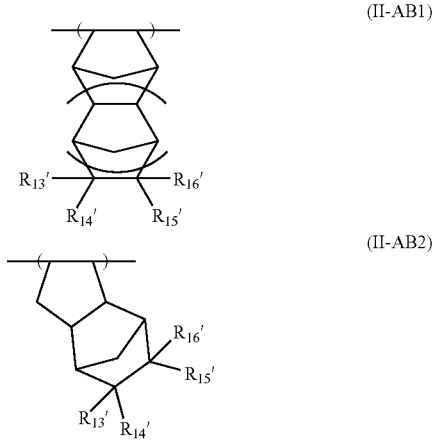

(II-AB1)

(II-AB2)

In formulae (II-AB1) and (II-AB2), $R_{13}'$ to $R_{16}'$ each independently represents a hydrogen atom, a halogen atom, a cyano group, —COOH, —COOR$_5$, a group capable of decomposing under the action of an acid, —C(=O)—X-A'-R$_{17}'$, an alkyl group or a cycloalkyl group, and at least two members out of $R_{13}'$ to $R_{16}'$ may combine to form a ring.

$R_5$ represents an alkyl group, a cycloalkyl group or a group having a lactone structure.

X represents an oxygen atom, a sulfur atom, —NH—, —NHSO$_2$— or —NHSO$_2$NH—.

A' represents a sing bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

$R_6$ represents an alkyl group or a cycloalkyl group.

n represents 0 or 1.

In formulae (pI) to (pV), the alkyl group of $R_{12}$ to $R_{25}$ is a linear or branched alkyl group having from 1 to 4 carbon atoms, and examples thereof include a methyl group, an ethyl group, a propyl group and a butyl group.

The cycloalkyl group of $R_{11}$ to $R_{25}$ and the cycloalkyl group formed by Z together with the carbon atom may be monocyclic or polycyclic. Specific examples thereof include a group having a monocyclo, bicyclo, tricyclo or tetracyclo structure or the like with a carbon number of 5 or more. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

Examples of the substituent which these alkyl group and cycloalkyl group may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). Examples of the substituent which these alkyl, alkoxy and alkoxycarbonyl groups and the like each may further have include a hydroxyl group, a halogen atom and an alkoxy group.

The structures represented by formulae (pI) to (pV) each can be used for the protection of an alkali-soluble group in the resin and constitute the acid-decomposable group. Examples of the alkali-soluble group include various groups known in this technical field.

Specific examples thereof include a structure where a hydrogen atom of a carboxylic acid group, sulfonic acid group, phenol group or thiol group is replaced by the structure represented by any one of formulae (pI) to (pV). Among these, preferred is a structure where a hydrogen atom of a carboxylic acid group or sulfonic acid group is replaced by the structure represented by any one of formulae (pI) to (pV).

The repeating unit having an alkali-soluble group protected by the structure represented by any one of formulae (pI) to (pV) is preferably a repeating unit represented by the following formula (pA):

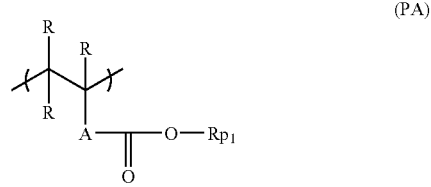

(PA)

In formula (pA), R represents a hydrogen atom, a halogen atom or a linear or branched alkyl group having from 1 to 4 carbon atoms, and the plurality of R's may be the same or different.

A represents a single bond, or one or a combination of two or more groups selected from the group consisting of an alkylene group, an ether group, a thioether group, a carbonyl group, an ester group, an amido group, a sulfonamido group, a urethane group and a urea group. A is preferably a single bond.

$Rp_1$ represents any one group of formulae (pI) to (pV).

The repeating unit represented by formula (pA) is most preferably a repeating unit comprising a 2-alkyl-2-adamantyl (meth)acrylate or a dialkyl(1-adamantyl)methyl (meth)acrylate.

Specific examples of the repeating unit represented by formula (pA) are set forth below.

(In formulae, Rx is H, CH$_3$, CF$_3$ or CH$_2$OH, and Rxa and Rxb each is an alkyl group number of 1 to 4.)

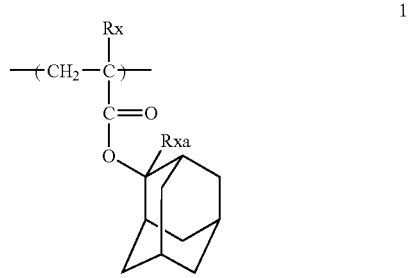

1

-continued
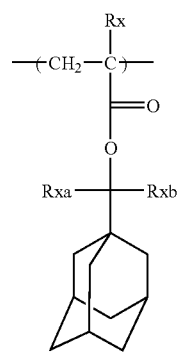
2
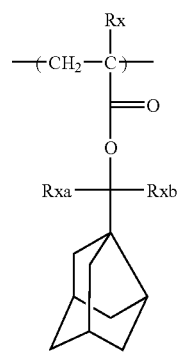
3
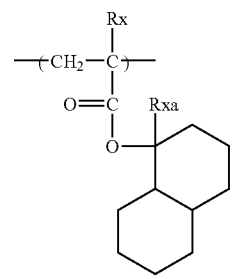
4
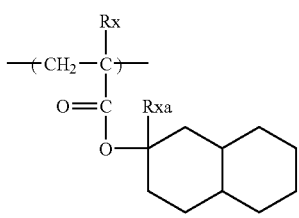
5
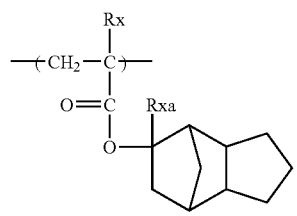
6
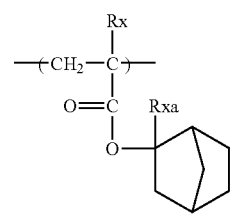
7
-continued
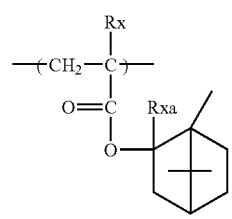
8
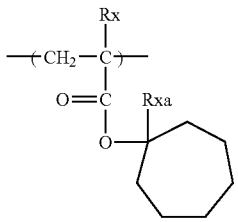
9
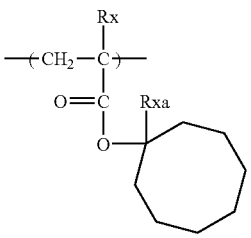
10
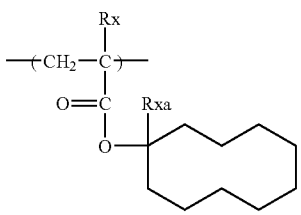
11
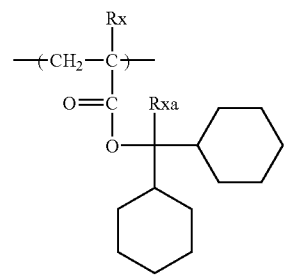
12
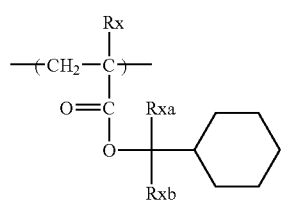
13
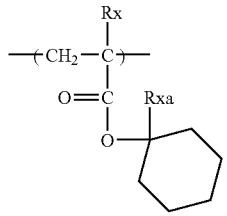
14

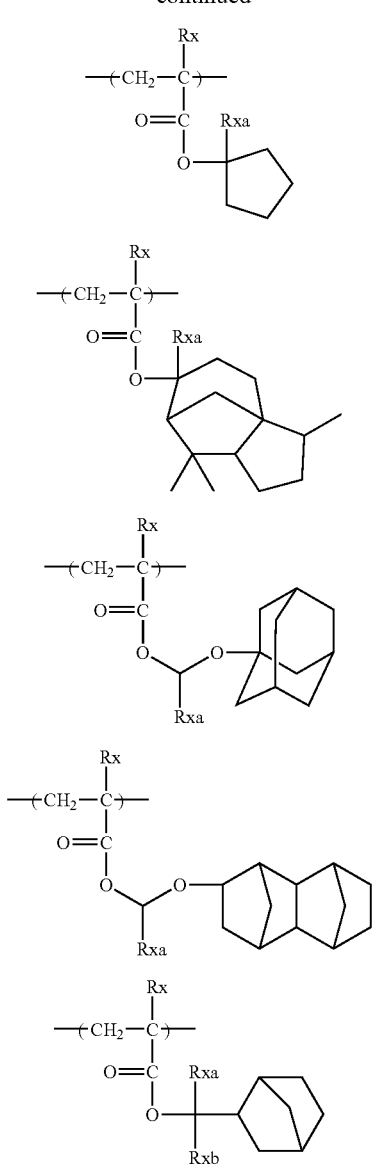

group may be contained in at least one repeating unit out of the repeating unit having an alicyclic hydrocarbon-containing partial structure represented by any one of formulae (pI) to (pV), the repeating unit represented by formula (II-AB), and the repeating unit comprising a copolymerization component described later.

Various substituents $R_{13}'$ to $R_{16}'$ in formulae (II-AB1) and (II-AB2) may work out to a substituent of an atomic group for forming an alicyclic structure in formula (II-AB) or an atomic group Z for forming a crosslinked alicyclic structure.

Specific examples of the repeating units represented by formulae (II-AB1) and (II-AB2) are set forth below, but the present invention is not limited thereto.

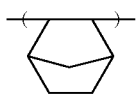
[II-1]

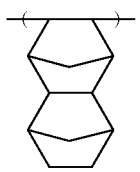
[II-2]

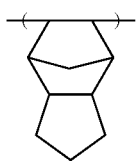
[II-3]

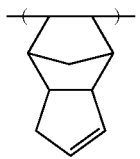
[II-4]

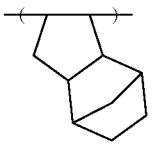
[II-5]

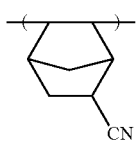
[II-6]

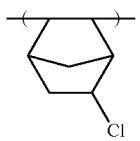
[II-7]

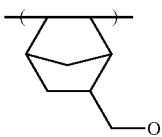
[II-8]

Examples of the halogen atom of $R^{11'}$ and $R_{12}'$ in formula (II-AB) include a chlorine atom, a bromine atom, a fluorine atom and an iodine atom.

Examples of the alkyl group of $R_{11}'$ and $R_{12}'$ include a linear or branched alkyl group having a carbon number of 1 to 10.

The atomic group of Z' for forming an alicyclic structure is an atomic group for forming, in the resin, an alicyclic hydrocarbon repeating unit which may have a substituent, and in particular, an atomic group for forming a crosslinked alicyclic structure to form a crosslinked alicyclic hydrocarbon repeating unit is preferred.

Examples of the skeleton of the alicyclic hydrocarbon formed are the same as those of the alicyclic hydrocarbon group of $R_{11}$ to $R_{25}$ in formulae (pI) to (pV).

The alicyclic hydrocarbon skeleton may have a substituent, and examples of the substituent include $R_{13}'$ to $R_{16}'$ in formulae (II-AB1) and (II-AB2).

In the alicyclic hydrocarbon-based acid-decomposable resin for use in the present invention, the acid-decomposable

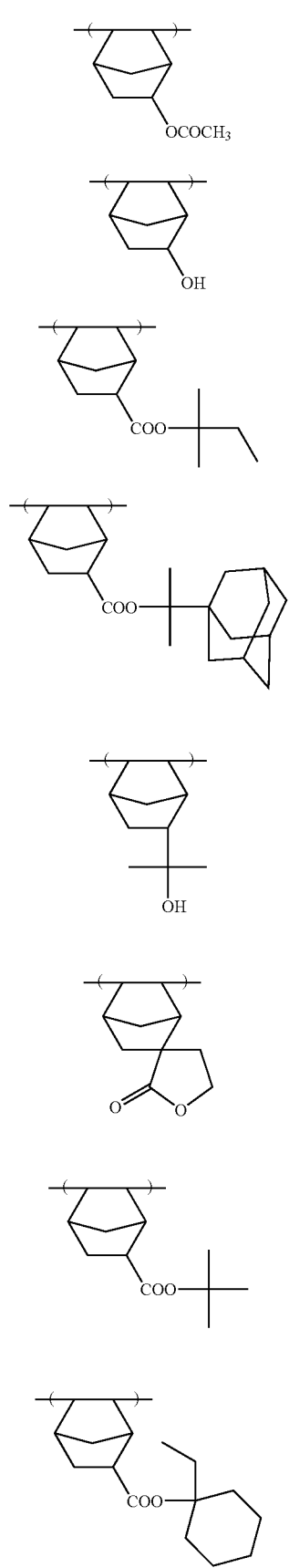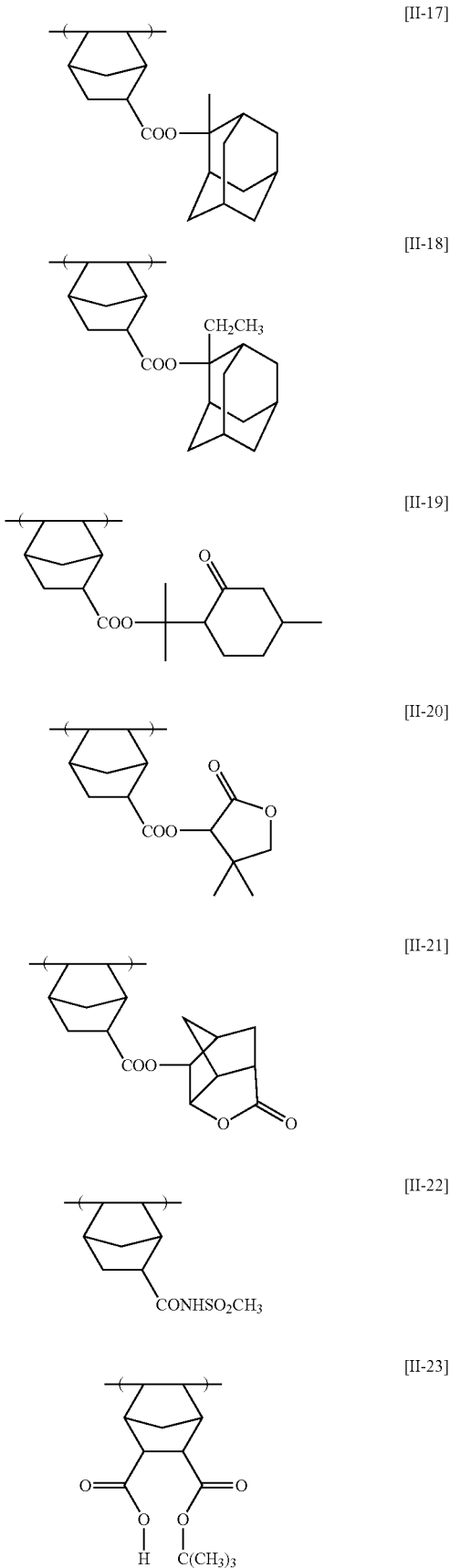

[II-24] 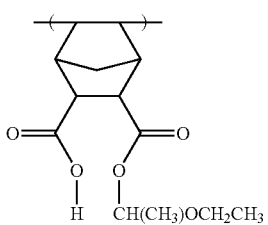

[II-25] 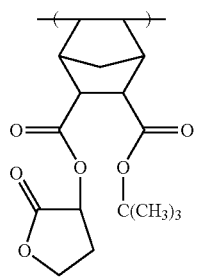

[II-26] 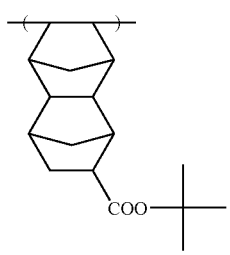

[II-27] 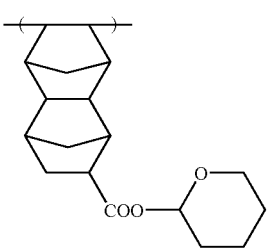

[II-28] 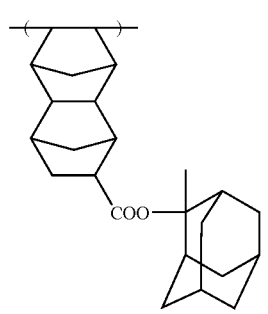

[II-29] 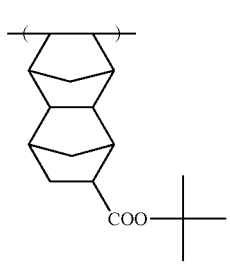

[II-30] 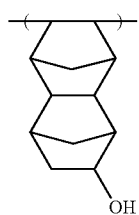

[II-31] 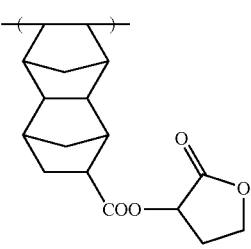

[II-32] 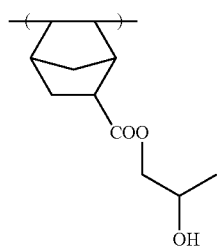

The alicyclic hydrocarbon-based acid-decomposable resin for use in the present invention preferably has a lactone group. As for the lactone group, any group may be used as long as it has a lactone structure, but a group having a 5-, 6- or 7-membered ring lactone structure is preferred. The 5-, 6- or 7-membered ring lactone structure is preferably condensed with another ring structure in the form of forming a bicyclo or spiro structure. The alicyclic hydrocarbon-based acid-decomposable resin for use in the present invention more preferably has a repeating unit containing a group having a lactone structure represented by any one of the following formulae (LC1-1) to (LC1-16). The group having a lactone structure may be bonded directly to the main chain. Among these lactone structures, (LC1-1), (LC1-4), (LC1-5), (LC1-6), (LC1-13) and (LC1-14) are preferred. By virtue of using a specific lactone structure, the line edge roughness and the development defect are improved.

LCl-1 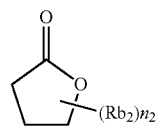

LCl-2 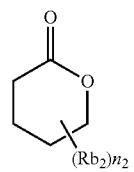

LCl-3 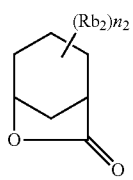

LCl-4 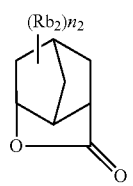

LCl-5 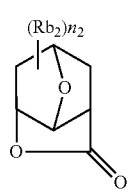

LCl-6 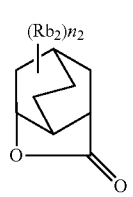

LCl-7 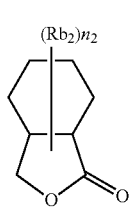

LCl-8 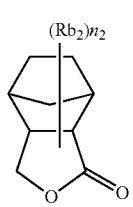

LCl-9 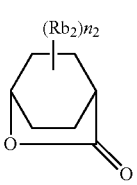

LCl-10 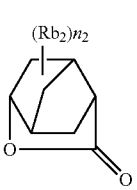

LCl-11 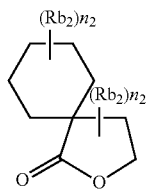

LCl-12 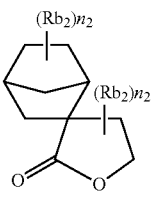

LCl-13 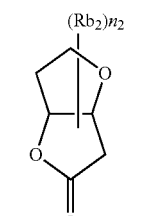

LCl-14 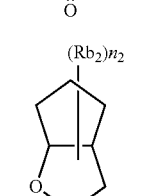

LCl-15 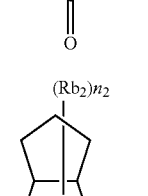

LCl-16 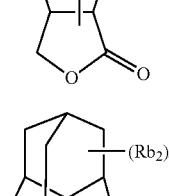

The lactone structure moiety may or may not have a substituent ($Rb_2$). Preferred examples of the substituent ($Rb_2$) include an alkyl group having a carbon number of 1 to 8, a cycloalkyl group having a carbon number of 3 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. $n_2$ represents an integer of 0 to 4. When $n_2$ is an integer of 2 or more, the plurality of $Rb_2$'s may be the same or different and also, the plurality of $Rb_2$'s may combine with each other to form a ring.

Examples of the repeating unit containing a group having a lactone structure represented by any one of formulae (LC1-1) to (LC1-16) include a repeating unit where at least one of $R_{13}'$ to $R_{16}'$ in formula (II-AB1) or (II-AB2) has a group represented by any one of formulae (LC1-1) to (LC1-16) (for example, $R_5$ of —$COOR_5$ is a group represented by any one of formulae (LC1-1) to (LC1-16)), and a repeating unit represented by the following formula (AI):

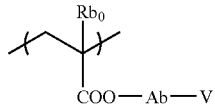
(AI)

In formula (AI), $Rb_0$ represents a hydrogen atom, a halogen atom or an alkyl group having a carbon number of 1 to 4. Preferred examples of the substituent which the alkyl group of $Rb_0$ may have include a hydroxy group and a halogen atom. Examples of the halogen atom of $Rb_0$ include a fluorine atom, a chlorine atom, a bromine atom and an iodine atom. $Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent group comprising a combination thereof, preferably a single bond or a linking group represented by $-Ab_1-CO_2-$. $Ab_1$ is a linear or branched alkylene group or a monocyclic or polycyclic cycloalkylene group, preferably a methylene group, an ethylene group, a cyclohexyl group, an adamantyl group or a norbornyl group.

V represents a group represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

Specific examples of the repeating unit containing a group having a lactone structure are set forth below, but the present invention is not limited thereto.

(In formulae, Rx is H, $CH_3$, $CH_2OH$ or $CF_3$.)

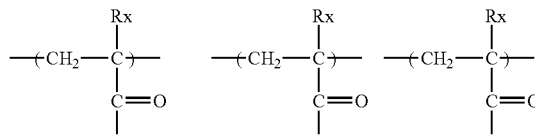

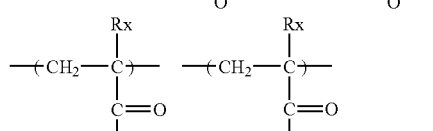

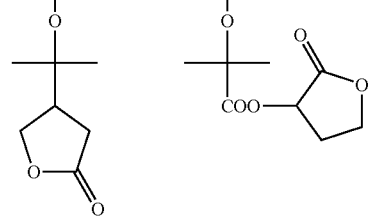

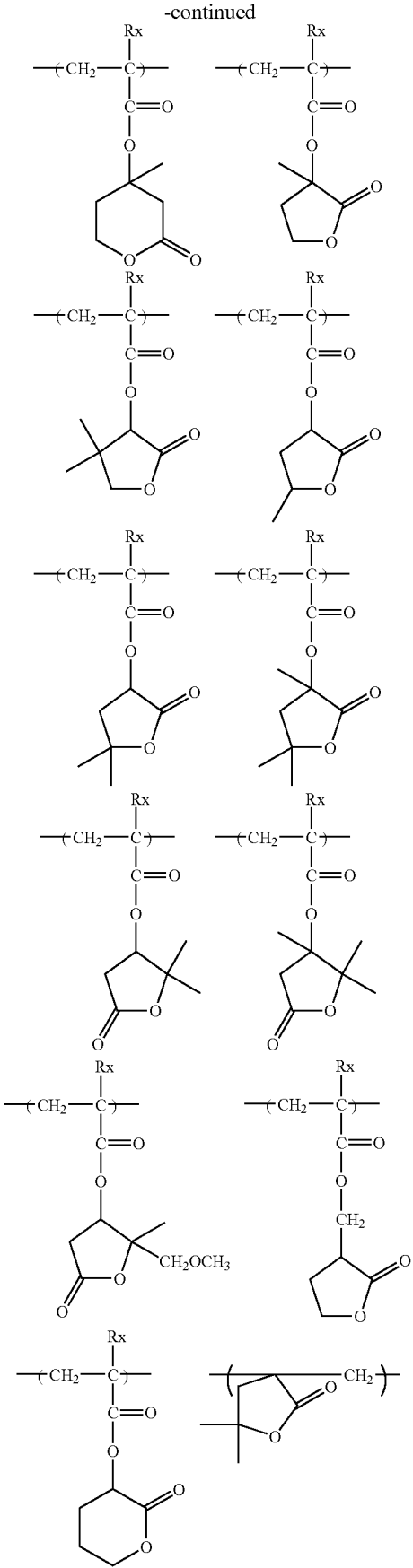

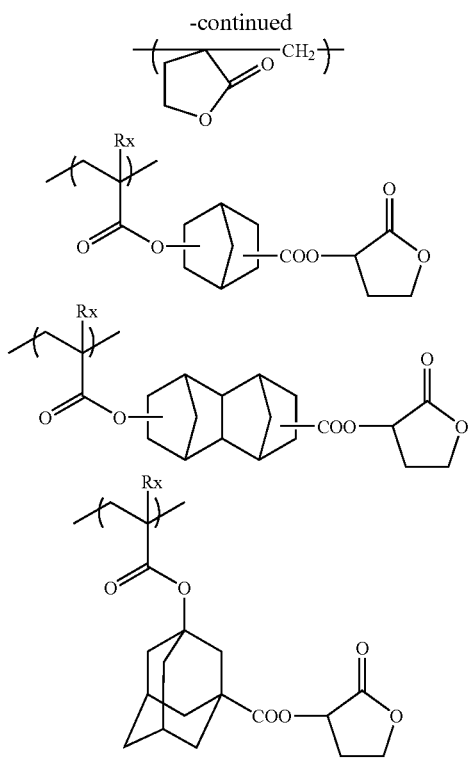
(In formulae, Rx is H, CH₃, CH₂OH or CF₃.)
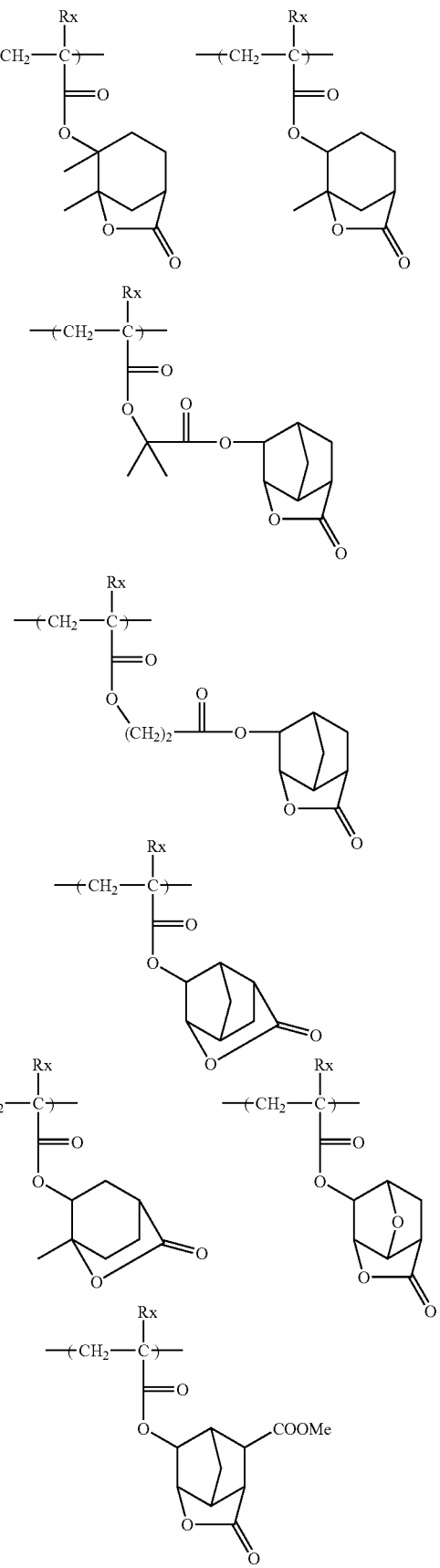

-continued
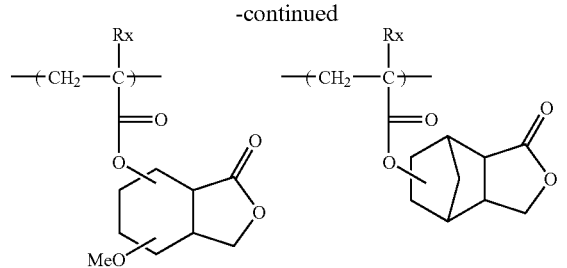
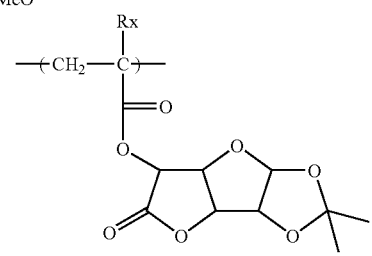
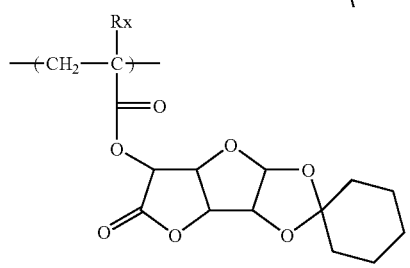
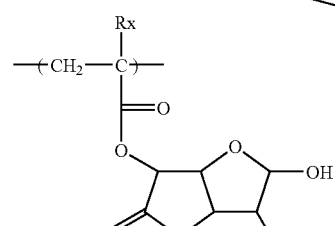
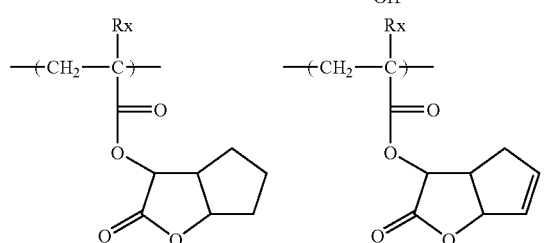
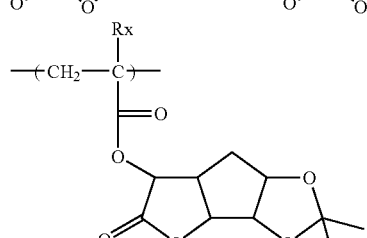
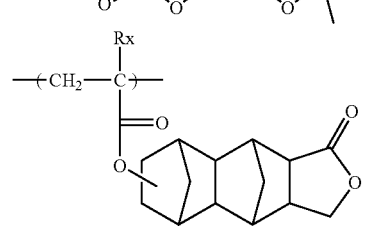
(In formulae, Rx is H, $CH_3$, $CH_2OH$ or $CF_3$.)
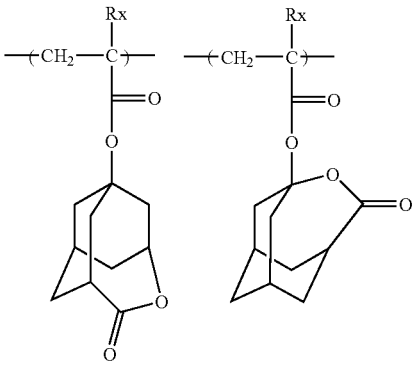
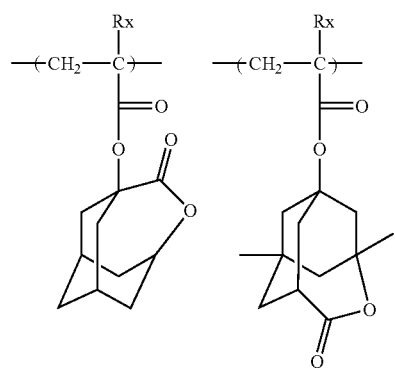
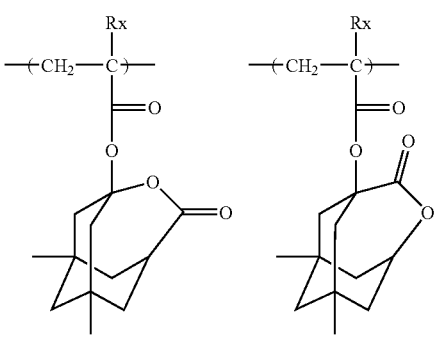
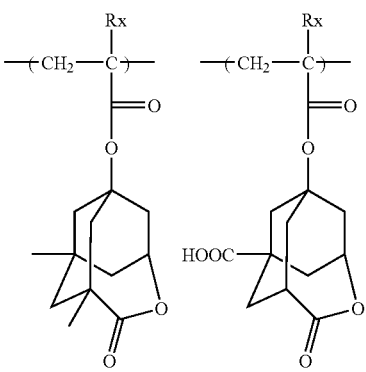

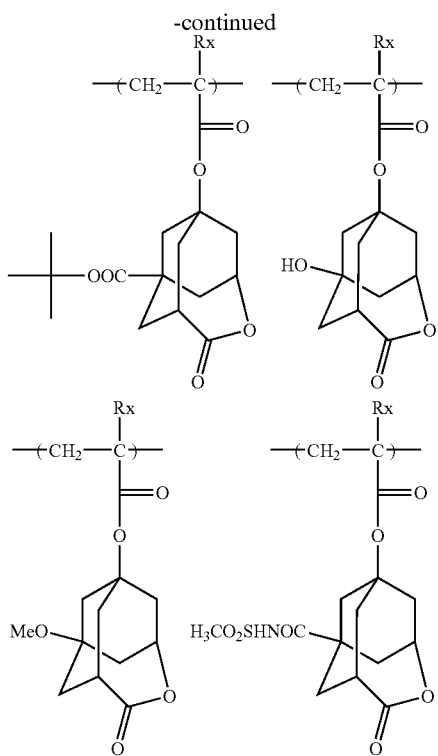

The alicyclic hydrocarbon-based acid-decomposable resin for use in the present invention preferably has a repeating unit containing a group having an alicyclic hydrocarbon structure substituted by a polar group. By virtue of this repeating unit, the adhesion to substrate and the affinity for developer are enhanced. The polar group is preferably a hydroxyl group or a cyano group. Examples of the group having an alicyclic hydrocarbon structure substituted by a polar group include a group represented by the following formula (VIIa) or (VIIb):

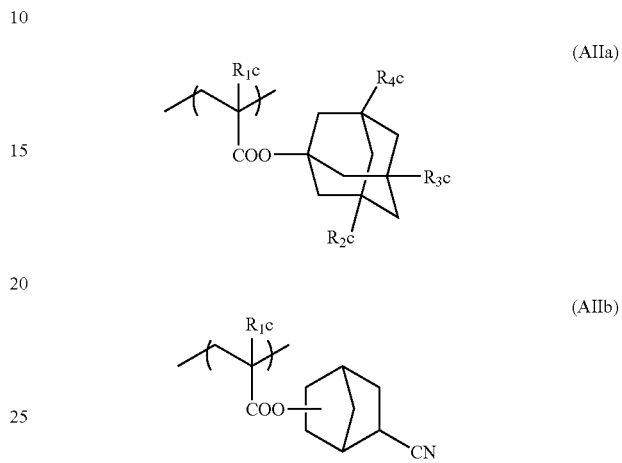

In formula (VIIa), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A group where one or two member out of $R_{2c}$ to $R_{4c}$ is a hydroxyl group with the remaining being a hydrogen atom is preferred, and a group where two members out of $R_{2c}$ to $R_{4c}$ are a hydroxyl group with the remaining being a hydrogen atom is more preferred.

The group represented by formula (VIIa) is preferably a dihydroxy form or a monohydroxy form, more preferably a dihydroxy form.

Examples of the repeating unit having a group represented by formula (VIIa) or (VIIb) include a repeating unit where at least one of $R_{13}'$ to $R_{16}'$ in formula (II-AB1) or (II-AB2) has a group represented by formula (VIIa) or (VIIb) (for example, $R_5$ of —$COOR_5$ is a group represented by formula (VIIa) or (VIIb)), and a repeating unit represented by the following formula (AIIa) or (AIIb):

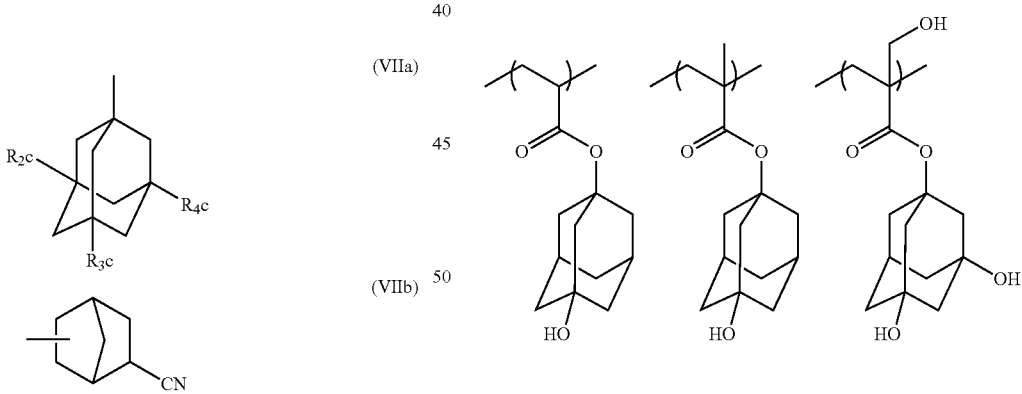

In formulae (AIIa) and (AIIb), $R_{1c}$ represents a hydrogen atom, a methyl group, a trifluoromethyl group or a hydroxymethyl group.

Specific examples of the repeating unit having a group represented by formula (AIIa) or (AIIb) are set forth below, but the present invention is not limited thereto.

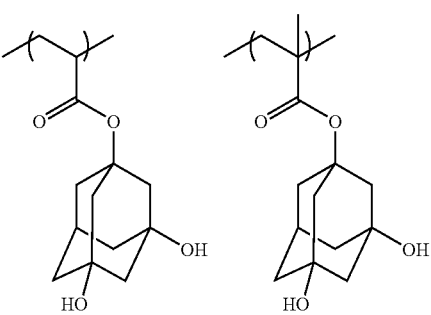

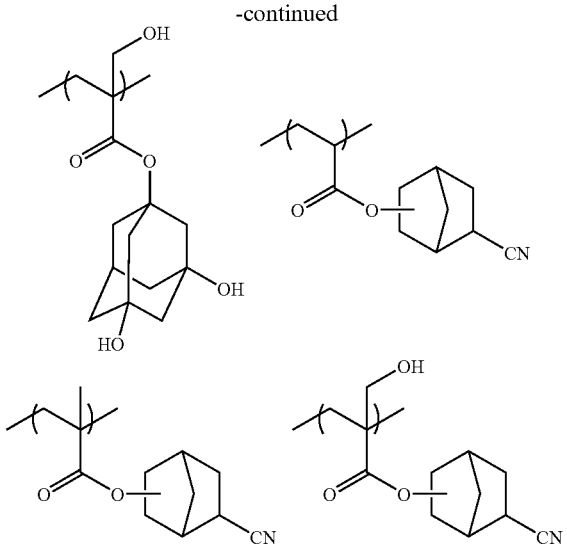

The alicyclic hydrocarbon-based acid-decomposable resin for use in the present invention may contain a repeating unit represented by the following formula (VIII):

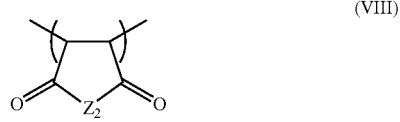

(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

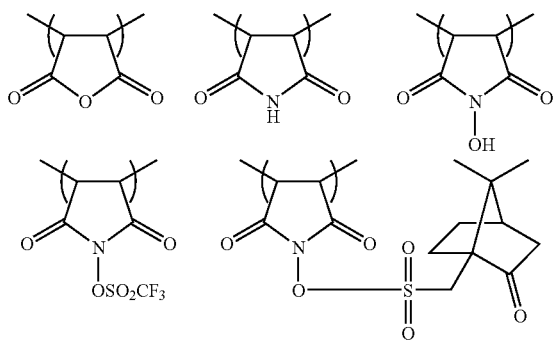

The alicyclic hydrocarbon-based acid-decomposable resin for use in the present invention preferably contains a repeating unit having an alkali-soluble group, more preferably a repeating unit having a carboxyl group. By virtue of containing such a repeating unit, the resolution increases in usage of forming contact holes. As for the repeating unit having a carboxyl group, a repeating unit where a carboxyl group is directly bonded to the resin main chain, such as repeating unit by an acrylic acid or a methacrylic acid, a repeating unit where a carboxyl group is bonded to the resin main chain through a linking group, and a repeating unit where an alkali-soluble group is introduced into the polymer chain terminal by using an alkali-soluble group-containing polymerization initiator or chain transfer agent at the polymerization, all are preferred. The linking group may have a monocyclic or polycyclic hydrocarbon structure. An acrylic acid and a methacrylic acid are most preferred.

The alicyclic hydrocarbon-based acid-decomposable resin for use in the present invention may contain a repeating unit having from 1 to 3 groups represented by the following formula (F1). By virtue of this repeating unit, the line edge roughness performance is enhanced.

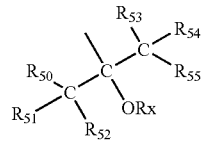

(F1)

In formula (F1), $R_{50}$ to $R_{55}$ each independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom.

Rx represents a hydrogen atom or an organic group (preferably an acid-decomposable protective group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like, and preferred examples thereof include an alkyl group having a carbon number of 1 to 3, such as methyl group and trifluoromethyl group.

It is preferred that $R_{50}$ to $R_{55}$ all are a fluorine atom.

The organic group represented by Rx is preferably an acid-decomposable group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following formula (F2):

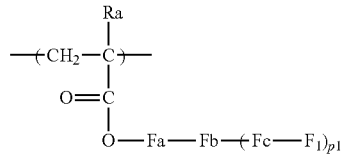

(F2)

In formula (F2), Ra represents a hydrogen atom, a halogen atom or an alkyl group having a carbon number of 1 to 4. Preferred examples of the substituent which the alkyl group of Ra may have include a hydroxyl group and a halogen atom.

Fa represents a single bond or a linear or branched alkylene group, preferably a single bond.

Fb represents a monocyclic or polycyclic hydrocarbon group.

Fc represents a single bond or a linear or branched alkylene group, preferably a single bond or a methylene group.

$F_1$ represents a group represented by formula (F1).

$p_1$ represents an integer of 1 to 3.

The cyclic hydrocarbon group in Fb is preferably a cyclopentyl group, a cyclohexyl group or a norbornyl group.

Specific examples of the repeating unit having a group represented formula (F1) are set forth below.

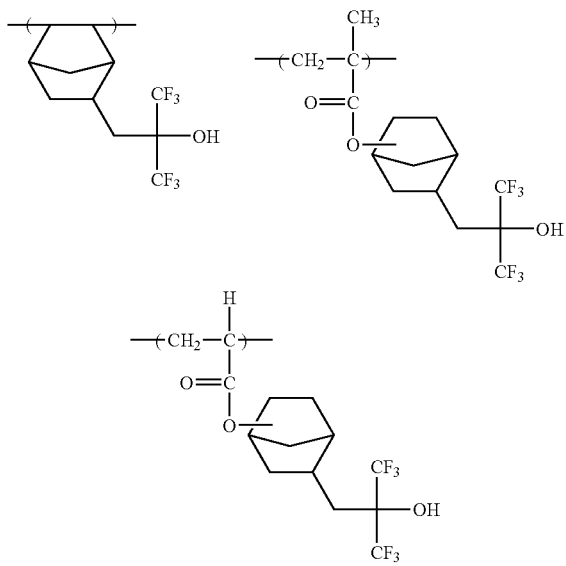

The alicyclic hydrocarbon-based acid-decomposable resin for use in the present invention may further contain a repeating unit having an alicyclic hydrocarbon structure and not exhibiting acid decomposability. By virtue of containing this repeating unit, dissolving out of a low molecular component from the resist film into the immersion liquid at the immersion exposure can be reduced. Examples of such a repeating unit include 1-adamantyl (meth)acrylate, tricyclodecanyl (meth) acrylate and cyclohexyl (meth)acrylate.

The alicyclic hydrocarbon-based acid-decomposable resin for use in the present invention may contain, in addition to the above-described repeating structural units, various repeating structural units for the purpose of controlling the dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of such a repeating structural unit, the performance required of the alicyclic hydrocarbon-based acid-decomposable resin, particularly, (1) solubility in the coating solvent,
(2) film-forming property (glass transition point),
(3) alkali developability,
(4) film loss (selection of hydrophilic, hydrophobic or alkali-soluble group),
(5) adhesion of unexposed area to substrate,
(6) dry etching resistance and the like, can be finely controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomer corresponding to the above-described various repeating structural units may be copolymerized.

In the alicyclic hydrocarbon-based acid-decomposable resin, the molar ratio of respective repeating structural units contained is appropriately determined to control the dry etching resistance of resist, suitability for standard developer, adhesion to substrate, resist profile and performances generally required of the resist, such as resolving power, heat resistance and sensitivity.

The preferred embodiment of the alicyclic hydrocarbon-based acid-decomposable resin for use in the present invention includes the followings:

(1) a resin containing a repeating unit having an alicyclic hydrocarbon-containing partial structure represented by any one of formulae (pI) to (pV) (side chain type), preferably containing a (meth)acrylate repeating unit having a structure represented by any one of formulae (pI) to (pV), and (2) a resin containing a repeating unit represented by formula (II-AB) (main chain type).

The embodiment of (2) further includes:

(3) a resin having a repeating unit represented by formula (II-AB), a maleic anhydride derivative and a (meth)acrylate structure (hybrid type).

In the alicyclic hydrocarbon-based acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the alicyclic hydrocarbon-based acid-decomposable resin, the content of the repeating unit having an alicyclic hydrocarbon-containing partial structure represented by any one of formulae (pI) to (pV) is preferably from 20 to 70 mol %, more preferably from 20 to 50 mol %, still more preferably from 25 to 40 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

The content in the resin of the repeating structural unit based on the monomer as the further copolymerization component can also be appropriately selected according to the desired resist performance, but the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

When the composition of the present invention is used for exposure with ArF, the resin preferably has no aromatic group in view of transparency to ArF light.

The alicyclic hydrocarbon-based acid-decomposable resin for use in the present invention is preferably a resin where all repeating units comprise a (meth)acrylate repeating unit. In this case, the repeating units may be all a methacrylate, all an acrylate, or a mixture of methacrylate/acrylate, but the content of the acrylate repeating unit is preferably 50 mol % or less based on all repeating units. The alicyclic hydrocarbon-based acid-decomposable resin for use in the present invention is more preferably a ternary copolymerization polymer comprising from 20 to 50% of the repeating unit having an alicyclic hydrocarbon-containing partial structure represented by any one of formulae (pI) to (pV), from 20 to 50% of the repeating unit having a lactone structure and from 5 to 30% of the repeating unit having an alicyclic hydrocarbon structure substituted by a polar group, or a quaternary copolymerization polymer additionally comprising from 0 to 20% of the other repeating unit.

The alicyclic hydrocarbon-based acid-decomposable resin for use in the present invention is still more preferably a ternary copolymerization polymer comprising from 20 to 50% of a repeating unit having an acid-decomposable group represented by any one of the following formulae (ARA-1) to (ARA-5), from 20 to 50% of a repeating unit having a lactone group represented by any one of formulae (ARL-1) to (ARL-6), and from 5 to 30% of a repeating unit having a polar group-substituted alicyclic hydrocarbon structure represented by any one of formulae (ARH-1) to (ARH-3), or a quaternary copolymerization polymer additionally comprising from 5 to 20% of a repeating unit having a carboxyl group or a group represented by formula (F1) or a repeating unit having an alicyclic hydrocarbon structure and not exhibiting acid decomposability.

ARA-1
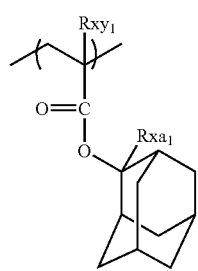

ARA-2
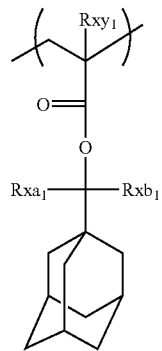

ARA-3
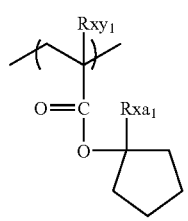

ARA-4
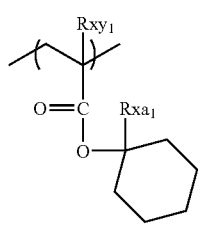

ARA-5
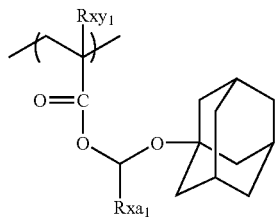

ARL-1
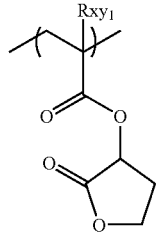

ARL-2
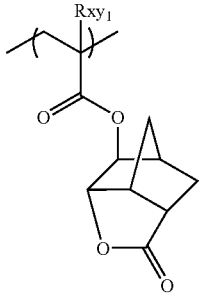

ARL-3
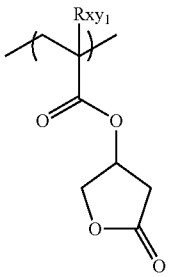

ARL-4
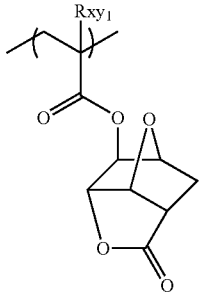

ARL-5
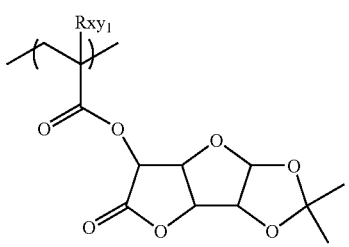

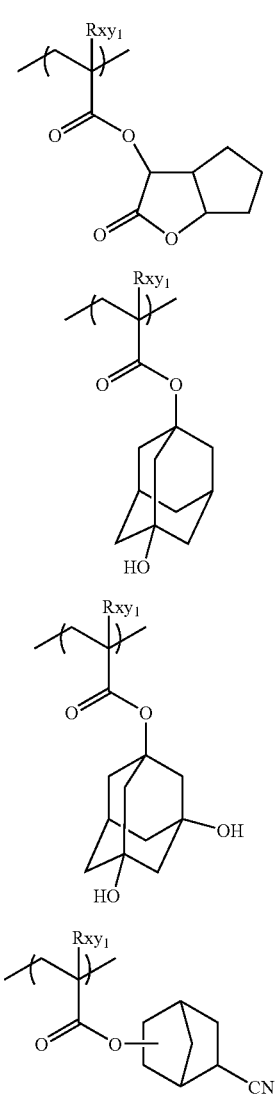

In formulae (ARA-1) to (ARH-3), $Rxy_1$ represents a hydrogen atom or a methyl group, and $Rxa_1$ and $Rxb_1$ each independently represents a methyl group or an ethyl group.

The alicyclic hydrocarbon-based acid-decomposable resin for use in the present invention can be synthesized by an ordinary method (for example, radical polymerization). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers (e.g., diisopropyl ether), ketones (e.g., methyl ethyl ketone, methyl isobutyl ketone), an ester solvent (e.g., ethyl acetate), an amide solvent (e.g., dimethylformamide, diethylacetamide), and a solvent described later, which can dissolve the composition of the present invention, such as propylene glycol monomethyl ether acetate, propylene glycol monomethyl ether and cyclohexanone. The polymerization is preferably performed by using the same solvent as the solvent used in the resist composition of the present invention. By the use of this solvent, generation of particles during storage can be suppressed.

The polymerization reaction is preferably performed in an inert gas atmosphere such as nitrogen and argon. As for the polymerization initiator, the polymerization is started by using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methyl-propionate). If desired, the initiator is added additionally or in parts. After the completion of reaction, the reactant is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C.

The weight average molecular weight of the resin as the component (B1) is preferably from 1,000 to 200,000, more preferably from 3,000 to 20,000, and most preferably from 5,000 to 15,000, in terms of polystyrene by the GPC method. When the weight average molecular weight is from 1,000 to 200,000, deterioration in the heat resistance or dry etching resistance, in the developability and in the film-forming property due to increased viscosity can be prevented. The molecular weight distribution is usually from 1 to 5, preferably from 1 to 3, more preferably from 1 to 2. As the resin has a smaller molecular weight distribution, the resolution and resist profile are more enhanced, the resist pattern can have a smoother side wall and the roughness property is more excellent.

In the positive photosensitive composition of the present invention, the amount of the resin as the component (B1) blended in the entire composition is preferably from 50 to 99.99 mass %, more preferably from 60 to 99.0 mass %, based on the entire solid content.

In the present invention, as the resin of the component (B1), one resin may be used alone or a plurality of resins may be used in combination.

[3] (B2) Resin Having at Least One Group Selected from (a) an Alkali-soluble Group and (b) a Group Capable of Decomposing Under the Action of an Alkali to Produce an Alkali-soluble Group, and not Having a Group Capable of Decomposing Under the Action of an Acid The positive photosensitive composition of the present invention comprises a resin having at least one group selected from (a) an alkali-soluble group and (b) a group capable of decomposing under the action of an alkali to produce an alkali-soluble group, and not having a group capable of decomposing under the action of an acid (hereinafter sometimes referred to as a "resin as the component (B2)").

The term "not having a group capable of decomposing under the action of an acid" means to exhibit no or very little decomposability under the action of an acid in the image forming process where the positive photosensitive composition of the present invention is usually used, and to have substantially no group contributing to the image formation by the acid decomposition, for example, not to have an acid-decomposable group described with respect to the resin as the component (B1). More specifically, in the case of a positive chemical amplification resist, an acid generator in the exposed area is decomposed in the exposure step and generates an acid, and in the post-heating step, a resin having an acid-decomposable group is decomposed by the effect of the acid and releases an alkali-soluble group, whereby only the exposure area can be alkali-developed. As a result, the exposure area is selectively developed in the development step and a pattern is formed. The resin as the component (B2) for use in the present invention exhibits no or very little decomposability under the action of an acid in the exposure and post-heating steps and has substantially no group contributing to the image formation by the acid decomposition. By virtue of adding the resin as the component (B2), the alkali solubility in the alkali development step can be enhanced and as compared with the case of using the resin as the component (B1) alone, the line edge roughness performance is enhanced and the pattern profile is improved.

The resin as the component (B2) is preferably a resin having at least one repeating unit derived from a derivative selected from a (meth)acrylic acid derivative and an alicyclic olefin derivative.

The alkali-soluble group (a) contained in the resin as the component (B2) is preferably a carboxyl group, a phenolic hydroxyl group, an aliphatic hydroxyl group with the carbon atom at the 1- or 2-position being substituted by an electron withdrawing group, an electron withdrawing group-substituted amino group (for example, a sulfonamide group, a sulfonimide group, a bis-sulfonylimide group), or an electron withdrawing group-substituted methylene or methine group (for example, a methylene or methine group substituted by at least two substituents selected from a ketone group and an ester group).

Examples of the repeating unit (A) having (a) an alkali-soluble group include a repeating unit comprising (meth)acrylic acids, a (meth)acrylic acid derivative having (a) an alkali-soluble group, an olefin derivative having (a) an alkali-soluble group, or a styrene derivative having (a) an alkali-soluble group.

Specific examples of the repeating unit (A) having (a) an alkali-soluble group, contained in the resin as the component (B2), include the following repeating units.

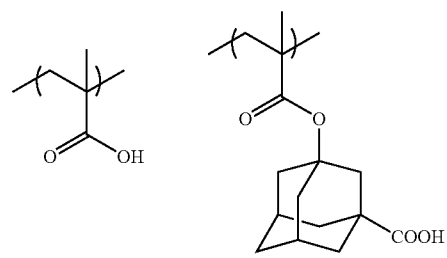

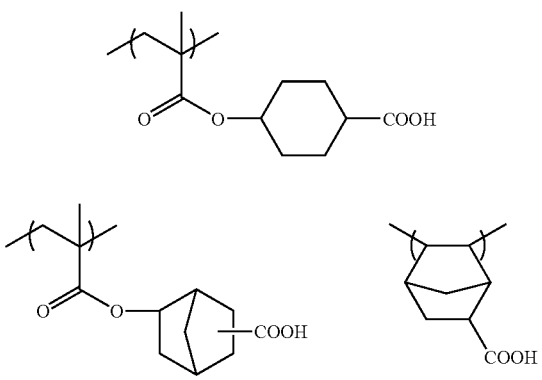

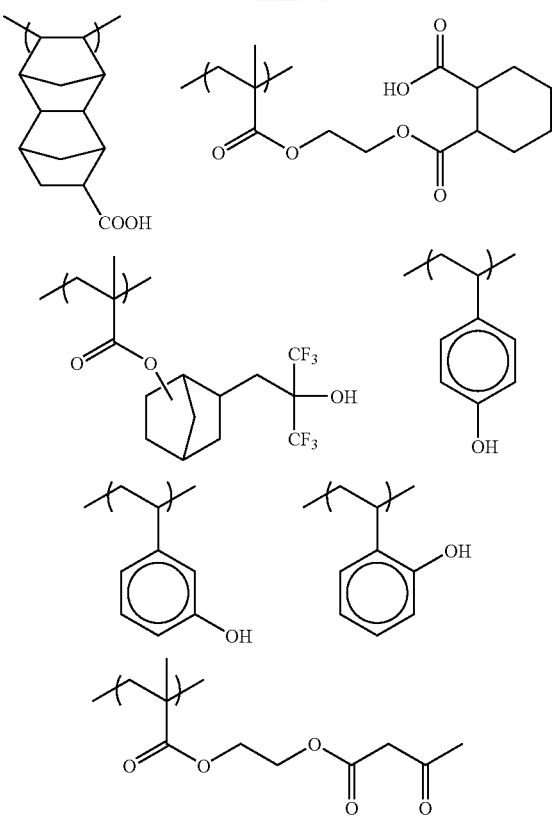

The group (b) capable of decomposing under the action of an alkali to produce an alkali-soluble group, contained in the resin as the component (B2), is preferably a lactone group or an acid anhydride group, more preferably a lactone group.

Examples of the repeating unit (B) having (b) a group capable of decomposing under the action of an alkali to produce an alkali-soluble group include a repeating unit comprising a (meth)acrylic acid ester derivative having (b) a group capable of decomposing under the action of an alkali to produce an alkali-soluble group, an olefin derivative having (b) a group capable of decomposing under the action of an alkali to produce an alkali-soluble group, or a styrene derivative having (b) a group capable of decomposing under the action of an alkali to produce an alkali-soluble group.

Specific examples of the repeating unit (B) having (b) a group capable of decomposing under the action of an alkali to produce an alkali-soluble group, contained in the resin as the component (B2), include the following repeating units.

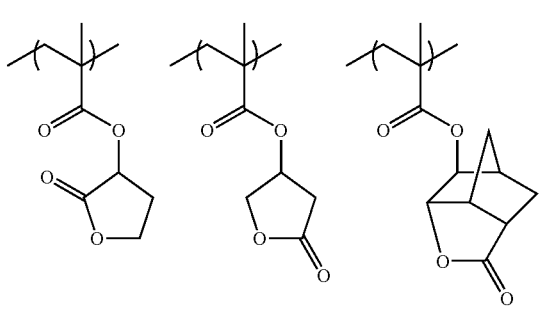

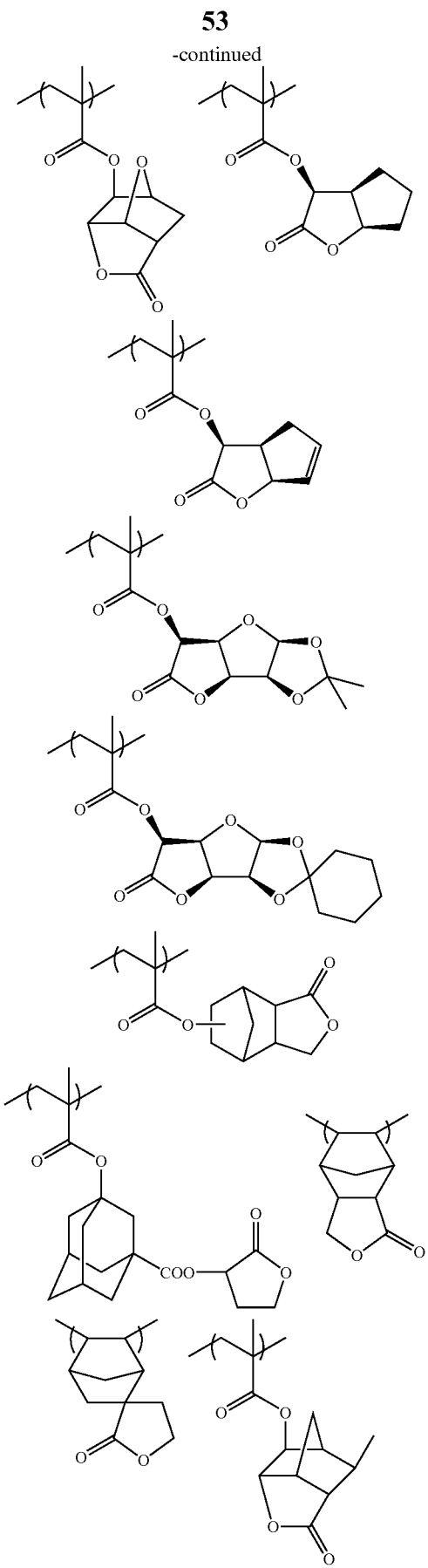
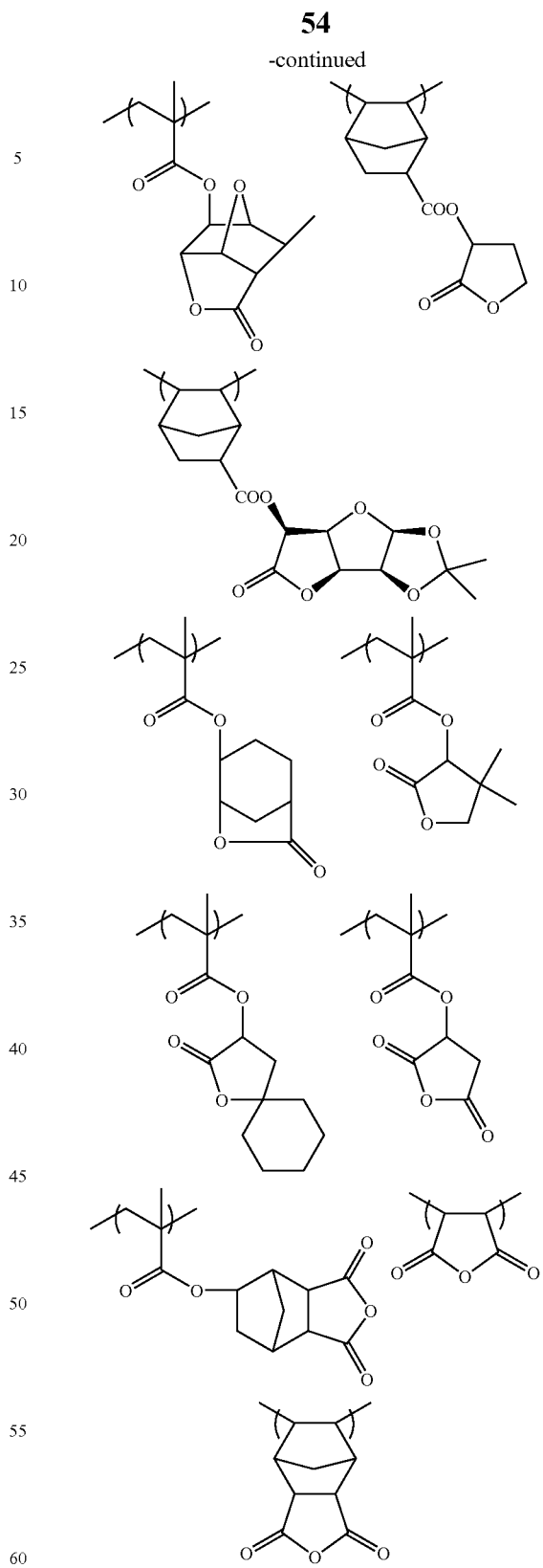
As for the resin of the component (B2), the following resins (B2-1) to (B2-6) are preferred, and resins (B2-3) to (B2-6) containing a repeating unit having (b) a group capable of decomposing under the action of an alkali to produce an alkali-soluble group are more preferred.

(B2-1) A resin containing only the repeating unit (A) having (a) an alkali-soluble group.

(B2-2) A copolymer resin of the repeating unit (A) having (a) an alkali-soluble group and the repeating unit (C) having another functional group.

(B2-3) A resin comprising only the repeating unit (B) having (b) a group capable of decomposing under the action of an alkali to produce an alkali-soluble group.

(B2-4) A copolymer resin of the repeating unit (B) having (b) a group capable of decomposing under the action of an alkali to produce an alkali-soluble group and the repeating unit (C) having another functional group.

(B2-5) A copolymer resin of the repeating unit (A) having (a) an alkali-soluble group and the repeating unit (B) having (b) a group capable of decomposing under the action of an alkali to produce an alkali-soluble group.

(B2-6) A copolymer resin of the repeating unit (A) having (a) an alkali-soluble group, the repeating unit (B) having (b) a group capable of decomposing under the action of an alkali to produce an alkali-soluble group, and the repeating unit (C) having another functional group.

In the resins (B2-2), (B2-4) and (B2-6), in view of dry etching resistance, hydrophilicity/hydrophobicity, interaction and the like, an appropriate functional group can be introduced into the repeating unit (C) having another functional group.

Examples of the repeating unit (C) having another functional group include a repeating unit having a polar functional group such as hydroxyl group, cyano group, carbonyl group and ester group, a repeating unit having a monocyclic or polycyclic hydrocarbon structure, a repeating unit having a fluoroalkyl group, and a repeating unit having a plurality of these functional groups.

The repeating unit (C) having a polar functional group is preferably a repeating unit having a group represented by formula (VIIa) or (VIIb), more preferably a repeating unit represented by formula (AIIa) or (AIIb).

The repeating unit (C) having a monocyclic or polycyclic hydrocarbon structure is preferably a repeating unit having an alicyclic hydrocarbon structure and not exhibiting acid decomposability. By virtue of this repeating unit, dissolving out of a low molecular component from the resist film into the immersion liquid at the immersion exposure can be reduced. Examples of such a repeating unit include 1-adamantyl (meth)acrylate, tricyclodecanyl (meth)acrylate and cyclohexyl (meth)acrylate.

As for the resin of the component (B2), a resin obtained by removing a repeating unit having a group capable of decomposing under the action of an acid (for example, a repeating unit having an alicyclic hydrocarbon-containing partial structure represented by any one of formulae (pI) to (pV)) from the resin of the component (B1) may also be suitably used.

In particular, the resin as the component (B2) is preferably a resin containing only a repeating unit having a lactone group (for example, a homopolymer comprising a repeating unit having a lactone group, and a copolymer comprising two or more kinds of repeating units each having a lactone group), or a binary or ternary copolymer resin of a repeating unit having a lactone group with other repeating units, preferably a binary or ternary copolymer resin containing 50 mol % or more of a repeating unit having a lactone group.

Specific preferred examples of the resin as the component (B2) are set forth below.

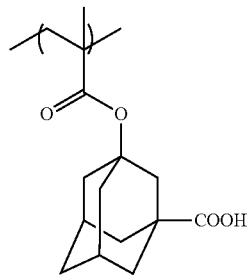

(B2-1-1)

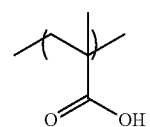

(B2-1-2)

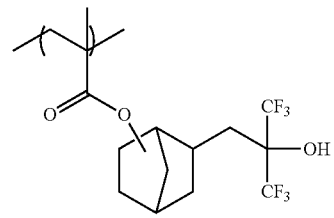

(B2-1-3)

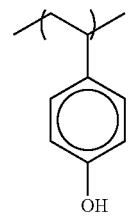

(B2-1-4)

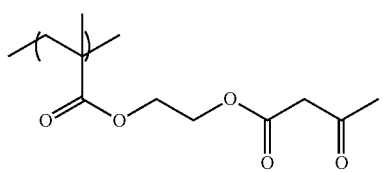

(B2-1-5)

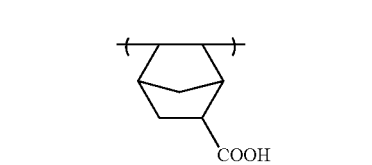

(B2-1-6)

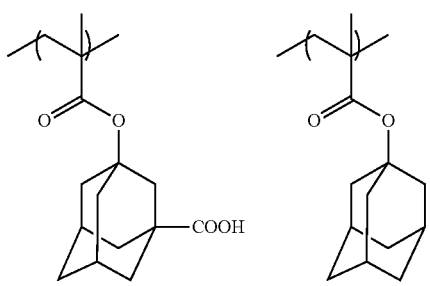

(B2-2-2)

(B2-2-1)
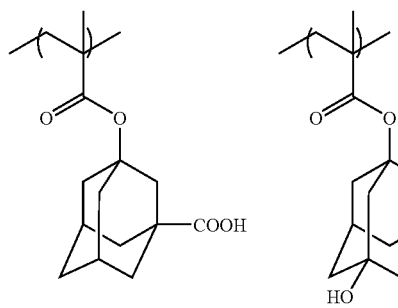
(B2-2-3)
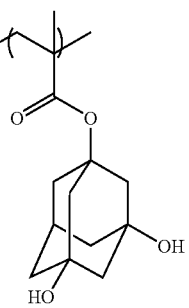
(B2-3-1)
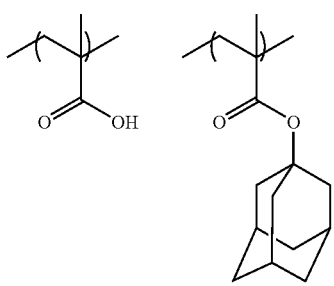
(B2-3-2)
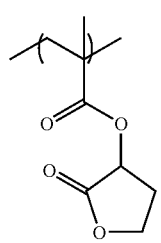
(B2-3-3)
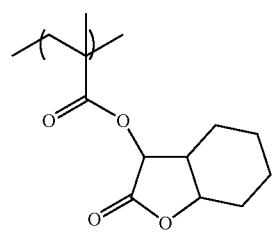
(B2-3-4)
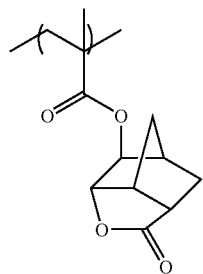
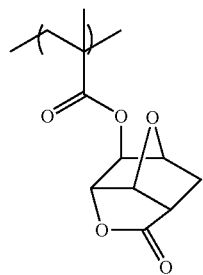
(B2-3-5)
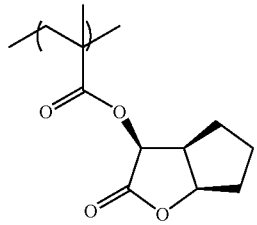
(B2-3-6)
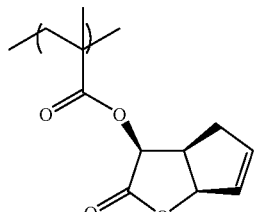
(B2-3-7)
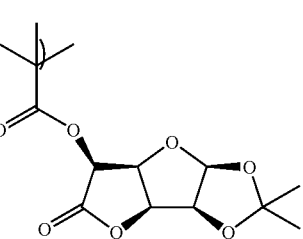
(B2-3-8)
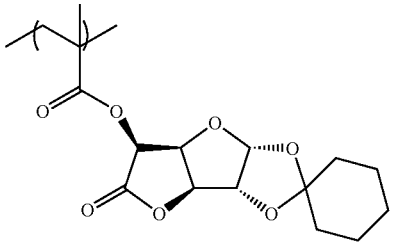
(B2-3-9)
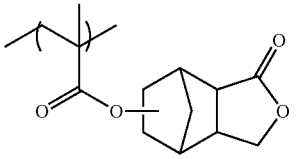
(B2-3-10)
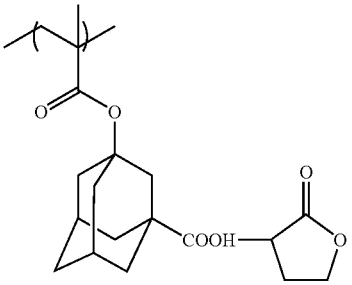
(B2-3-11)
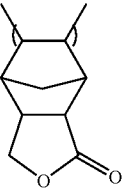

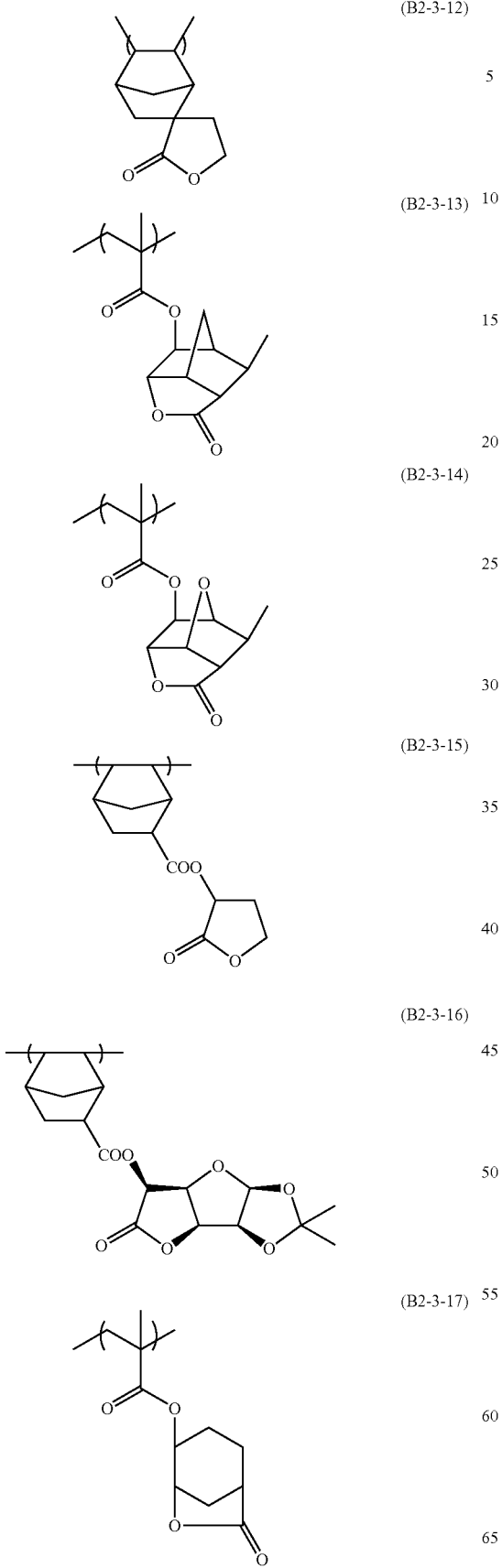
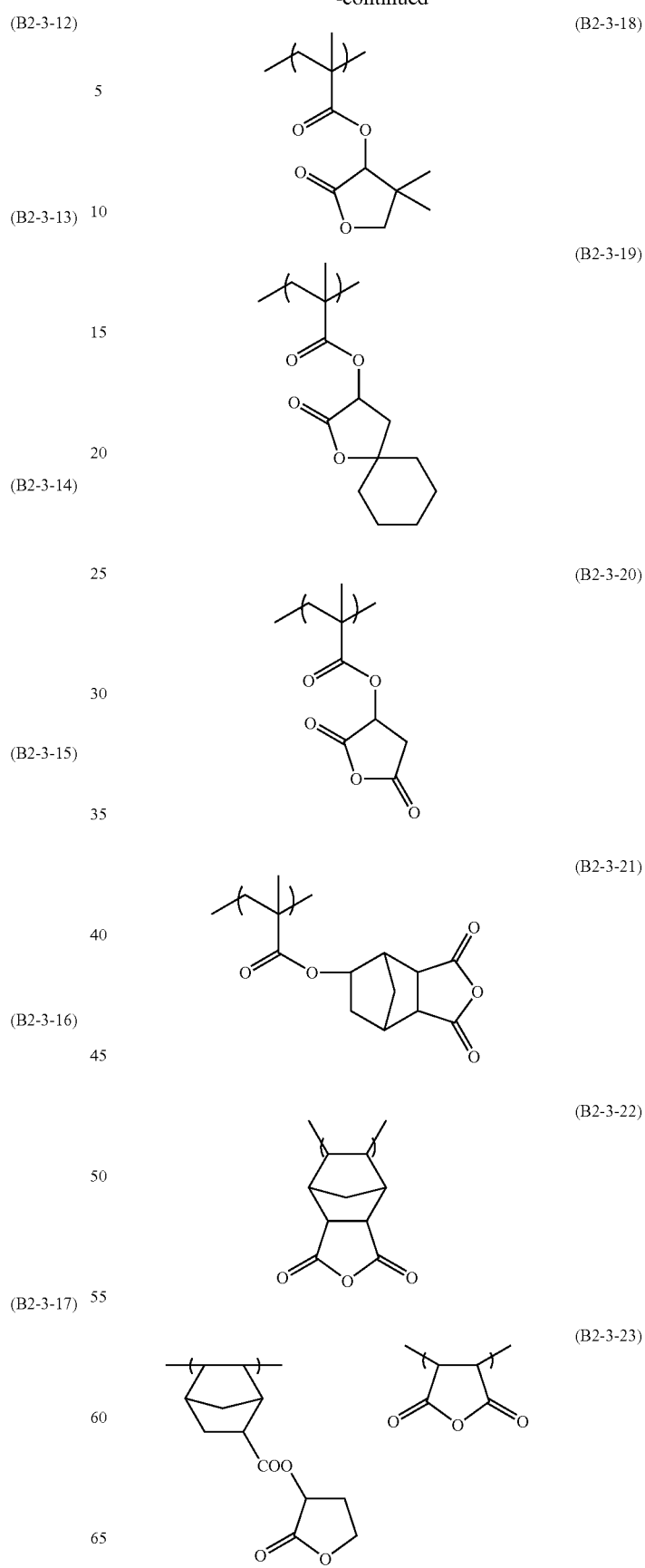

(B2-3-24)
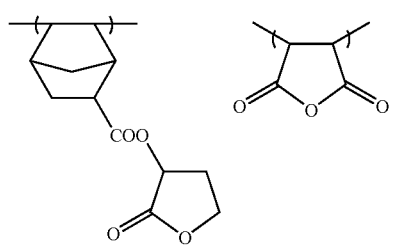
(B2-3-29)
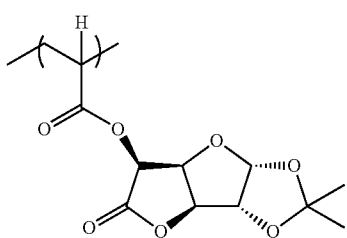
(B2-3-25)
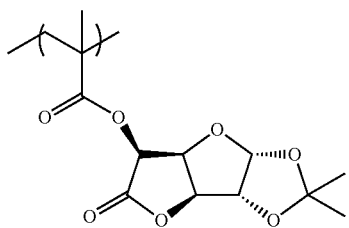
(B2-3-30)
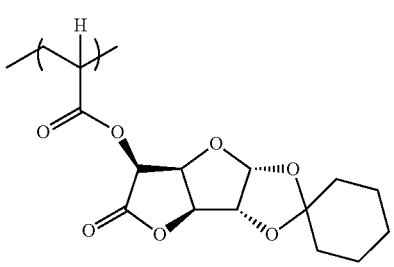
(B2-3-26)
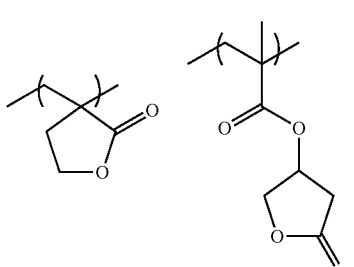
(B2-3-31)
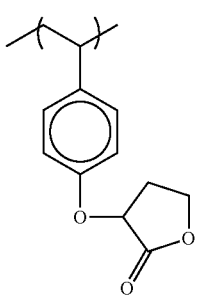
(B2-3-27)
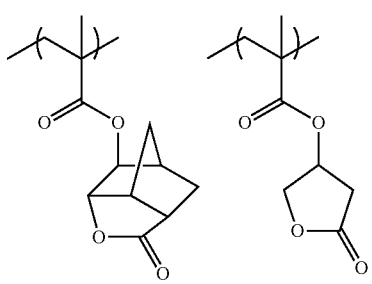
(B2-3-32)
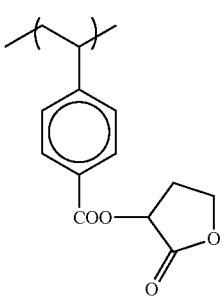
(B2-3-28)
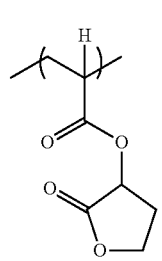
(B2-4-1)
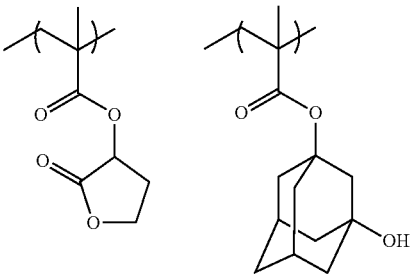
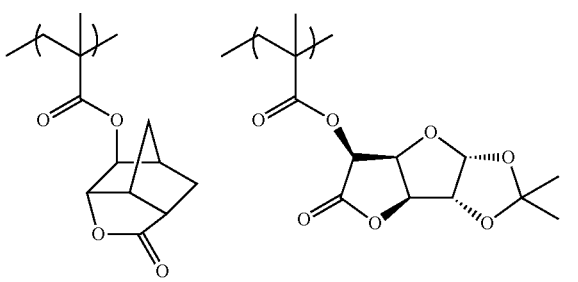

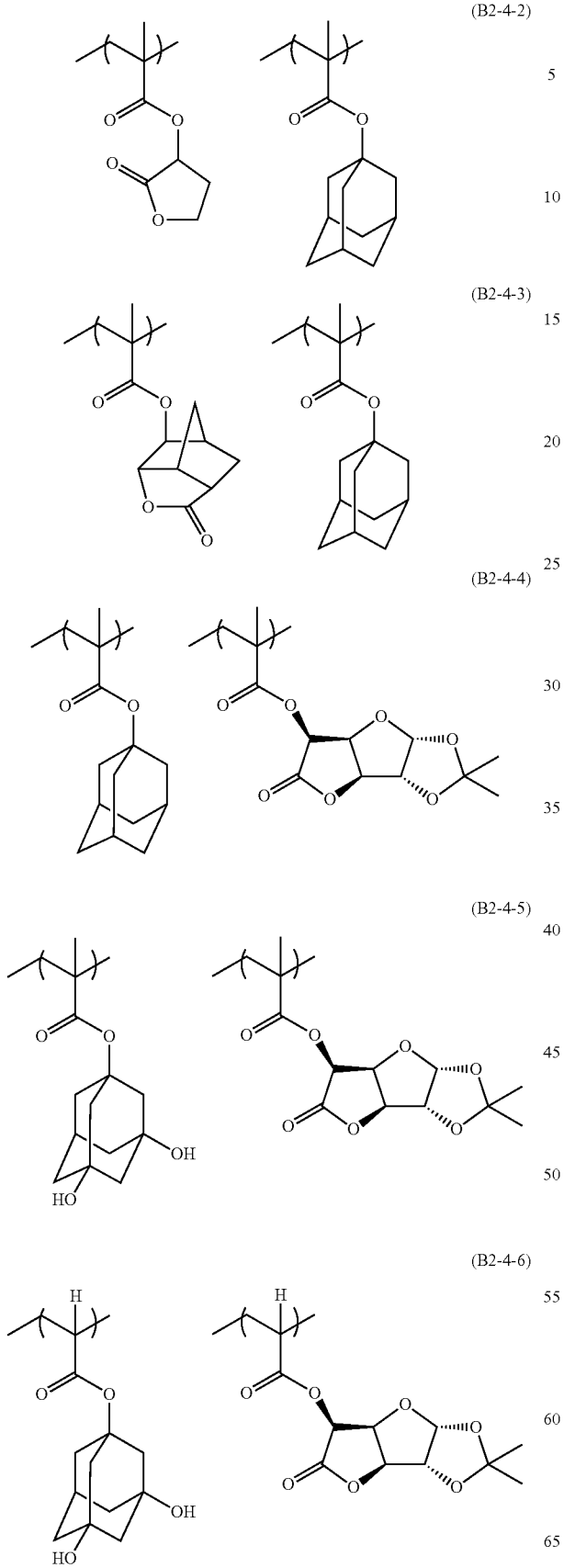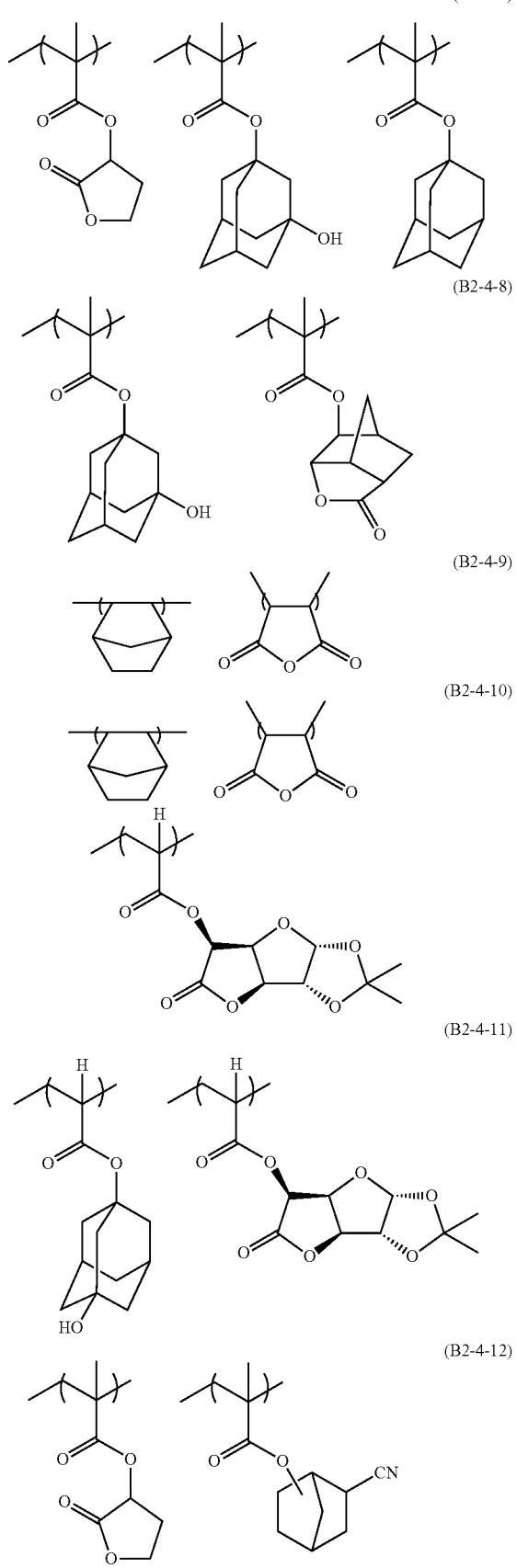

(B2-4-13)
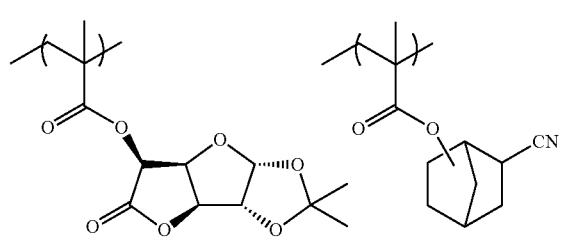
(B2-5-1)
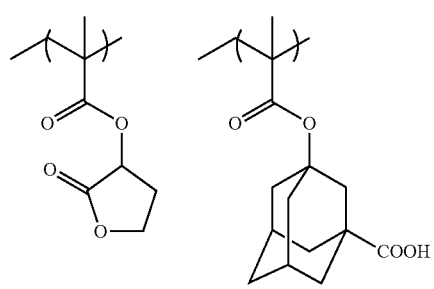
(B2-5-2)
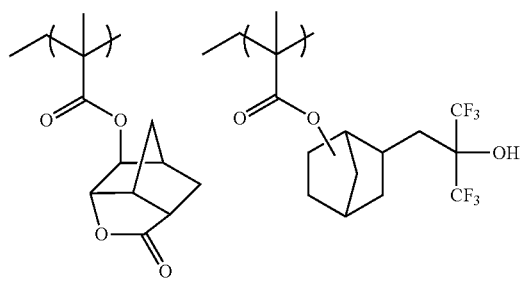
(B2-5-3)
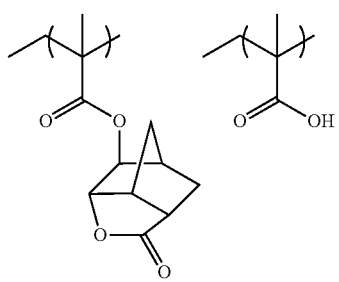
(B2-5-4)
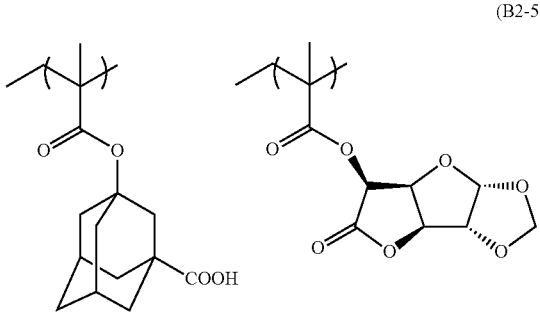
(B2-5-5)
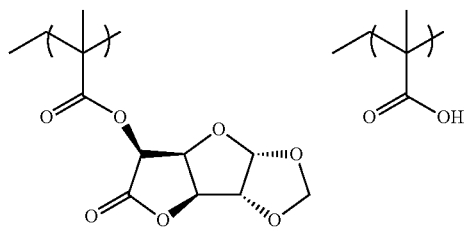
(B2-5-6)
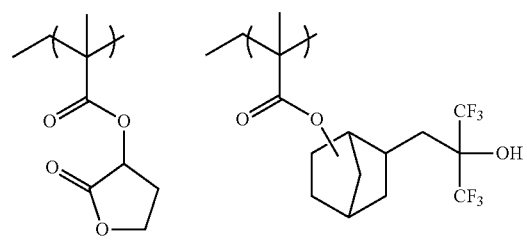
(B2-5-7)
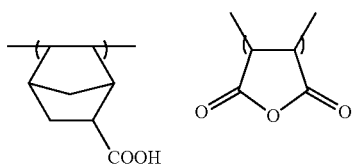
(B2-5-8)
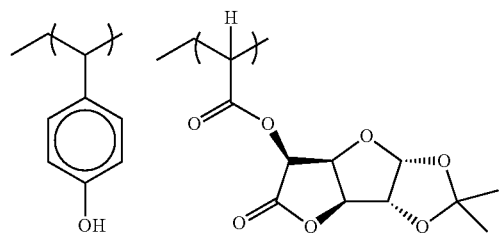
(B2-5-9)
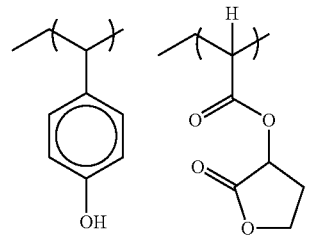
(B2-5-10)
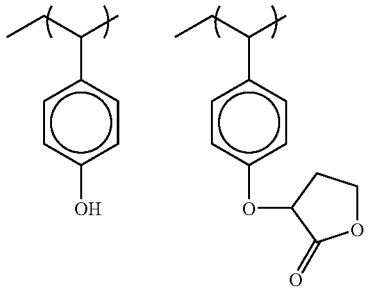

-continued

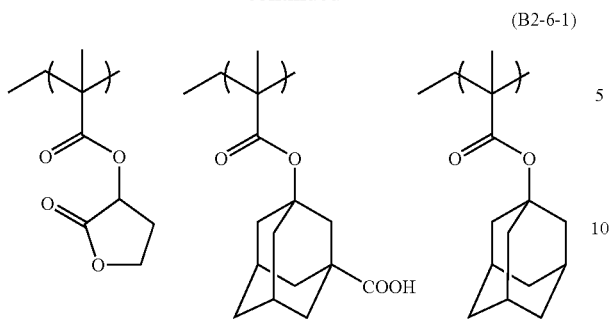

(B2-6-1)

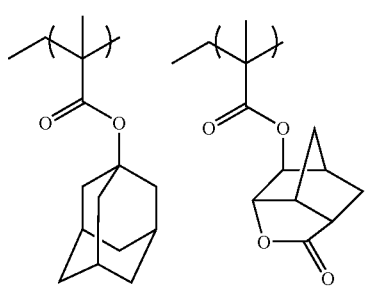

(B2-6-2)

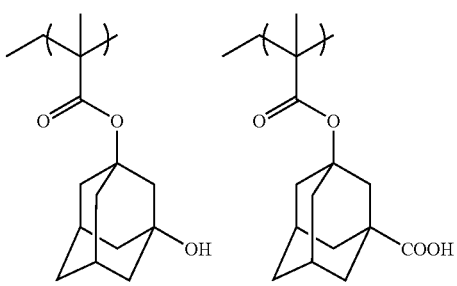

(B2-6-3)

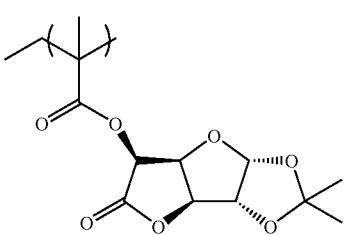

(B2-6-4)

-continued

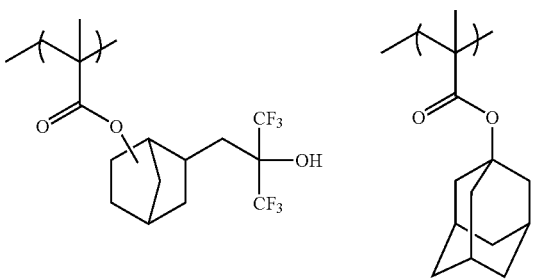

The weight average molecular weight of the resin as the component (B2) is preferably from 1,000 to 100,000, more preferably from 2,000 to 50,000, still more preferably from 3,000 to 20,000. The dispersity of the resin as the component (B2) is preferably from 1.0 to 3.0, more preferably from 1.1 to 2.2, still more preferably from 1.2 to 2.0.

The amount added of the resin as the component (B2) is usually from 0.1 to 50 mass %, preferably from 1 to 30 mass %, more preferably from 1 to 20 mass %, based on the resin as the component (B1).

[4] (C) Dissolution Inhibiting Compound Capable of Decomposing Under the Action of an Acid to Increase the Solubility in an Alkali Developer and Having a Molecular Weight of 3,000 or Less (Hereinafter Sometimes Referred to as a "Component (C)" or "Dissolution Inhibiting Compound")

The positive photosensitive composition of the present invention may comprise a dissolution inhibiting compound.

In order to prevent reduction in the transparency to light at 220 nm or less, the dissolution inhibiting compound is preferably an alicyclic or aliphatic compound having an acid-decomposable group, such as an acid-decomposable group-containing cholic acid derivative described in Proceeding of SPIE, 2724, 355 (1996). Examples of the acid-decomposable group and alicyclic structure are the same as those described above for the alicyclic hydrocarbon-based acid-decomposable resin.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 mass %, more preferably from 5 to 40 mass %, based on the solid content of the positive photosensitive composition.

Specific examples of the dissolution inhibiting compound are set forth below, but the present invention is not limited thereto.

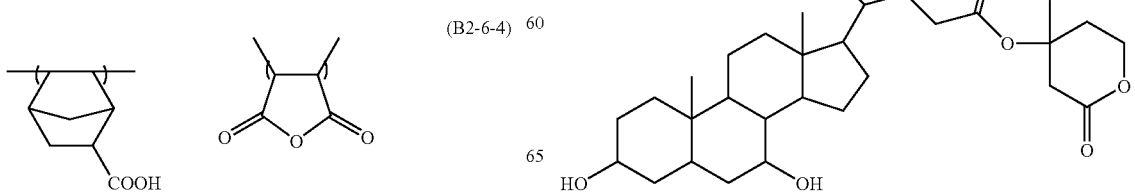

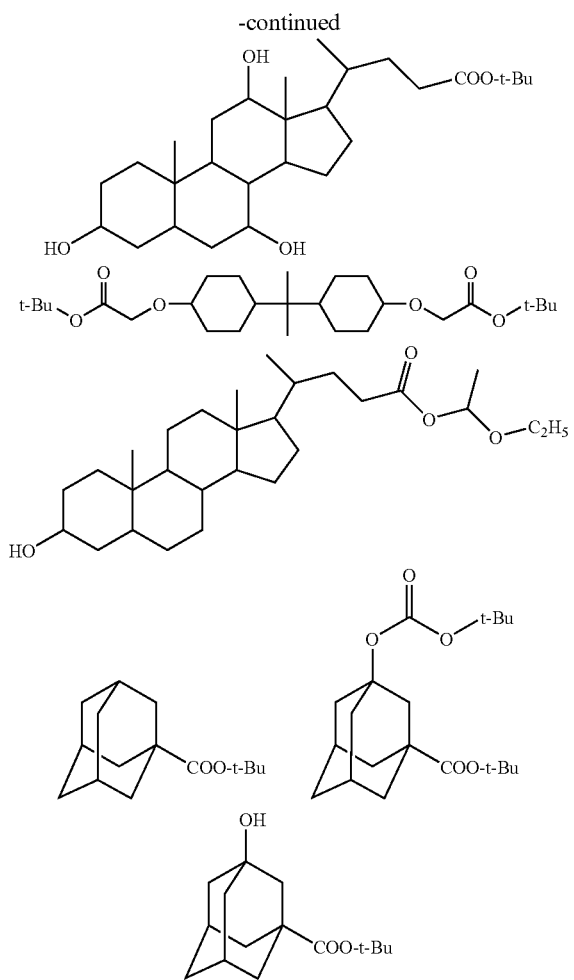

[5] (D) Basic Compound

The positive photosensitive composition of the present invention preferably contains (D) a basic compound for reducing the change of performance in aging from exposure to heating or for controlling the diffusion of the acid generated upon exposure.

Examples of the basic compound include a nitrogen-containing basic compound and an onium salt compound.

Preferred examples of the nitrogen-containing basic compound structure include a compound having a partial structure represented by any one of the following formulae (A) to (E).

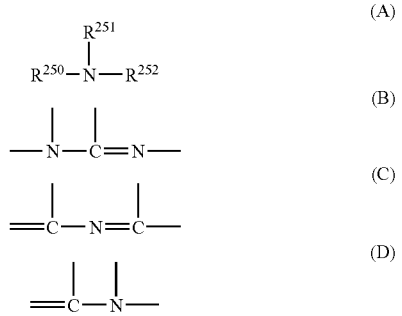

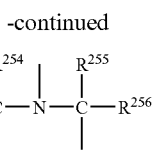

In formulae (A) to (E), $R^{250}$, $R^{251}$ and $R^{252}$ each independently represents a hydrogen atom, an alkyl group having a carbon number of 1 to 20, a cycloalkyl group having a carbon number of 3 to 20, or an aryl group having a carbon number of 6 to 20, and $R^{250}$ and $R^{251}$ may combine with each other to form a ring. These groups each may have a substituent. The alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

These groups each may contain an oxygen atom, a sulfur atom or a nitrogen atom in the alkyl chain.

$R^{253}$, $R^{254}$, $R^{255}$ and $R^{256}$ each independently represents an alkyl group having a carbon number of 1 to 6 or a cycloalkyl group having a carbon number of 3 to 6.

Preferred examples of the compound include guanidine, aminopyrrolidine, pyrazole, pyrazoline, piperazine, aminomorpholine, aminoalkylmorpholine and piperidine, and these compounds each may have a substituent. Among these compounds, more preferred are a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is converted into a carboxylate, and examples thereof include acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

One of these basic compounds may be used alone, or two or more thereof may be used in combination. The amount of the basic compound used is usually from 0.001 to 10 mass %, preferably from 0.01 to 5 mass %, based on the solid content of the positive photosensitive composition. The amount used is preferably 0.001 mass % or more for obtaining a sufficiently high addition effect and preferably 10 mass % or less in view of sensitivity and developability of the unexposed area.

[6] (E) Fluorine and/or Silicon-containing Surfactant

The positive photosensitive composition of the present invention preferably further contains any one fluorine- and/or silicon-containing surfactant (a fluorine-containing surfactant, a silicon-containing surfactant or a surfactant containing both a fluorine atom and a silicon atom), or two or more thereof.

When the positive photosensitive composition of the present invention contains a fluorine- and/or silicon-containing surfactant, a resist pattern with good sensitivity, resolution and adhesion and less development defect can be obtained at the time of using an exposure light source of 250 nm or less, particularly 220 nm or less.

Examples of the fluorine- and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants may also be used without modification.

Examples of the commercially available surfactant which can be used include a fluorine-containing surfactant and a silicon-containing surfactant, such as EFtop EF301 and EF303 (produced by Shin-Akita Kasei K.K.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical). In addition, polysiloxane polymer KP-341 (produced by Shin-Etsu Chemical Co., Ltd.) may also be used as the silicon-containing surfactant.

Other than these known surfactants, a surfactant using a polymer having a fluoro-aliphatic group, which is derived from a fluoro-aliphatic compound produced by the telomerization process (also called telomer process) or oligomerization process (also called oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with (poly(oxyalkylene)) acrylate and/or (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. A unit having alkylenes differing in the chain length within the same chain, such as block-linked poly(oxyethylene, oxypropylene and oxyethylene) and block-linked poly(oxyethylene and oxypropylene), may also be used. Furthermore, the copolymer of a fluoro-aliphatic group-containing monomer and a (poly(oxyalkylene)) acrylate (or methacrylate) may be not only a binary copolymer but also a ternary or greater copolymer obtained by simultaneously copolymerizing two or more different fluoro-aliphatic group-containing monomers or two or more different (poly(oxyalkylene)) acrylates (or methacrylates).

Examples thereof include commercially available surfactants such as Megafac F178, F-470, F-473, F-475, F-476 and F-472 (produced by Dainippon Ink & Chemicals, Inc.). Other examples include a copolymer of an acrylate (or methacrylate) having a $C_6F_{13}$ group with a (poly(oxyalkylene)) acrylate (or methacrylate), a copolymer of an acrylate (or methacrylate) having a $C_6F_{13}$ group with a (poly(oxyethylene)) acrylate (or methacrylate) and a (poly(oxypropylene)) acrylate (or methacrylate), a copolymer of an acrylate (or methacrylate) having a $C_8F_{17}$ group with a (poly(oxyalkylene)) acrylate (or methacrylate), and a copolymer of an acrylate (or methacrylate) having a $C_8F_{17}$ group with a (poly(oxyethylene)) acrylate (or methacrylate) and a (poly(oxypropylene)) acrylate (or methacrylate).

The amount of the fluorine- and/or silicon-containing surfactant used is preferably from 0.0001 to 2 mass %, more preferably from 0.001 to 1 mass %, based on the entire amount of the positive photosensitive composition (excluding the solvent).

[7] (F) Organic Solvent

The positive photosensitive composition of the present invention is used by dissolving the above-described components in a predetermined organic solvent.

Examples of the organic solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

In the present invention, these organic solvents may be used individually or as a mixture, but a mixed solvent containing two or more kinds of solvents differing in the functional group contained therein is preferably used. By the use of this solvent, the solubility of raw materials is enhanced, as a result, not only the generation of particles in aging can be suppressed but also a good pattern profile can be obtained. Preferred examples of the functional group contained in the solvent include an ester group, a lactone group, a hydroxyl group, a ketone group and a carbonate group. As for the mixed solvent having different functional groups, the following mixed solvents (S1) to (S5) are preferred.

(S1) A mixed solvent obtained by mixing a hydroxyl group-containing solvent and a hydroxyl group-free solvent.

(S2) A mixed solvent obtained by mixing a solvent having an ester structure and a solvent having a ketone structure.

(S3) A mixed solvent obtained by mixing a solvent having an ester structure and a solvent having lactone structure.

(S4) A mixed solvent obtained by mixing a solvent having an ester structure, a solvent having a lactone structure, and a hydroxyl group-containing solvent.

(S5) A mixed solvent obtained by mixing a solvent having an ester structure, a solvent having a carbonate structure, and a hydroxyl group-containing solvent.

By virtue of such a mixed solvent, the generation of particles during storage of the resist solution can be reduced and also, the generation of a defect at the coating can be suppressed.

Examples of the hydroxyl group-containing solvent include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the hydroxyl group-free solvent include propylene glycol monomethyl ether acetate, ethyl ethoxy propionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxy propionate, 2-heptanone;

γ-butyrolactone, cyclohexanone and butyl acetate are preferred, and propylene glycol monomethyl ether acetate, ethyl ethoxy propionate, 2-heptanone and cyclohexanone are more preferred.

Examples of the solvent having a ketone structure include cyclohexanone and 2-heptanone, with cyclohexanone being preferred.

Examples of the solvent having an ester structure include propylene glycol monomethyl ether acetate, ethyl ethoxy propionate and butyl acetate, with propylene glycol monomethyl ether acetate being preferred.

Examples of the solvent having a lactone structure include γ-butyrolactone.

Examples of the solvent having a carbonate structure include propylene carbonate and ethylene carbonate, with propylene carbonate being preferred.

The mixing ratio (by mass) of the hydroxyl group-containing solvent and the hydroxyl group-free solvent is from 1/99 to 99/1, preferably from 10/90 to 90/10, more preferably from 20/80 to 60/40. A mixed solvent comprising 50 mass % or more of the hydroxyl group-free solvent is particularly preferred in view of coating uniformity.

The mixing ratio (by mass) of the solvent having an ester structure and the solvent having a ketone structure is from 1/99 to 99/1, preferably from 10/90 to 90/10, more preferably from 40/60 to 80/20. A mixed solvent comprising 50 mass % or more of the solvent having an ester structure is particularly preferred in view of coating uniformity.

The mixing ratio (by mass) of the solvent having an ester structure and the solvent having a lactone structure is from 70/30 to 99/1, preferably from 80/20 to 99/1, more preferably from 90/10 to 99/1. A mixed solvent comprising 70 mass % or more of the solvent having an ester structure is particularly preferred in view of aging stability.

In the case of mixing a solvent having an ester structure, a solvent having a lactone structure, and a hydroxyl group-containing solvent, the mixed solvent preferably comprises from 30 to 80 mass % of a solvent having an ester structure, from 1 to 20 mass % of a solvent having a lactone structure, and from 10 to 60 mass % of a hydroxyl group-containing solvent.

In the case of mixing a solvent having an ester structure, a solvent having a carbonate structure, and a hydroxyl group-containing solvent, the mixed solvent preferably comprises from 30 to 80 mass % of a solvent having an ester structure, from 1 to 20 mass % of a solvent having a carbonate structure, and from 10 to 60 mass % of a hydroxyl group-containing solvent.

<Other Additives>

If desired, the positive photosensitive composition of the present invention may further contain a dye, a plasticizer, a surfactant other than the component (E), a photosensitizer, a compound capable of accelerating the solubility in a developer, and the like.

The compound capable of accelerating the dissolution in a developer, which can be used in the present invention, is a low molecular compound containing two or more phenolic OH groups or one or more carboxy group and having a molecular weight of 1,000 or less. In the case of containing a carboxyl group, an alicyclic or aliphatic compound is preferred.

The amount of the dissolution accelerating compound added is preferably from 2 to 50 mass %, more preferably from 5 to 30 mass %, based on the resin of the component (B1). The amount added is preferably 50 mass % or less from the standpoint of suppressing the development residue or preventing the deformation of pattern at the development.

The phenol compound having a molecular weight of 1,000 or less can be easily synthesized by one skilled in the art with reference to the method described, for example, in JP-A-4-122938, JP-A-2-28531, U.S. Pat. No. 4,916,210 and European Patent 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic and, a cyclohexanecarboxylic acid and a cyclohexanedicarboxylic acid.

In the present invention, a surfactant other than the fluorine- and/or silicon-containing surfactant (E) can also be added. Specific examples thereof include a nonionic surfactant such as polyoxyethylene alkyl ethers, polyoxyethylene alkylallyl ethers, polyoxyethylene•polyoxypropylene block copolymers, sorbitan fatty acid esters and polyoxyethylene sorbitan fatty acid esters.

One of such surfactants may be used alone or some of these may be used in combination.

(Pattern Forming Method)

The positive photosensitive composition of the present invention is used by dissolving the above-described components in a predetermined organic solvent, preferably a mixed solvent described above, filtering the resulting solution through a filter, and coating the obtained solution on a predetermined support as follows. The filter for use in the filtering is preferably a filter made of polytetrafluoroethylene, polyethylene or nylon and having a pore size of 0.1 micron or less, more preferably 0.05 microns or less, still more preferably 0.03 microns or less.

For example, the positive photosensitive composition is coated on a substrate (e.g., silicon/silicon dioxide-coated substrate) as used in the production of a precision integrated circuit device, by an appropriate coating method such as spinner or coater, and dried to form a photosensitive film.

This photosensitive film is irradiated with actinic rays or radiation through a predetermined mask and preferably after baking (heating), subjected to development and rinsing, whereby a good pattern can be obtained.

At the irradiation with actinic rays or radiation, the exposure may also be performed by filling a liquid (immersion medium) having a refractive index higher than that of air between the photosensitive film and the lens (immersion exposure). By this exposure, resolution can be elevated. The immersion medium may be any liquid as long as it has a refractive index higher than that of air, but pure water is preferably used. Also, an overcoat layer may be further provided on the photosensitive film so as to prevent the immersion medium from coming into direct contact with the photosensitive film at the immersion exposure. By virtue of this overcoat layer, dissolving out of the composition from the photosensitive film into the immersion medium can be suppressed and the development defect can be reduced.

Examples of the actinic ray or radiation include infrared light, visible light, ultraviolet light, far ultraviolet light, X-ray and electron beam. Among these, preferred is far ultraviolet light at a wavelength of 250 nm or less, more preferably 220 nm or less. Specifically, a KrF excimer laser (248 nm), an ArF excimer laser (193 nm), an $F_2$ excimer laser (157 nm), an X-ray, an electron beam and the like are used, and an ArF excimer laser, an $F_2$ excimer laser, EUV (13 nm) and an electron beam are preferred.

In the development step, an alkali developer is used as follows. The alkali developer usable for the resist composition is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, a quaternary ammonium salt such as tetramethylammonium hydroxide and tetraethylammonium hydroxide, or cyclic amines such as pyrrole and piperidine.

In the alkali developer, alcohols and a surfactant may also be added in an appropriate amount.

The alkali concentration of the alkali developer is usually from 0.1 to 20 mass %.

The pH of the alkali developer is usually from 10.0 to 15.0.

EXAMPLES

The present invention is described in greater detail below by referring to Examples, but the present invention should not be construed as being limited thereto.

<Synthesis of Resin as Component (B1)>

Synthesis Example 1

(Synthesis of Resin (RA-1)):

α-Butyrolactone methacrylate (6.8 g), 4.7 g of 3-hydroxyadamantane-1-methacrylate, 9.4 g of 2-methyl-2-adamantyl methacrylate and 1.15 g of a polymerization initiator V-601 (produced by Wako Pure Chemical Industries, Ltd.) were dissolved in 45 g of propylene glycol monomethyl ether acetate and 30 g of propylene glycol monomethyl ether. The resulting solution was added to 5.0 g of propylene glycol monomethyl ether acetate and 3.3 g of propylene glycol monomethyl ether heated at 80° C., over 6 hours in a nitrogen stream and further reacted for 2 hours. This reaction solution was allowed to cool and then added dropwise to a mixed solution of 100 ml of ethyl acetate/900 ml of hexane over 30 minutes, and the precipitated powder was collected by filtration. The obtained powder was washed with hexane and dried to obtain 17 g of Resin (RA-1).

Other resins as the component (B1) were synthesized in the same manner.

<Synthesis of Resin as Component (B2)>

Synthesis Example 1

Synthesis of Resin (B2-1-1)

1-Methacryloyloxyadamantane-3-carboxylic acid (26.4 g) and 2.3 g of a polymerization initiator V-601 (produced by Wako Pure Chemical Industries, Ltd.) were dissolved in 95 g of cyclohexanone, and the resulting solution was added to 10.6 g of cyclohexanone heated at 80° C., over 6 hours in a nitrogen stream and further reacted for 2 hours. This reaction solution was allowed to cool and then added dropwise a mixed solution of 100 ml of ethyl acetate/900 ml of hexane over 30 minutes, and the precipitated powder was collected by filtration. The obtained powder was washed with hexane and dried to obtain 16.3 g of Resin (B2-1-1).

Other resins as the component (B2) were synthesized in the same manner.

The structure, weight average molecular weight and dispersity of each of the resins as the component (B1) are shown below. Incidentally, the numeral on the right side of the repeating unit denotes a molar ratio (hereinafter the same).

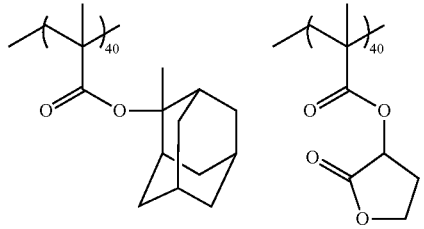

(RA-1)

Mw = 10700
Mw/Mn = 1.81

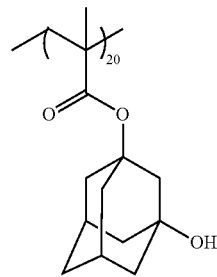

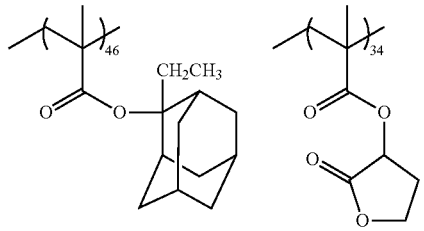

(RA-2)

Mw = 8900
Mw/Mn = 1.81

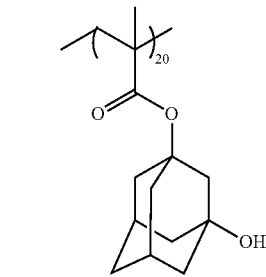

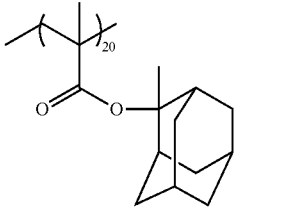

(RA-3)

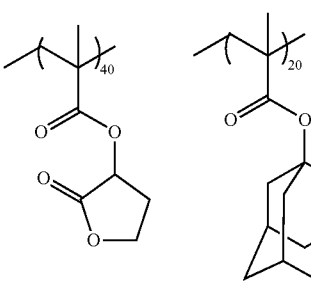

Mw = 13700
Mw/Mn = 1.89

(RA-4)
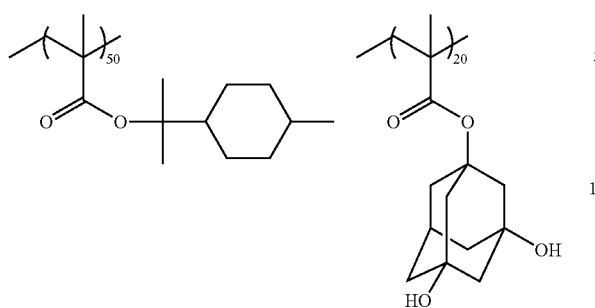
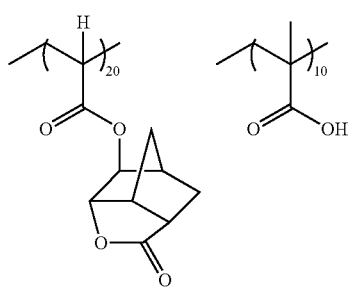
Mw = 9900
Mw/Mn = 1.83
(RA-5)
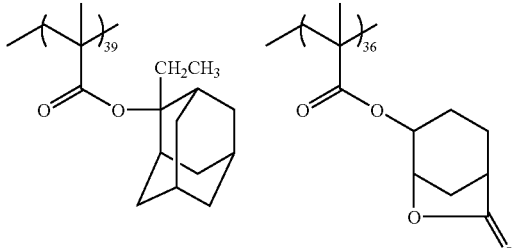
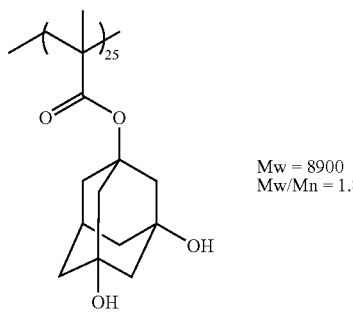
Mw = 8900
Mw/Mn = 1.80
(RA-6)
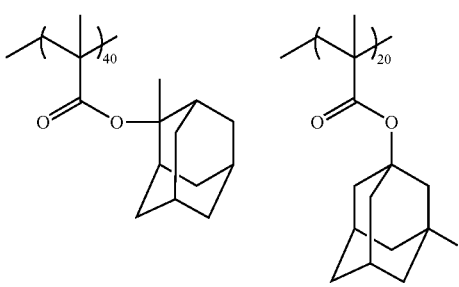
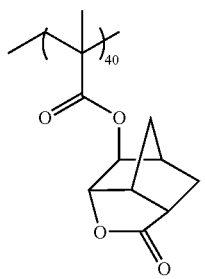
Mw = 7900
Mw/Mn = 1.60
(RA-7)
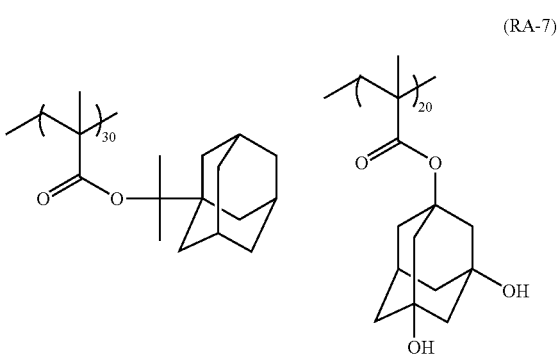
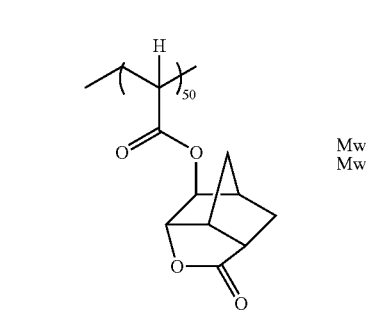
Mw = 8300
Mw/Mn = 1.81
(RA-8)
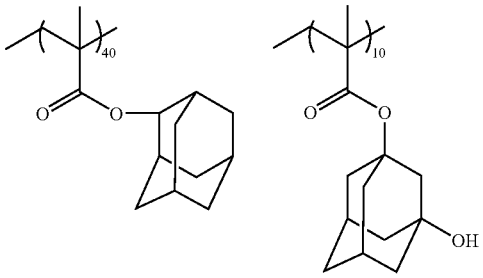
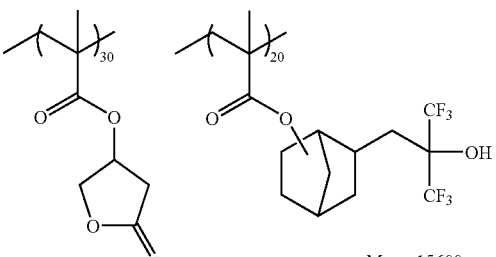
Mw = 15600
Mw/Mn = 2.03

(RA-9)
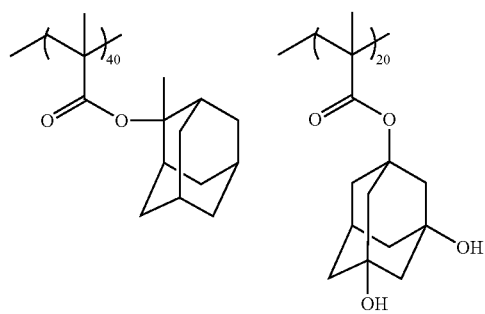
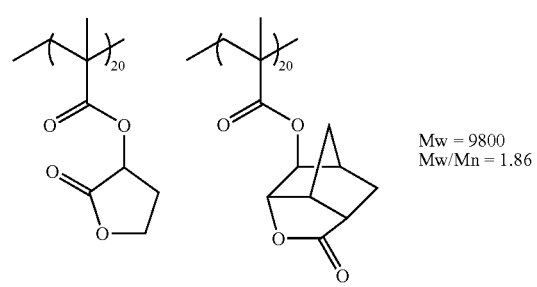
Mw = 9800
Mw/Mn = 1.86
(RA-10)
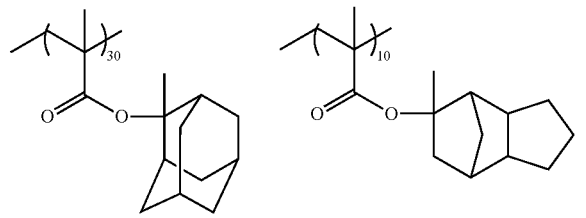
Mw = 18300
Mw/Mn = 2.10
(RA-11)
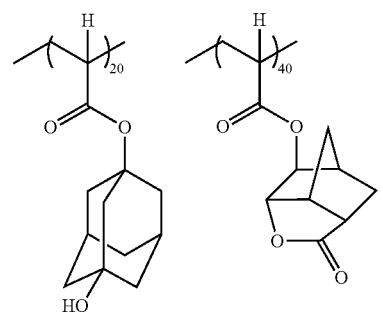
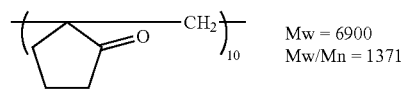
Mw = 6900
Mw/Mn = 1371
(RA-12)
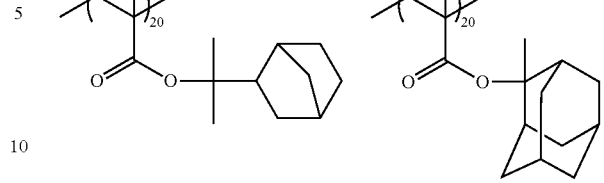
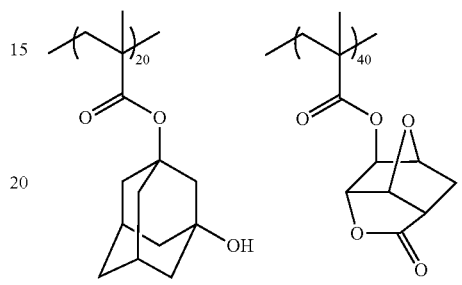
Mw = 8300
Mw/Mn = 1.81
(RA-13)
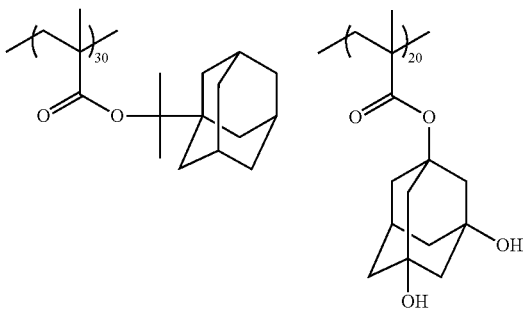
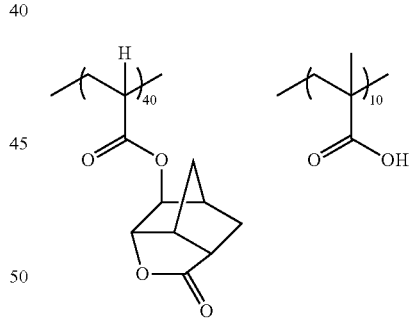
Mw = 7600
Mw/Mn = 1.76
(A-14)
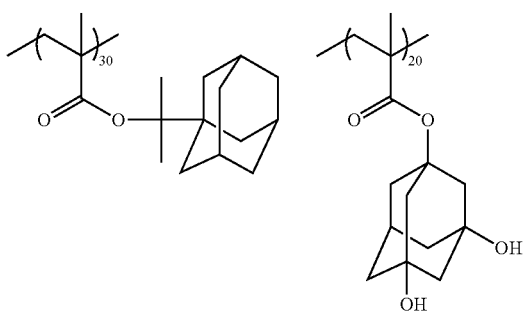

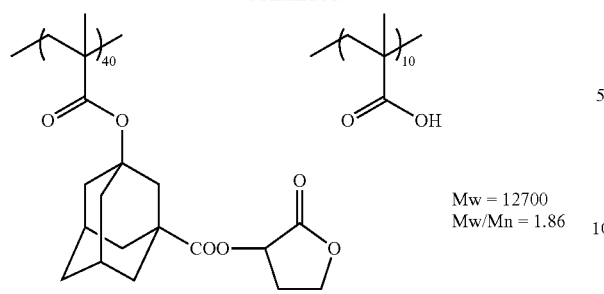
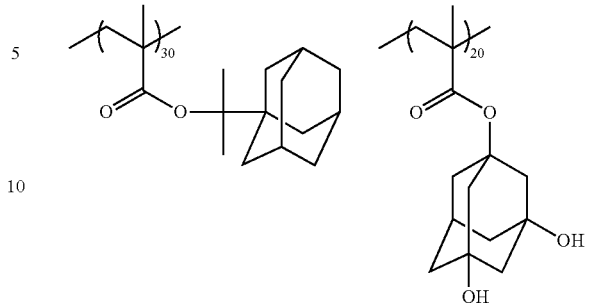
(RA-15)
Mw = 12700
Mw/Mn = 1.86
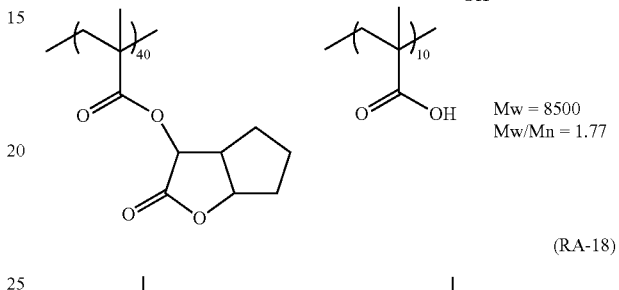
(RA-17)
Mw = 8500
Mw/Mn = 1.77
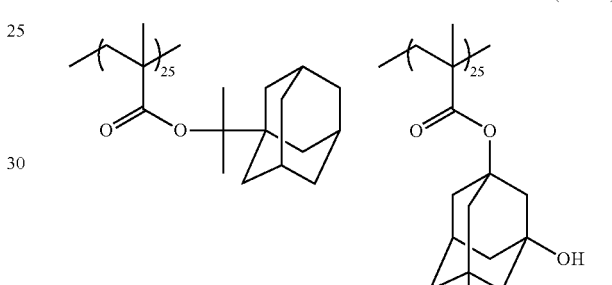
(RA-16)
Mw = 8200
Mw/Mn = 1.75
(RA-18)
Mw = 8500
Mw/Mn = 1.77
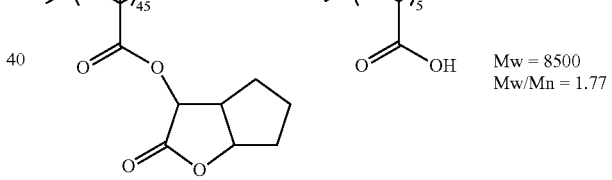
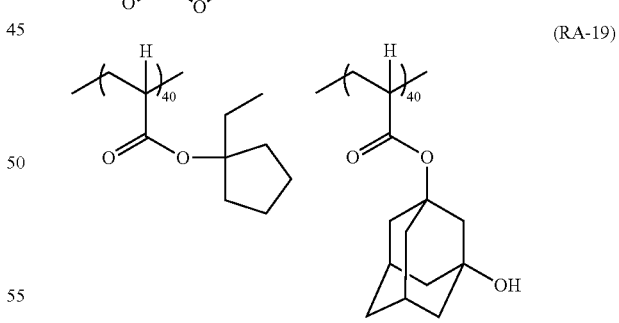
(RA-19)
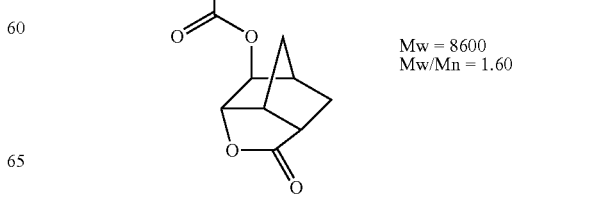
Mw = 8900
Mw/Mn = 1.64
Mw = 8600
Mw/Mn = 1.60

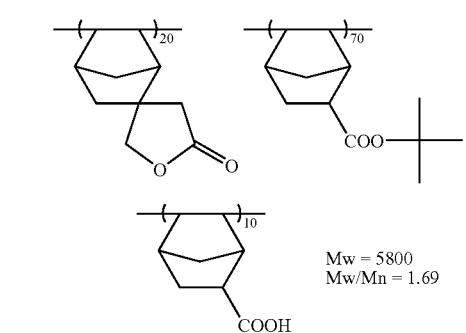
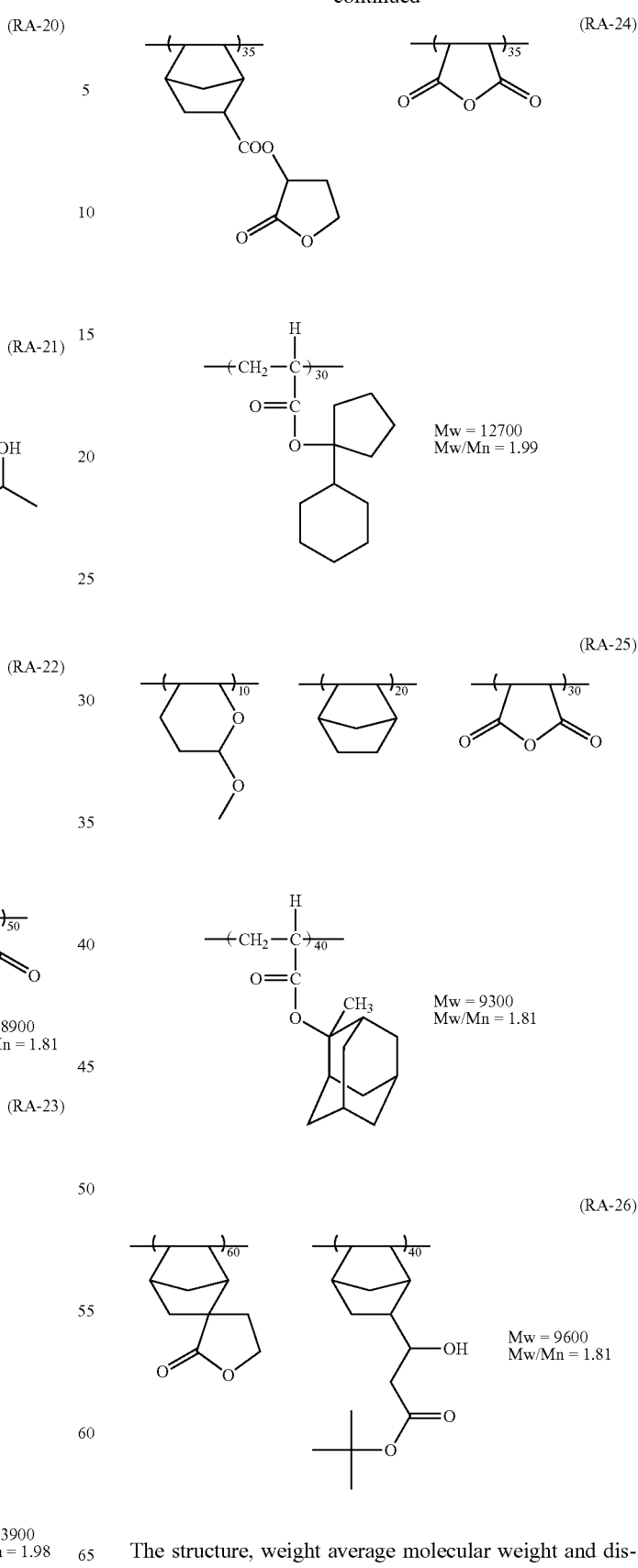
The structure, weight average molecular weight and dispersity of each of the resins as the component (B2) are shown below.

(B2-1-1)
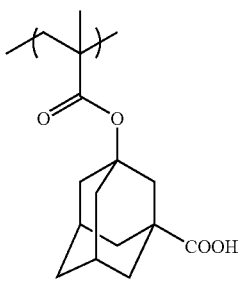
Mw = 8900
Mw/Mn = 1.80
(B2-3-7)
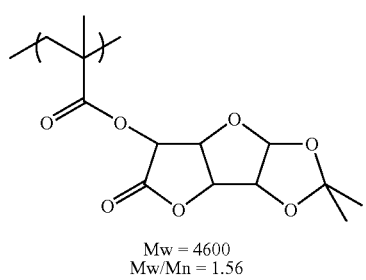
Mw = 4600
Mw/Mn = 1.56
(B2-3-29)
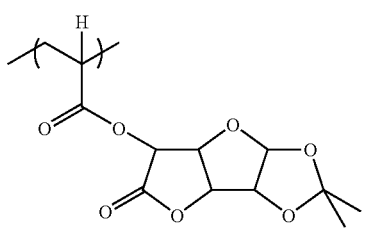
Mw = 9000
Mw/Mn = 1.78
(B2-3-5)
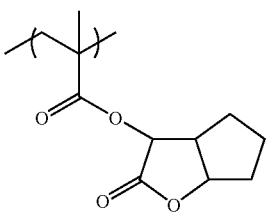
Mw = 6800
Mw/Mn = 1.81
(B2-2-1)
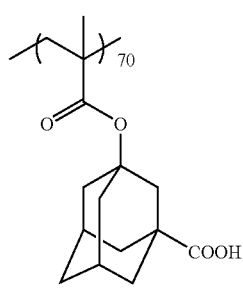
Mw = 11000
Mw/Mn = 1.95
(B2-1-3)
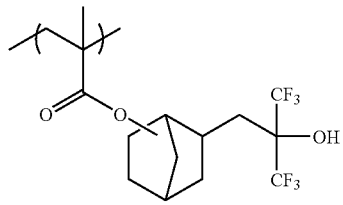
Mw = 9300
Mw/Mn = 1.89
(B2-5-2)
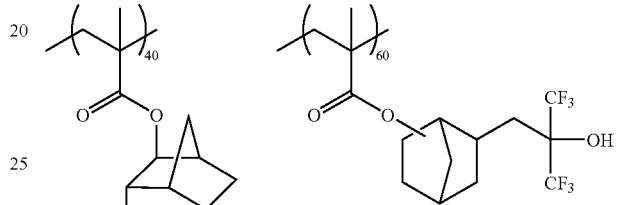
Mw = 9300
Mw/Mn = 1.89
(B2-5-5)
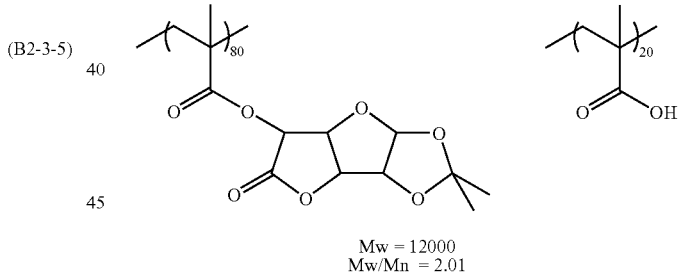
Mw = 12000
Mw/Mn = 2.01
(B2-4-7)
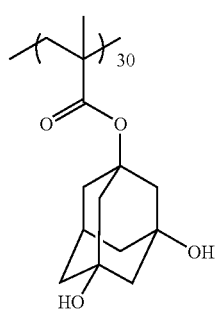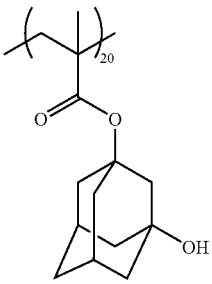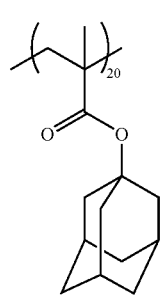
Mw = 4500
Mw/Mn = 1.55

-continued

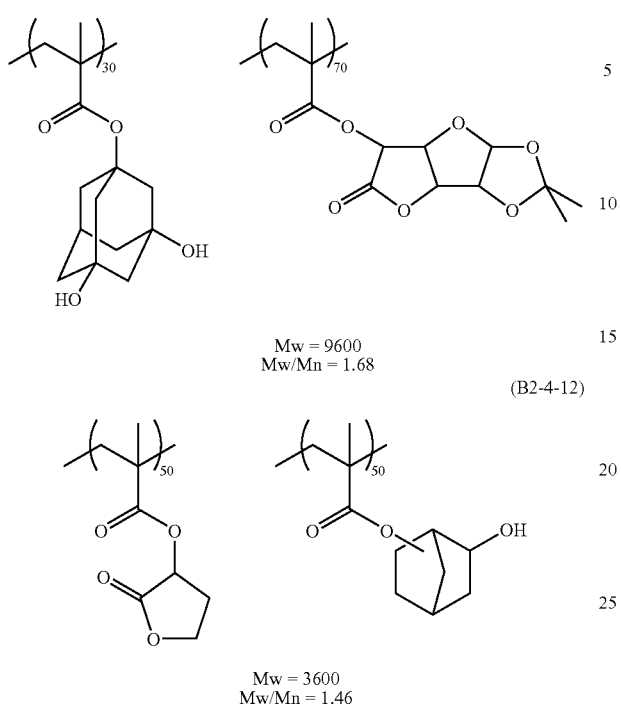

(B2-4-5)

Mw = 9600
Mw/Mn = 1.68

(B2-4-12)

Mw = 3600
Mw/Mn = 1.46

(B2-4-8)

Mw = 4000
Mw/Mn = 1.60

-continued

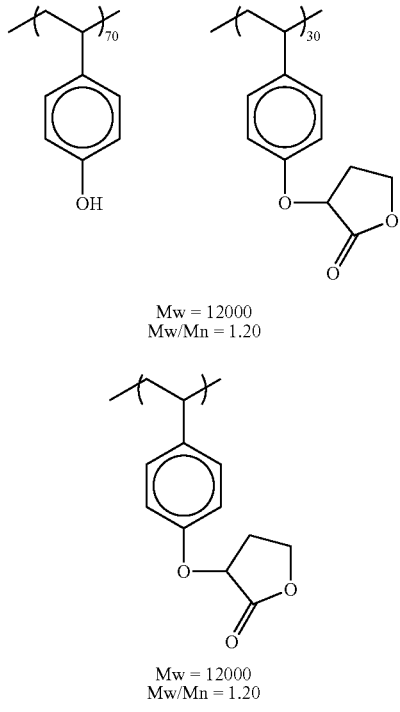

(B2-5-10)

Mw = 12000
Mw/Mn = 1.20

(B2-3-31)

Mw = 12000
Mw/Mn = 1.20

Examples 1 to 26 and Comparative Example 1

<Preparation of Resist>

The components shown in Tables 1 and 2 below were dissolved in a solvent to prepare a solution having a solid content concentration of 9 mass %, and this solution was filtered through a 0.03-μm polyethylene filter to prepare a positive resist solution. The positive resist solution prepared was evaluated by the following methods. The results obtained are shown in Tables 1 and 2.

TABLE 1

| Example | Acid Generator (A) (g) | Resin (B1) (g) | Resin (B2) (g) | Basic Compound (g) | Surfactant (g) | Solvent (mass ratio) | Pattern Falling (nm) | Line Edge Roughness (nm) |
|---|---|---|---|---|---|---|---|---|
| Example 1 | z2 (0.3) | RA-1 (9) | B2-1-1 (1) | DIA (0.03) | W-4 (0.01) | S1/S5 = 60/40 | 60 | 5.1 |
| Example 2 | z2 (0.3) | RA-2 (9) | B2-5-2 (1) | TPA (0.05) | W-2 (0.02) | S3 = 100 | 60 | 4.6 |
| Example 3 | z63 (0.2) | RA-3 (9.50) | B2-5-10 (0.5) | HAP (0.02) | W-1 (0.01) | S1/S6 = 95/5 | 55 | 4.6 |
| Example 4 | z23 (0.3) | RA-4 (8) | B2-3-5 (2) | DIA (0.03) | W-4 (0.01) | S1/S5 = 60/40 | 55 | 4.5 |
| Example 5 | z15 (0.2) | RA-5 (9) | B2-3-29 (1) | PEA (0.02) | W-4 (0.01) | S1/S5 = 80/20 | 55 | 4.6 |
| Example 6 | z2 (0.2) z30 (0.2) | RA-6 (8) | B2-1-3 (2) | DIA (0.02) PEA (0.02) | W-4 (0.01) | S1/S4/S6 = 80/5/15 | 60 | 5.3 |
| Example 7 | z16 (0.3) | RA-7 (9) | B2-3-29 (1) | TMEA (0.03) | W-3 (0.03) | S1/S5 = 60/40 | 55 | 4.2 |
| Example 8 | z55 (0.3) | RA-8 (8) | B2-4-7 (2) | TBAH (0.04) | W-1 (0.005) | S1/S6 = 80/20 | 55 | 4.6 |
| Example 9 | z51 (0.5) | RA-9 (9) | B2-3-29 (1) | HAP (0.03) | W-3 (0.02) | S1/S5 = 60/40 | 55 | 4.4 |
| Example 10 | z2 (0.3) | RA-10 (9) | B2-4-12 (1) | TPSA (0.05) | W-3 (0.01) | S1/S5 = 60/40 | 55 | 4.2 |
| Example 11 | z44 (0.2) | RA-11 (9) | B2-3-29 (1) | DCMA (0.03) | W-4 (0.01) | S1/S3 = 60/40 | 55 | 4.3 |
| Example 12 | z2 (0.3) | RA-12 (9) | B2-4-5 (1) | DIA (0.03) | W-4 (0.01) | S1/S5 = 60/40 | 55 | 4.7 |
| Example 13 | z23 (0.4) | RA-13 (9) | B2-3-29 (1) | PEA (0.01) | W-2 (0.02) | S1/S5 = 60/40 | 55 | 4.2 |
| Example 14 | z2 (0.5) | RA-14 (9) | B2-5-5 (1) | PEA (0.04) | W-4 (0.01) | S1/S3 = 60/40 | 55 | 4.5 |
| Example 15 | z23 (0.1) z46 (0.3) | RA-15 (9.5) | B2-4-7 (0.5) | DIA (0.02) PEA (0.02) | W-2 (0.02) | S1/S5 = 60/40 | 55 | 4.6 |
| Example 16 | z55 (0.2) z51 (0.2) | RA-16 (8) | B2-2-1 (2) | DIA (0.02) PEA (0.02) | W-2 (0.01) | S1/S3 = 60/40 | 60 | 5.2 |
| Example 17 | z23 (0.2) z55 (0.4) | RA-17 (9) | B2-3-29 (1) | DIA (0.02) PEA (0.02) | W-4 (0.01) | S1/S3 = 60/40 | 55 | 4.3 |

TABLE 1-continued

| Example | Acid Generator (A) (g) | Resin (B1) (g) | Resin (B2) (g) | Basic Compound (g) | Surfactant (g) | Solvent (mass ratio) | Pattern Falling (nm) | Line Edge Roughness (nm) |
|---|---|---|---|---|---|---|---|---|
| Example 18 | z62 (0.4) z65 (0.1) | RA-18 (8) | B2-4-5 (2) | DIA (0.02) PEA (0.02) | W-4 (0.01) | S1/S5/S7 = 59/40/1 | 55 | 4.6 |
| Example 19 | z59 (0.3) | RA-19 (9) | B2-1-3 (1) | DIA (0.02) PEA (0.02) | W-4 (0.01) | S1/S5/S7 = 59/40/1 | 60 | 5.2 |
| Example 20 | z2 (0.3) z65 (0.1) | RA-20 (9.5) | B2-4-8 (0.5) | TPA (0.02) PEA (0.02) | W-4 (0.01) | S1/S5/S7 = 59/40/1 | 55 | 4.7 |

TABLE 2

| Example | Acid Generator (A) (g) | Resin (B1) (g) | Resin (B2) (g) | Basic Compound (g) | Surfactant (g) | Solvent (mass ratio) | Pattern Falling (nm) | Line Edge Roughness (nm) |
|---|---|---|---|---|---|---|---|---|
| Example 21 | z23 (0.2) z58 (0.2) | RA-21 (9) | B2-3-5 (1) | DIA (0.02) TMEA (0.02) | W-4 (0.01) | S1/S5/S7 = 59/40/1 | 55 | 4.3 |
| Example 22 | z23 (0.3) | RA-22 (9) | B2-1-3 (1) | TPSA (0.02) PEA (0.02) | W-4 (0.01) | S1/S3 = 60/40 | 60 | 5.4 |
| Example 23 | z38 (0.4) | RA-23 (9) | B2-5-2 (1) | DIA (0.02) PEA (0.02) | W-4 (0.01) | S1/S3 = 60/40 | 55 | 4.6 |
| Example 24 | z23 (0.3) | RA-24 (9) | B2-1-1 (1) | DIA (0.01) PEA (0.01) | W-4 (0.01) | S1/S3 = 60/40 | 60 | 5.3 |
| Example 25 | z23 (0.3) | RA-25 (9) | B2-4-12 (1) | DIA (0.01) PEA (0.02) | W-4 (0.01) | S1/S3 = 60/40 | 55 | 4.7 |
| Example 26 | z23 (0.3) | RA-26 (9.5) | B2-4-8 (0.5) | DIA (0.02) PEA (0.01) | W-4 (0.01) | S1/S3 = 60/40 | 55 | 4.6 |
| Comparative Example 1 | z2 (0.3) | RA-1 (10) | none | DIA (0.03) | W-4 (0.01) | S1/S5 = 60/40 | 65 | 6.2 |

Abbreviations in the Tables stand for the following.
[Basic Compound]
TPI: 2,4,5-triphenylimidazole
TPSA: triphenylsulfonium acetate
DIA: 2,6-diisopropylaniline
DCMA: dicylcohexylmethylamine
TPA: tripentylamine
HAP: hydroxyantipyrine
TBAH: tetrabutylammonium hydroxide
TMEA: tris(methoxyethoxyethyl)amine
PEA: N-phenyldiethanolamine
[Surfactant]
W-1: Megafac F176 (produced by Dainippon Ink & Chemicals, Inc.) (fluorine-containing)
W-2: Megafac R08 (produced by Dainippon Ink & Chemicals, Inc.) (fluorine- and silicon-containing)
W-3: polysiloxane polymer KP-341 (produced by Shin-Etsu Chemical Co., Ltd.) (silicon-containing)
W-4: Troysol S-366 (produced by Troy Chemical)
[Solvent]
S1: propylene glycol methyl ether acetate
S2: 2-heptanone
S3: cylcohexanone
S4: γ-butyrolactone
S5: propylene glycol methyl ether
S6: ethyl lactate
S7: propylene carbonate
<Evaluation of Resist>

An antireflection film DUV-42 produced by Brewer Science Co., Ltd. was uniformly coated on a silicon substrate treated with hexamethyldisilazane by a spin coater to a thickness of 600 Å, dried on a hot plate at 100° C. for 90 seconds and then dried under heating at 190° C. for 240 seconds. Thereafter, each positive resist solution was coated by a spin coater and dried at 110° C. for 90 seconds to form a resist film of 180 nm. This resist film was exposed through a mask by an ArF excimer laser stepper (manufactured by ASML, NA=0.75, 2/3 annular illumination) and immediately after the exposure, heated on a hot plate at 120° C. for 90 seconds. Furthermore, the resulting resist film was developed with an aqueous 2.38 mass % tetramethylammonium hydroxide solution at 23° C. for 60 seconds, rinsed with pure water for 30 seconds and then dried to obtain a line pattern.

Evaluation Method of Pattern Falling:

Assuming that the exposure amount necessary for reproducing a line-and-space (1/1) mask pattern of 80 nm is the optimum exposure amount, the line width of a line pattern formed was reduced by further increasing the exposure amount from the optimum exposure amount, and the line width at which the pattern was resolved without falling was evaluated. A smaller value indicates that a finer pattern is resolved without falling, that is, pattern falling is less generated and the resolving power is higher.

Evaluation Method of Line Edge Roughness:

A line-and-space (1:1) pattern of 80 nm was observed by using a length-measuring scanning electron microscope (SEM) and with respect to the longitudinal edge in the range of 5 μm of the line pattern, the distance from the reference line where the edge should be present was measured at 50 points by using a length-measuring SEM (S-8840, manufactured by Hitachi, Ltd.). From the values obtained, the standard deviation was determined and the 3σ was calculated. A smaller value indicates higher performance.

As apparent from Tables 1 and 2, the positive photosensitive composition of the present invention is excellent in terms of pattern falling and line edge roughness.

(Immersion Exposure)

<Preparation of Resist>

The components of each of Examples 1 to 26 and Comparative Example 1 shown in Tables 1 and 2 were dissolved in a solvent to prepare a solution having a solid content concentration of 7 mass %, and this solution was filtered through a 0.03-μm polyethylene filter to prepare a positive resist solution. The prepared positive resist solutions were evaluated by the following methods.

<Evaluation of Resolution>

An organic antireflection film ARC29A (produced by Nissan Chemical Industries, Ltd.) was coated on a silicon wafer and baked at 205° C. for 60 seconds to form an antireflection film of 78 nm. On this film, the positive resist composition prepared was coated and baked at 115° C. for 60 seconds to form a resist film of 150 nm. The thus-obtained wafer was subjected to two-beam interference exposure (wet exposure) by using pure water as the immersion liquid. In the two-beam interference exposure (wet exposure), as shown in FIG. 1, the wafer 10 with an antireflection film and a resist film was exposed through a prism 8 and an immersion liquid (pure water) 9 by using a laser 1, a diaphragm 2, a shutter 3, three reflecting mirrors 4, 5 and 6, and a condenser lens 7. The wavelength of the laser 1 used was 193 nm, and a prism 8 of forming a line-and-space pattern of 65 nm was used. Immediately after the exposure, the resist film was heated at 115° C. for 90 seconds, then developed with an aqueous tetramethylammonium hydroxide solution (2.38%) for 60 seconds and after rinsing with pure water, spin-dried. The obtained resist pattern was observed by a scanning electron microscope (S-9260, manufactured by Hitachi Ltd.). In the case of using the compositions of Examples 1 to 26, a line-and-space pattern of 65 nm was resolved without generation of pattern falling. On the other hand, in the case of using the composition of Comparative Example 1, a line-and-space patter of 65 nm was resolved, but pattern falling was partially observed in the pattern.

It is apparent that the composition of the present invention exhibits good image-forming capability also in the exposure through an immersion liquid.

Examples 27 to 34 and Comparative Example 2

<Preparation of Resist>

The components shown in Table 3 below were dissolved in a solvent, and the resulting solution was filtered through a 0.05-μm polytetrafluoroethylene filter to prepare a positive resist solution having a solid content concentration of 14 mass %.

<Evaluation of Resist>

The prepared positive resist solution was uniformly coated on a silicon substrate treated with hexamethyldisilazane by a spin coater and dried under heating on a hot plate at 120° C. for 90 seconds to form a resist film of 0.4 μm. This resist film was exposed through a mask for a line-and-space pattern by using a KrF excimer laser stepper (NA=0.63) and immediately after the exposure, heated on a hot plate at 110° C. for 90 seconds. Furthermore, the resist film was developed with an aqueous 2.38 mass % tetramethylammonium hydroxide solution at 23° C. for 60 seconds, rinsed with pure water for 30 seconds and then dried to form a line pattern.

Evaluation Method of Line Edge Roughness:

A line-and-space (1:1) pattern of 130 nm was observed by using a length-measuring scanning electron microscope (SEM) and with respect to the longitudinal edge in the range of 5 μm of the line pattern, the distance from the reference line where the edge should be present was measured at 50 points by using a length-measuring SEM (S-8840, manufactured by Hitachi, Ltd.). The standard deviation was determined from the values obtained and the 3σ was calculated. A smaller value indicates higher performance.

TABLE 3

| Example | Acid Generator (A) (g) | Resin (B1) (g) | Resin (B2) (g) | Basic Compound (g) | Surfactant (g) | Solvent (mass ratio) | Line Edge Roughness (nm) |
|---|---|---|---|---|---|---|---|
| Example 27 | z7 (0.4) | RA-2 (9) | B2-5-10 (1) | TPI (0.03) | W-4 (0.01) | S1/S5 = 60/40 | 4.8 |
| Example 28 | z43 (0.4) | RA-4 (9) | B2-1-3 (1) | TPA (0.03) | W-2 (0.02) | S3 = 100 | 4.6 |
| Example 29 | z6 (0.2) | RA-7 (9) | B2-3-29 (0.5) | HAP (0.02) | W-1 (0.01) | S1/S6 = 95/5 | 4.7 |
| Example 30 | z8 (0.1) | RA-8 (9) | B2-3-29 (0.5) | DCMA (0.03) | W-4 (0.01) | S1/S5 = 60/40 | 4.8 |
| Example 31 | z12 (0.05) | RA-11 (9) | B2-4-5 (0.5) | PEA (0.01) | W-4 (0.01) | S1/S5 = 80/20 | 4.5 |
| Example 32 | z55 (0.2) z51 (0.2) | R-13 (4.5 g) R-1 (4.5 g) | B2-3-31 (1) | DIA (0.02) PEA (0.02) | W-4 (0.01) | S1/S4/S6 = 80/5/15 | 4.7 |
| Example 33 | z2 (0.2) z40 (0.2) | R-14 (9) | B2-5-10 (1) | TMEA (0.03) | W-3 (0.03) | S1/S5 = 60/40 | 4.8 |
| Example 34 | z7 (0.3) z35 (0.3) | R-16 (4.5 g) R-1 (4.5 g) | B2-3-29 (0.5) | TBAH (0.04) | W-1 (0.005) | S1/S6/80/20 | 4.6 |
| Comparative Example 2 | z7 (0.4) | R-2 (10) | none | TPI (0.03) | W-4 (0.01) | S1/S5 = 60/40 | 5.8 |

Abbreviations of the resin as the component (B1) in Table 3 stand for the following.

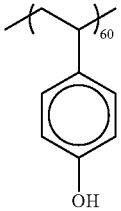
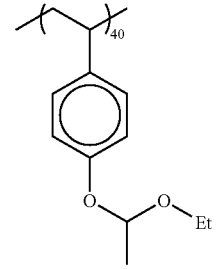

(R-1)

MW = 12000
Mw/Mn = 1.2

-continued (R-2)
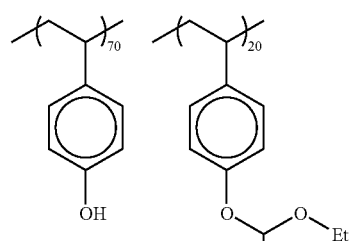
MW = 12000
Mw/Mn = 1.2

(R-4)
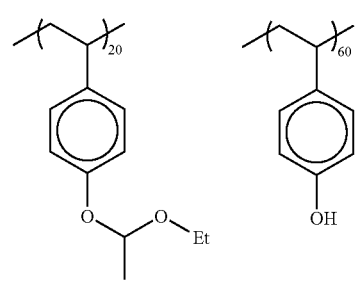
MW = 8000
Mw/Mn = 1.5

(R-7)
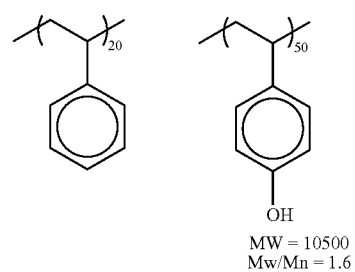
MW = 10500
Mw/Mn = 1.6

(R-8)
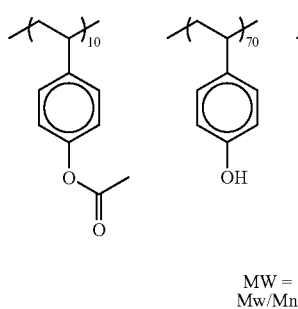
MW = 8100
Mw/Mn = 1.2

(R-11)
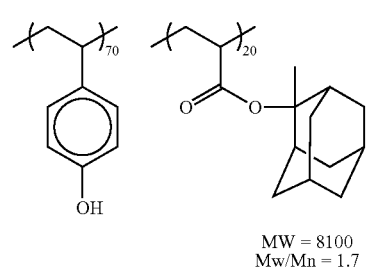
MW = 8100
Mw/Mn = 1.7

-continued (R-13)
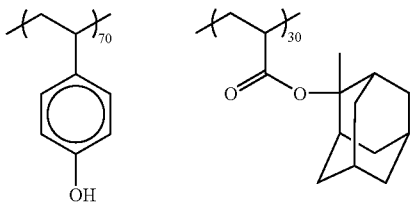
MW = 8600
Mw/Mn = 1.7

(R-14)
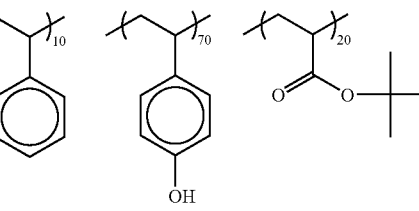
MW = 7600
Mw/Mn = 1.7

(R-16)
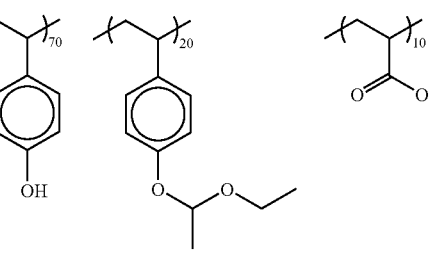
MW = 9300
Mw/Mn = 1.7

As apparent from the results above, the photosensitive composition of the present invention is excellent in the line edge roughness performance also as a positive resist composition for exposure with a KrF excimer laser.

Example 35 to 42 and Comparative Example 3

<Preparation of Resist>

The components of each of Examples 27 to 34 and Comparative Example 2 shown in Table 3 were dissolved in a solvent, and the resulting solution was filtered through a 0.05-μm polytetrafluoroethylene filter to prepare a positive resist solution having a solid content concentration of 8 mass %.

<Evaluation of Resist>

The prepared positive resist solution was uniformly coated on a silicon substrate treated with hexamethyldisilazane by a spin coater and dried under heating on a hot plate at 120° C. for 60 seconds to form a resist film of 0.15 μm. The obtained resist film was subjected to surface exposure with EUV light (wavelength: 13 nm) while changing the exposure amount in 0.5-mJ steps in the range from 0 to 10.0 mJ and baked at 110° C. for 90 seconds. Thereafter, the dissolution rate at each exposure amount was measured by using an aqueous 2.38% tetramethylammonium hydroxide (TMAH) solution, and a sensitivity curve was obtained from the measured values. The sensitivity was defined as the exposure amount when the dissolution rate of resist was saturated on this sensitivity curve. Also, the dissolution contrast (γ value) was calculated from the gradient in the straight line part of the sensitivity curve. As the γ value is larger, the dissolution contrast is better. The evaluation results are shown in Table 4 below.

TABLE 4

|  | Component | Sensitivity (mJ/cm²) | γ Value |
|---|---|---|---|
| Example 35 | Example 27 | 2.0 | 10.1 |
| Example 36 | Example 28 | 1.5 | 9.4 |
| Example 37 | Example 29 | 2.0 | 10.3 |
| Example 38 | Example 30 | 2.0 | 10.4 |
| Example 39 | Example 31 | 2.0 | 10.8 |
| Example 40 | Example 32 | 2.0 | 10.1 |
| Example 41 | Example 33 | 2.0 | 10.6 |
| Example 42 | Example 34 | 2.0 | 10.8 |
| Comparative Example 3 | Comparative Example 2 | 2.0 | 8.9 |

As apparent from the results in Table 4, the resist composition of the present invention is excellent and ensures high sensitivity and high contrast in the characteristic evaluation by the irradiation of EUV light as compared with the composition of Comparative Example.

According to the present invention, a positive photosensitive composition ensuring that even in the formation of a fine pattern of 100 nm or less, the resolving power is excellent and the line edge roughness and pattern falling are improved, and a pattern forming method using the composition can be provided.

The entire disclosure of each and every foreign patent application from which the benefit of foreign priority has been claimed in the present application is incorporated herein by reference, as if fully set forth.

What is claimed is:

1. A positive photosensitive composition comprising:
(A) a compound capable of generating an acid upon irradiation with actinic rays or radiation;
(B1) a resin of which solubility in an alkali developer increases under an action of an acid; and
(B2) a resin that has a group capable of decomposing under an action of an alkali to produce an alkali-soluble group, and the resin (B2) does not have a group capable of decomposing under an action of an acid,
wherein the group capable of decomposing under an action of an alkali to produce an alkali-soluble group is a lactone having any one of the following structures:

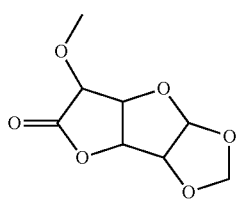

A

B

C wherein each ring may have a substituent.

2. The positive photosensitive composition according to claim 1, wherein the resin as the component (B1) has a monocyclic or polycyclic hydrocarbon structure.

3. The positive photosensitive composition according to claim 1, wherein the resin as the component (B1) has a hydroxystyrene structural unit.

4. The positive photosensitive composition according to claim 1, wherein the resin as the component (B1) has a repeating unit having a polycyclic hydrocarbon group substituted by a hydroxyl group or a cyano group.

5. The positive photosensitive composition according to claim 1, wherein the compound as the component (A) is a compound capable of generating an acid selected from the group consisting of an acid having a fluoroalkylsulfonic acid structure with a carbon number of 2 to 4, a bis(fluoroalkylsulfonyl)imide acid and a fluorine atom-containing benzenesulfonic acid upon irradiation with actinic rays or radiation.

6. The positive photosensitive composition according to claim 1, wherein the resin as the component (B1) contains a repeating unit having a lactone group.

7. The positive photosensitive composition according to claim 1, wherein the resin as the component (B2) is a resin consisting of a repeating unit having a lactone group or a copolymer resin containing 50 mol % or more of a repeating unit having a lactone group.

8. The positive photosensitive composition according to claim 1, wherein an amount added of the resin as the component (B2) is from 1 to 20 mass % based on that of the resin as the component (B1).

9. A pattern forming method comprising:
forming a photosensitive film from a positive photosensitive composition according to claim 1; and
exposing and developing the photosensitive film.

10. A method for performing an immersion exposure comprising:
forming a photosensitive film from a positive photosensitive composition according to claim 1; and
immersion exposing and developing the photosensitive film.

11. The positive photosensitive composition according to claim 1, wherein the weight average molecular weight of the resin as component (B2) is from 1,000 to 100,000.

12. The positive photosensitive composition according to claim 11, wherein the weight average molecular weight of the resin as component (B2) is from 2,000 to 50,000.

13. The positive photosensitive composition according to claim 12, wherein the weight average molecular weight of the resin as component (B2) is from 3,000 to 20,000.

14. A positive photosensitive composition comprising:
(A) a compound capable of generating an acid upon irradiation with actinic rays or radiation;
(B1) a resin of which solubility in an alkali developer increases under an action of an acid; and
(B2) a resin that has an alkali-soluble group selected from the group consisting of an aliphatic hydroxyl group with a carbon atom at 1- or 2-position being substituted by an electron withdrawing group, an electron withdrawing group-substituted amino group, and an electron withdrawing group-substituted methylene or methine group, and the resin (B2) does not have a group capable of decomposing under an action of an acid,
wherein the component (B2) has an alkali-soluble group of the following structure:

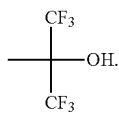

15. The positive photosensitive composition according to claim 14,
wherein the resin as the component (B1) has a monocyclic or polycyclic hydrocarbon structure.

16. The positive photosensitive composition according to claim 14,
wherein the resin as the component (B1) has a hydroxystyrene structural unit.

17. The positive photosensitive composition according to claim 14,
wherein the resin as the component (B1) has a repeating unit having a polycyclic hydrocarbon group substituted by a hydroxyl group or a cyano group.

18. The positive photosensitive composition according to claim 14,
wherein the compound as the component (A) is a compound capable of generating an acid selected from the group consisting of an acid having a fluoroalkylsulfonic acid structure with a carbon number of 2 to 4, a bis(fluoroalkylsulfonyl)imide acid and a fluorine atom-containing benzenesulfonic acid upon irradiation with actinic rays or radiation.

19. The positive photosensitive composition according to claim 14,
wherein the resin as the component (B1) contains a repeating unit having a lactone group.

20. The positive photosensitive composition according to claim 14,
wherein an amount added of the resin as the component (B2) is from 1 to 20 mass % based on that of the resin as the component (B1).

21. A pattern forming method comprising:
forming a photosensitive film from a positive photosensitive composition according to claim 14; and
exposing and developing the photosensitive film.

22. A method for performing an immersion exposure comprising:
forming a photosensitive film from a positive photosensitive composition according to claim 14; and
immersion exposing and developing the photosensitive film.

23. The positive photosensitive composition according to claim 14, wherein the weight average molecular weight of the resin as component (B2) is from 1,000 to 100,000.

24. The positive photosensitive composition according to claim 23, wherein the weight average molecular weight of the resin as component (B2) is from 2,000 to 50,000.

* * * * *